US012664342B2

(12) United States Patent
Aono et al.

(10) Patent No.: US 12,664,342 B2
(45) Date of Patent: Jun. 23, 2026

(54) SOLUTION SEARCH SYSTEM, SOLUTION SEARCH METHOD, AND SOLUTION SEARCH PROGRAM

(71) Applicants: Amoeba Energy Co., Ltd., Tokyo (JP); NATIONAL UNIVERSITY CORPORATION HOKKAIDO UNIVERSITY, Sapporo (JP)

(72) Inventors: Masashi Aono, Tokyo (JP); Seiya Kasai, Sapporo (JP); Kaori Ohkoda, Machida (JP); Shingo Fukuda, Chiba (JP)

(73) Assignees: Amoeba Energy Co., Ltd., Tokyo (JP); NATIONAL UNIVERSITY CORPORATION HOKKAIDO UNIVERSITY, Sapporo (JP)

( * ) Notice: Subject to any disclaimer, the term of this patent is extended or adjusted under 35 U.S.C. 154(b) by 678 days.

(21) Appl. No.: 18/140,426

(22) Filed: Apr. 27, 2023

(65) Prior Publication Data

US 2023/0289505 A1 Sep. 14, 2023

Related U.S. Application Data

(63) Continuation of application No. PCT/JP2021/038396, filed on Oct. 18, 2021.

(30) Foreign Application Priority Data

Nov. 5, 2020 (JP) ................................. 2020-184993
Apr. 26, 2021 (JP) ................................. 2021-073972

(51) Int. Cl.
*G06Q 10/04* (2023.01)
*G06F 30/3323* (2020.01)

(52) U.S. Cl.
CPC ............................... *G06F 30/3323* (2020.01)

(58) Field of Classification Search
CPC ..... G06F 30/3323; G06N 99/00; G06Q 10/04
See application file for complete search history.

(56) References Cited

U.S. PATENT DOCUMENTS

2010/0218157 A1* 8/2010 McMurchie ............ G06F 30/39
716/129
2012/0130929 A1* 5/2012 Cantin ................... G06N 3/086
706/13

FOREIGN PATENT DOCUMENTS

JP 2012003733 A 1/2012
JP 2014085733 A 5/2014
JP 6011928 B2 10/2016

OTHER PUBLICATIONS

English translation of Japanese Application No. JP2012-003733A, retrieved Apr. 19, 2023, 26 pages.

(Continued)

*Primary Examiner* — Nghia M Doan
(74) *Attorney, Agent, or Firm* — Polsinelli PC

(57) ABSTRACT

A solution-searching system encompasses an output adjustment unit having N signal adjustment circuits for converting provisional output-adjustment signals into final output-adjustment signals, 2N data generation units for generating binary data, 2N data conversion units which convert the binary data into information, a fluctuation setting unit for suppling bias probabilities to the signal adjustment circuits, fluctuation probabilities to the data generation units, and threshold values to the data conversion units, setting occurrence-frequencies of the binary data for making an occurrence-frequency of a specific variable, and a feedback control unit for determining whether an optimal solution has been found based on the information converted by the data conversion units and search-problem information preliminarily entered, by repeating transmission of the final output- (Continued)

adjustment signals to the output adjustment units, if the optimal solution has not been found.

13 Claims, 27 Drawing Sheets

(56) References Cited

OTHER PUBLICATIONS

English translation of Japanese Application No. JP601192BA, retrieved Apr. 19, 2023, 31 pages.
English abstract of Japanese Application No. JP2014-085733A, retrieved Apr. 19, 2023, 2 pages.
Aono, Masashi, et al., Amoeba-inspired Computing Paradigm for Bridging the Gap between Cyber and Physical Spaces, Artificial Intelligence, 2018, vol. 33, No. 5, pp. 561-569.
Aono, Masashi, et al., Amoeba-inspired SAT Solver, Proceedings of the 2012 International Symposium on Nonlinear Theory and its Applications, 2012, pp. 586-589.

* cited by examiner

Figure 5:
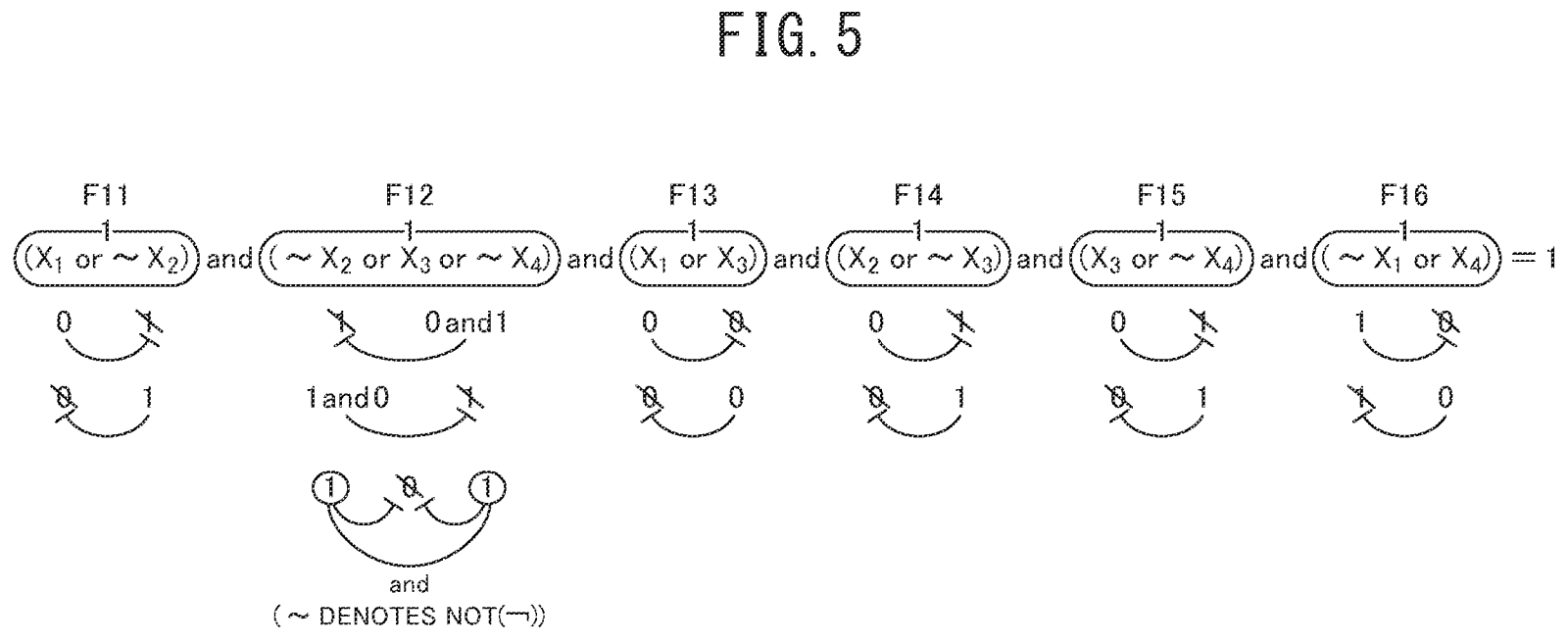

$(X_1 \text{ or } \sim X_2)$ and $(( \sim X_2 \text{ or } X_3 \text{ or } \sim X_4)$ and $((X_1 \text{ or } X_3)$ and $((X_2 \text{ or } \sim X_3)$ and $((X_3 \text{ or } \sim X_4)$ and $(( \sim X_1 \text{ or } X_4)) == 1$

F12    F13    F14    F15    F16

0 and 1

1 and 0 and $(\sim \text{DENOTES NOT}(\neg))$

EXAMPLE OF TRAJECTORIES SATISFYING TRANSPORT REQUIREMENT

COMPARTMENT i

TIME INSTANT p

"HIGHLY OPTIMAL" SOLUTION

COMPARTMENT i

TIME INSTANT p

"LESS OPTIMAL" SOLUTION ; HIGHLY STATIONARY

COMPARTMENT i

TIME INSTANT p

STATIONARY STATE $X_2(_{22,22}), p = 1$

FIG. 12A $$F_2 = (X_1 \text{ or} \sim X_2) \text{ and} ((\sim X_2 \text{ or } X_3 \text{ or} \sim Y_4) \text{ and} (X_1 \text{ or } X_3) \text{ and} (X_2 \text{ or} \sim X_3) \text{ and} (X_3 \text{ or} \sim Y_4)$$

F11 F12 F13 F14 F15

$$(\sim \text{ DENOTES NOT}(\neg))$$

FIG. 12B $$\left\{ \begin{array}{l} (X_1 = 0 \Rightarrow X_2 = 0) \wedge (X_2 = 1 \Rightarrow X_1 = 1) \wedge \\ (X_2 = 1 \wedge X_3 = 0 \Rightarrow X_4 = 0) \wedge \\ (X_1 = 0 \Rightarrow X_3 = 1) \wedge (X_3 = 0 \Rightarrow X_1 = 1) \wedge \\ (X_2 = 0 \Rightarrow X_3 = 0) \wedge (X_3 = 1 \Rightarrow X_2 = 1) \wedge \\ (X_3 = 0 \Rightarrow X_4 = 0) \end{array} \right.$$

$$X_{v,(i,j),p}$$

$$X_{v,(i,j),p} = 1 \ (\text{if} \ \boxed{\phantom{x}})$$
$$0 \ (\text{otherwise})$$

FIG. 15A

INTRA-RULE :

$$\begin{bmatrix} \text{excited}[\{X_1=0\}] & \text{inhibit}[\{X_1=1\}] \\ \text{excited}[\{X_1=1\}] & \text{inhibit}[\{X_1=0\}] \\ \text{excited}[\{X_2=0\}] & \text{inhibit}[\{X_2=1\}] \\ \text{excited}[\{X_2=1\}] & \text{inhibit}[\{X_2=0\}] \\ \text{excited}[\{X_3=0\}] & \text{inhibit}[\{X_3=1\}] \\ \text{excited}[\{X_3=1\}] & \text{inhibit}[\{X_3=0\}] \\ \text{excited}[\{X_4=0\}] & \text{inhibit}[\{X_4=1\}] \\ \text{excited}[\{X_4=1\}] & \text{inhibit}[\{X_4=0\}] \end{bmatrix}$$

FIG. 15B

INTER-RULE :

$$\begin{bmatrix} \text{excited}[\{X_2=1\}] & \text{inhibit}[\{X_1=0\}] \\ \text{excited}[\{X_1=0\}] & \text{inhibit}[\{X_2=1\}] \\ \text{excited}[\{X_3=0,X_4=1\}] & \text{inhibit}[\{X_2=1\}] \\ \text{excited}[\{X_2=1,X_4=1\}] & \text{inhibit}[\{X_3=0\}] \\ \text{excited}[\{X_2=1,X_3=0\}] & \text{inhibit}[\{X_4=1\}] \\ \text{excited}[\{X_3=0\}] & \text{inhibit}[\{X_1=0\}] \\ \text{excited}[\{X_1=0\}] & \text{inhibit}[\{X_3=0\}] \\ \text{excited}[\{X_3=1\}] & \text{inhibit}[\{X_2=0\}] \\ \text{excited}[\{X_2=0\}] & \text{inhibit}[\{X_3=1\}] \\ \text{excited}[\{X_4=1\}] & \text{inhibit}[\{X_3=0\}] \\ \text{excited}[\{X_3=0\}] & \text{inhibit}[\{X_4=1\}] \\ \text{excited}[\{X_4=0\}] & \text{inhibit}[\{X_1=1\}] \\ \text{excited}[\{X_1=1\}] & \text{inhibit}[\{X_4=0\}] \end{bmatrix}$$

FIG. 15C

CONTRA-RULE :

$$\begin{bmatrix} \text{excited}[\{X_1=1,X_3=0\}] & \text{inhibit}[\{X_1=1,X_3=0\}] \\ \text{excited}[\{X_1=0,X_2=0\}] & \text{inhibit}[\{X_1=0,X_2=0\}] \\ \text{excited}[\{X_1=0,X_3=1\}] & \text{inhibit}[\{X_1=0,X_3=1\}] \\ \text{excited}[\{X_2=1,X_4=0\}] & \text{inhibit}[\{X_2=1,X_4=0\}] \\ \text{excited}[\{X_2=0,X_4=1\}] & \text{inhibit}[\{X_2=0,X_4=1\}] \\ \text{excited}[\{X_3=0,X_4=0\}] & \text{inhibit}[\{X_3=0,X_4=0\}] \\ \text{excited}[\{X_1=1,X_2=1,X_3=0\}] & \text{inhibit}[\{X_1=1,X_2=1,X_3=0\}] \\ \text{excited}[\{X_2=1,X_2=0,X_4=1\}] & \text{inhibit}[\{X_2=1,X_2=0,X_4=1\}] \\ \text{excited}[\{X_3=1,X_3=0,X_4=1\}] & \text{inhibit}[\{X_3=1,X_3=0,X_4=1\}] \end{bmatrix}$$

FIG. 22

| STEP | CONFLICT RESOLVER | | TRAJECTORY GENERATOR | |
|---|---|---|---|---|
| | FIRST SOLUTION SEARCH ARITHMETIC LOGIC CIRCUIT (AMOEBA SAT-R) | SECOND SOLUTION SEARCH ARITHMETIC LOGIC CIRCUIT | FIRST SOLUTION SEARCH ARITHMETIC LOGIC CIRCUIT (AMOEBA SAT-G) | SECOND SOLUTION SEARCH ARITHMETIC LOGIC CIRCUIT |
| (a) S205~206 S203, 209 | ○ | | ○ | |
| (b) S205~206 S203, 209 | ○ | | | ○ |
| (c) S205~206 S203, 209 | | ○ | ○ | |
| (d) S205~206 S203, 209 | | ○ | | ○ |

TIME INSTANT (STEP)

FIG. 24

| VEHICLE $\nu$ | CONFLICTING VEHICLE $\nu'$ | CONFLICT TIME (STEP) | CONFLICT POINT (CELL) |
|---|---|---|---|
| 1 | | | |
| 2 | | | |
| 3 | | | |
| 4 | | | |
| 5 | | | |
| 6 | 12 | 10 | 171 |
| 7 | | | |
| 8 | | | |
| 9 | | | |
| 10 | | | |
| 11 | 15 | 14 | 261 |
| 12 | 6 | 11 | 172 |
| 13 | | | |
| 14 | | | |
| 15 | | | |

FIG. 26

$k \times n_v = 5 \times 15$

| | $x_{1,0}$ | $\ldots$ | $x_{1,k}$ | $\ldots$ | $x_{1,K-1}$ | $\ldots$ | $\ldots$ | $x_{\nu,k}$ | $\ldots$ | $\ldots$ | $x_{15,0}$ | $\ldots$ | $x_{15,k}$ | $\ldots$ | $x_{15,K-1}$ |
|---|---|---|---|---|---|---|---|---|---|---|---|---|---|---|---|
| $x_{1,0}$ | 0 | | 1 | | 1 | | | 0 | | | 0 | | 0 | | 0 |
| $x_{1,k}$ | 1 | | 0 | | 1 | | | 0 | | | 0 | | 0 | | 0 |
| $x_{1,K-1}$ | 1 | | 1 | | 0 | | | 0 | | | 0 | | 0 | | 0 |
| $x_{\nu',k'}$ | 0 | | 0 | | 0 | | | 1 | | | 0 | | 0 | | 0 |
| $x_{15,0}$ | 0 | | 0 | | 0 | | | 0 | | | 0 | | 1 | | 1 |
| $x_{15,k}$ | 0 | | 0 | | 0 | | | 0 | | | 1 | | 0 | | 1 |
| $x_{15,K-1}$ | 0 | | 0 | | 0 | | | 0 | | | 1 | | 1 | | 0 |

$k \times n_v = 5 \times 15$ $y_{\nu,k,\nu',k} = 1 \Leftrightarrow$ ALTERNATIVE TRAJECTORIES $x_{\nu,k}$ AND $x_{\nu',k}$ CONFLICT

SOLUTION SEARCH SYSTEM, SOLUTION SEARCH METHOD, AND SOLUTION SEARCH PROGRAM

CROSS-REFERENCE TO RELATED APPLICATION

This application is a continuation of co-pending of International Application No. PCT/JP2021/038396 having an international filing date of Oct. 18, 2021, which designated the United States, which claims benefit of and priority to under 35 USC 119 based on JP2020-184993 filed on Nov. 5, 2020 and JP2021-073972 filed on Apr. 26, 2021, the entire contents of each of which are incorporated by reference herein.

BACKGROUND

Field of the Invention

The present invention relates to a solution search system, a solution search method, and a solution search program that utilize stochastic movements brought about by "device fluctuations" inspired by the fluctuation behaviors of a living organism, and quickly and efficiently search for solutions to problems searching for an optimal solution to various scheduling and combinations, and more particularly to solution-searching systems utilizing non-uniform fluctuations, solution-searching methods using the solution-searching systems, and solution-searching programs that realize the solution-searching methods by computer systems.

Description of the Related Art

The Boolean Satisfiability (SAT) Problem is known as a problem to search for the solutions satisfying a given constraint in scheduling, etc., by searching for the combinations of truth values of variables that can make a given propositional formula "true". As the earlier technologies pertaining to the SAT problem, various SAT solution programs and failure diagnosis programs have been proposed (see JP2012-003733A, etc.). Although the solution-searching systems for SAT problems are extremely important in the future information society, the number of solution candidates exponentially will grow with the problem size, as the problem size increases larger and larger. Since the SAT problems have extremely high computational complexities, large problem sizes for the SAT problems require larger amounts of computational resources and times.

The invention described in JP2012-003733A does not pertain to a faster and more efficient method searching for a solution to a given problem of the SAT problem. And, as the amounts of information are steadily increasing nowadays, it is a social demand to solve the SAT problems quickly and efficiently, from larger amounts of information. Therefore, for quickly and efficiently solving the SAT problems, a solution-searching system has been proposed (see JP6011928B).

However, the invention described in JP6011928B provides a solution-searching method, in which two kinds of uniform fluctuations are assigned to the data by the internal structure, for solving the SAT problem, and no consideration has been given to the various combinatorial optimization problems emerging in the real world, which include diverse and enormous requirement specifications. For example, in the case of a transportation system based on automated guided-vehicles in a distribution warehouse, the transportation system faces a "scheduling problem" of efficiently operating vehicles while responding to complex transportation requests such as hundreds of vehicles that are updated every moment. In the solution-searching method recited in JP6011928B, where two kinds of uniform fluctuations are assigned by the internal structure, the algorithm becomes complicated for dealing with a scheduling problem of several hundred transportation vehicles, and the circuit needs to be changed every time when problem instances change. Therefore, the invention described in JP6011928B, in which the uniform fluctuations are assigned by internal structure, was not a convenient scheme for solving various real world combinatorial optimization problem instances. Here, an "instance" is a set of concrete values given to all the parameters in a problem.

SUMMARY OF THE INVENTION

In order to achieve the above-mentioned object, a first aspect of the present invention inheres in a solution-searching system encompassing (a) an output adjustment unit having N pieces of signal adjustment circuits, where "N" is a positive integer greater than or equal to two, the signal adjustment circuits convert provisional output-adjustment signals into final output-adjustment signals, and transmit the final output-adjustment signals, respectively, (b) 2N pieces of data generation units arranged in pairs corresponding to the signal adjustment circuits, respectively, each of the pairs configured to receive corresponding final output-adjustment signal and to generate binary data, (c) 2N pieces of data conversion units which read and convert the binary data generated by the data generation units into information, respectively, (d) a fluctuation setting unit configured to supply independent bias probabilities to each of the signal adjustment circuits, independent fluctuation probabilities to each of the data generation units, and independent threshold values to each of the data conversion units, to non-uniformly set occurrence-frequencies of the binary data generated by the data generation units for making a value of an occurrence-frequency of a specific variable different from other variables than the specific variable, and (e) a feedback control unit configured to determine whether an optimal solution has been found based on the information converted by the data conversion units and search-problem information preliminarily entered, and to repeatedly control operations of transmitting the final output-adjustment signals to the output adjustment units, respectively, if the optimal solution has not been found. Here, the signal adjustment circuits convert the provisional output-adjustment signals to the final output-adjustment signals, respectively, using the bias probabilities, the data generation units generate the binary data using the final output-adjustment signals and the fluctuation probabilities, and the data conversion units generate the information using the binary data and the threshold values, to find the optimal solution of a Boolean satisfiability problem expressed by multiple constraints in implication forms and logical conjunctions of the constraints, from the information, in the solution-searching system pertaining to the first aspect of the present invention.

A second aspect of the present invention inheres in a solution-searching method for solving an optimal solution of a Boolean satisfiability problem expressed by constraints in implication forms and logical conjunctions of the constraints. That is, the solution-searching method pertaining to the second aspect of the present invention includes (a) independently supplying information of fluctuation probabilities entered from outside to a plurality of data generation units, respectively, (b) independently supplying information of bias probabilities entered from outside to a plurality of signal adjustment circuits arranged corresponding to the data generating units, respectively, (c) independently supplying information of threshold values entered from outside to data conversion units, respectively, number of the data conversion units is equal to the data generation units, (d) feeding a plurality of provisional output-adjustment signals to the signal adjustment circuits, respectively, (e) converting the provisional output-adjustment signals to final output-adjustment signals using the bias probabilities by the signal adjustment circuits, respectively, and feeding the final output-adjustment signals to the data generation units, respectively, (f) causing the respective data generation units to generate a set of non-uniform data, respectively, based on the fluctuation probabilities and the final output-adjustment signals, so that an occurrence-frequency of a specific variable transmitted from the data generation units is different from occurrence-frequencies of other variables, (g) causing the data conversion units to convert the set of non-uniform data into information, after the set of non-uniform data is read out, and (h) determining whether the optimal solution has been found based on the information converted by the data conversion units and search-problem information preliminarily entered, and if the optimal solution has not been found, repeatedly controlling operations of transmitting the final output-adjustment signals to the data generation units, respectively.

A computer-software program for realizing the solution-searching method described in the second aspect of the present invention can be executed by the computer system if it is stored in a computer-readable recording-medium and the recording medium is read into the computer system described in the first aspect. More specifically, a third aspect of the present invention inheres in a non-transitory computer readable storage medium for storing a control program of executing a series of instructions to find an optimal solution of a Boolean satisfiability problem expressed by constraints in an implication form and a logical conjunction of the constraints, the computer program encompasses (a) instructions to cause a fluctuation setting unit to independently supply fluctuation probabilities externally entered to data generation units, respectively, (b) instructions to cause the fluctuation setting unit to independently supply bias probabilities externally entered to signal adjustment circuits arranged corresponding to the data generating units, respectively, (c) instructions to cause the fluctuation setting unit to independently supply threshold values externally entered to data conversion units, respectively, (d) instructions to cause an output adjustment unit to feed provisional output-adjustment signals to the signal adjustment circuits, respectively, (e) instructions to cause the signal adjustment circuits to convert the provisional output-adjustment signals into final output-adjustment signals using the bias probabilities, to feed the final output-adjustment signals to the data generation units, respectively, a number of the data conversion units is equal to the data generation units, (f) instructions to cause the data generation units to generate a set of non-uniform data based on the fluctuation probabilities and the final output-adjustment signals, so that an occurrence-frequency of a specific variable transmitted from the data generation units is different from occurrence-frequencies of other variables, (g) instructions to cause the data conversion units to read out the set of non-uniform data, and to convert into information, and (h) instructions to cause a feedback control unit to determine whether the optimal solution has been found based on the information converted by the data conversion units and search-problem information preliminarily entered, and if the optimal solution has not been found, to repeatedly control operations of transmitting the final output-adjustment signals to the data generation units, respectively.

BRIEF DESCRIPTION OF THE DRAWINGS

FIG. 5 is a diagram illustrating an example of a propositional formula in which a conjunction of a Boolean expression is "1" ("true");

FIG. 12A is a diagram illustrating another example of the propositional formula;

FIG. 12B is expressions for explaining that the propositional formula illustrated in FIG. 12A is expressed by the conjunction of constraints in the implication form, but some of the expressions illustrated in FIG. 6B are omitted;

5

Figure 13:
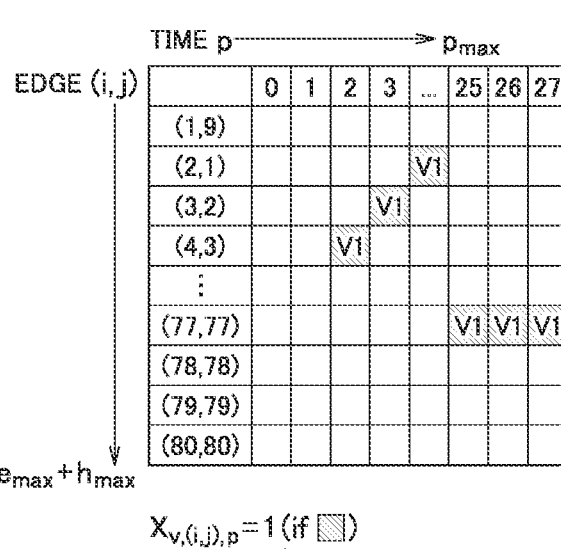
Figures 14A, 14B, 14C:
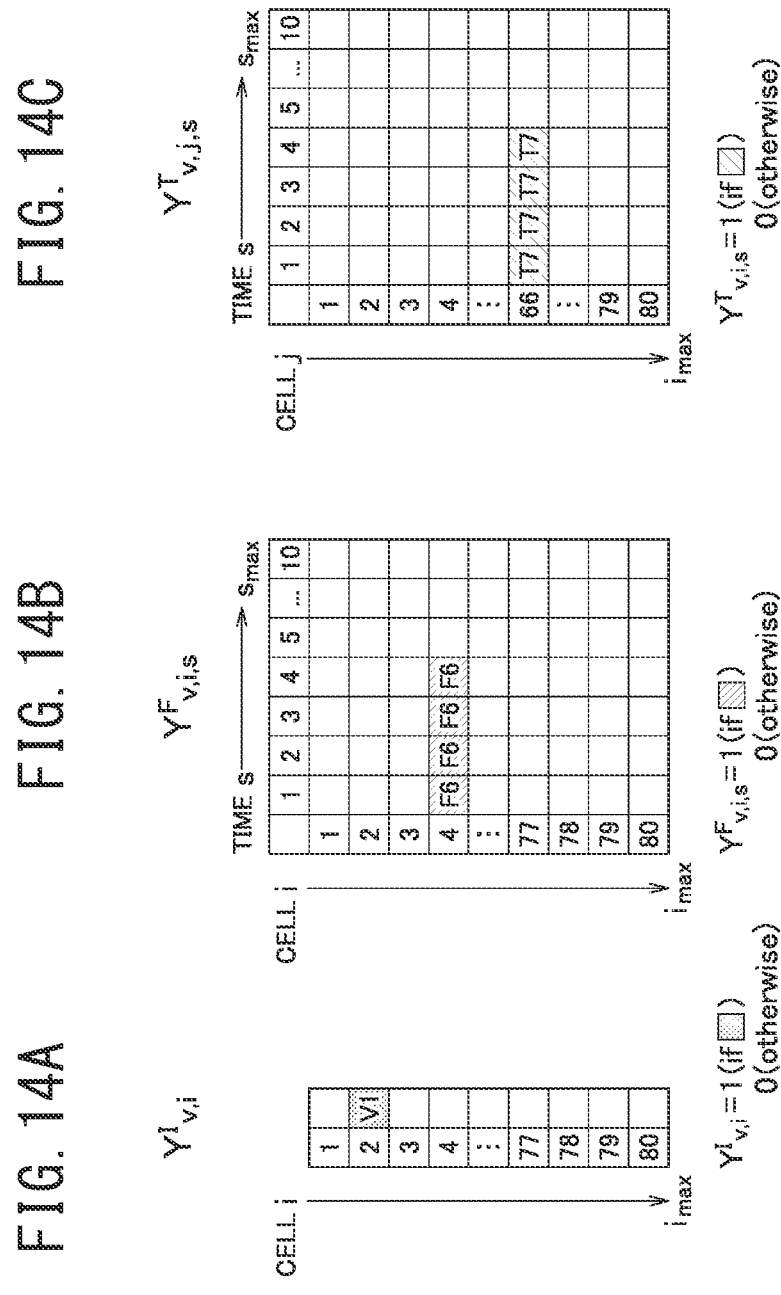
Figure 16:
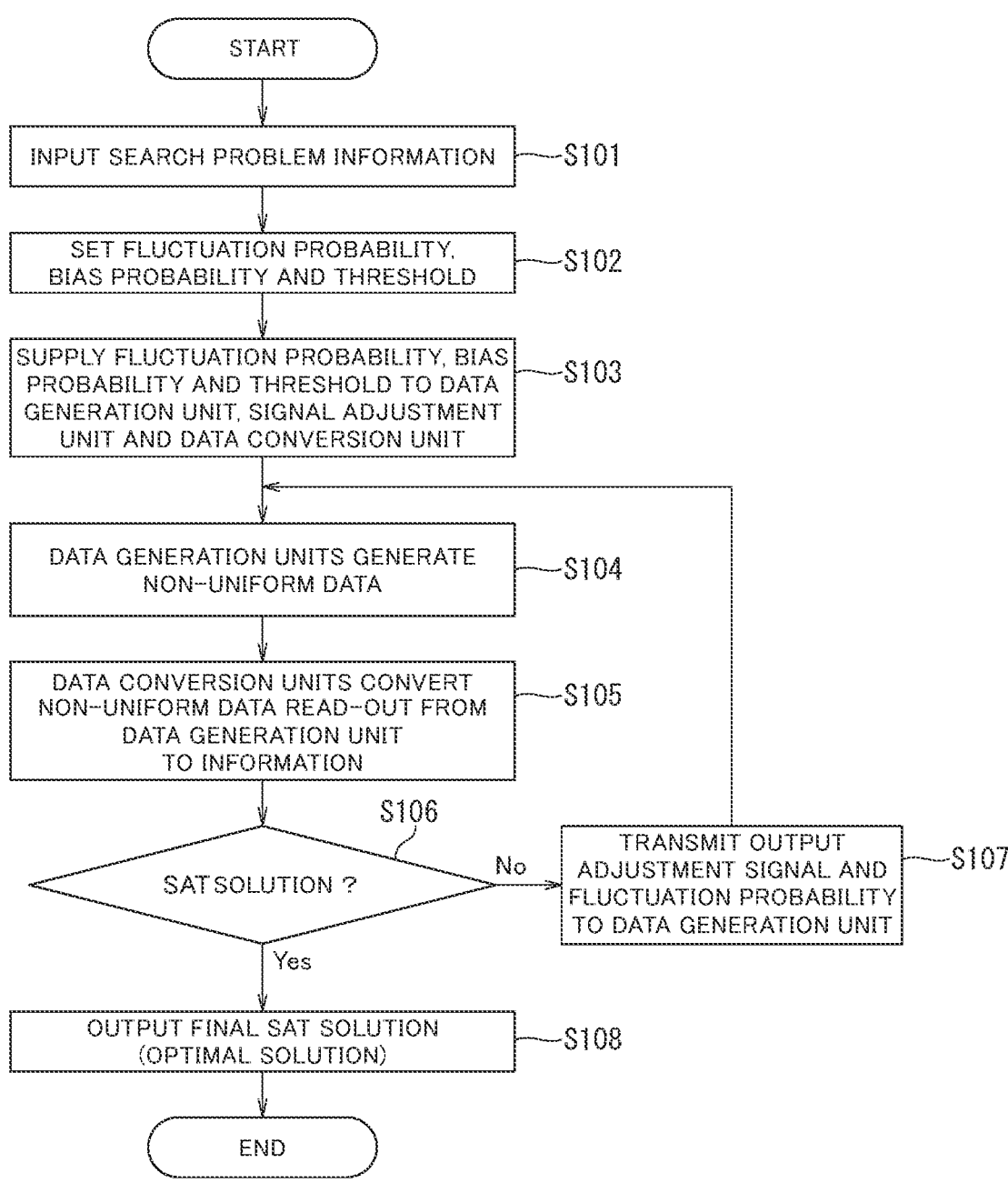
Figure 17:
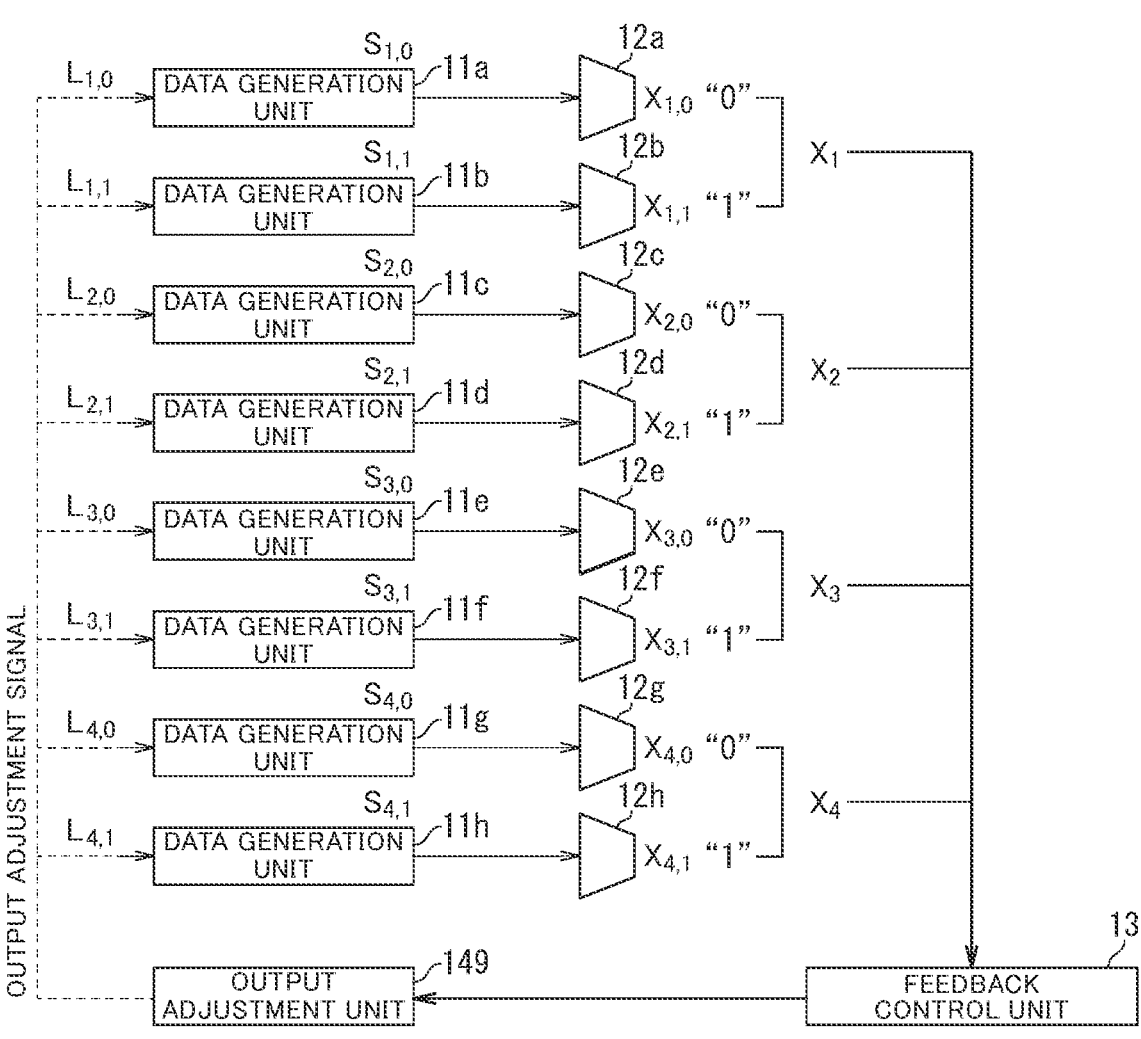
Figure 18:
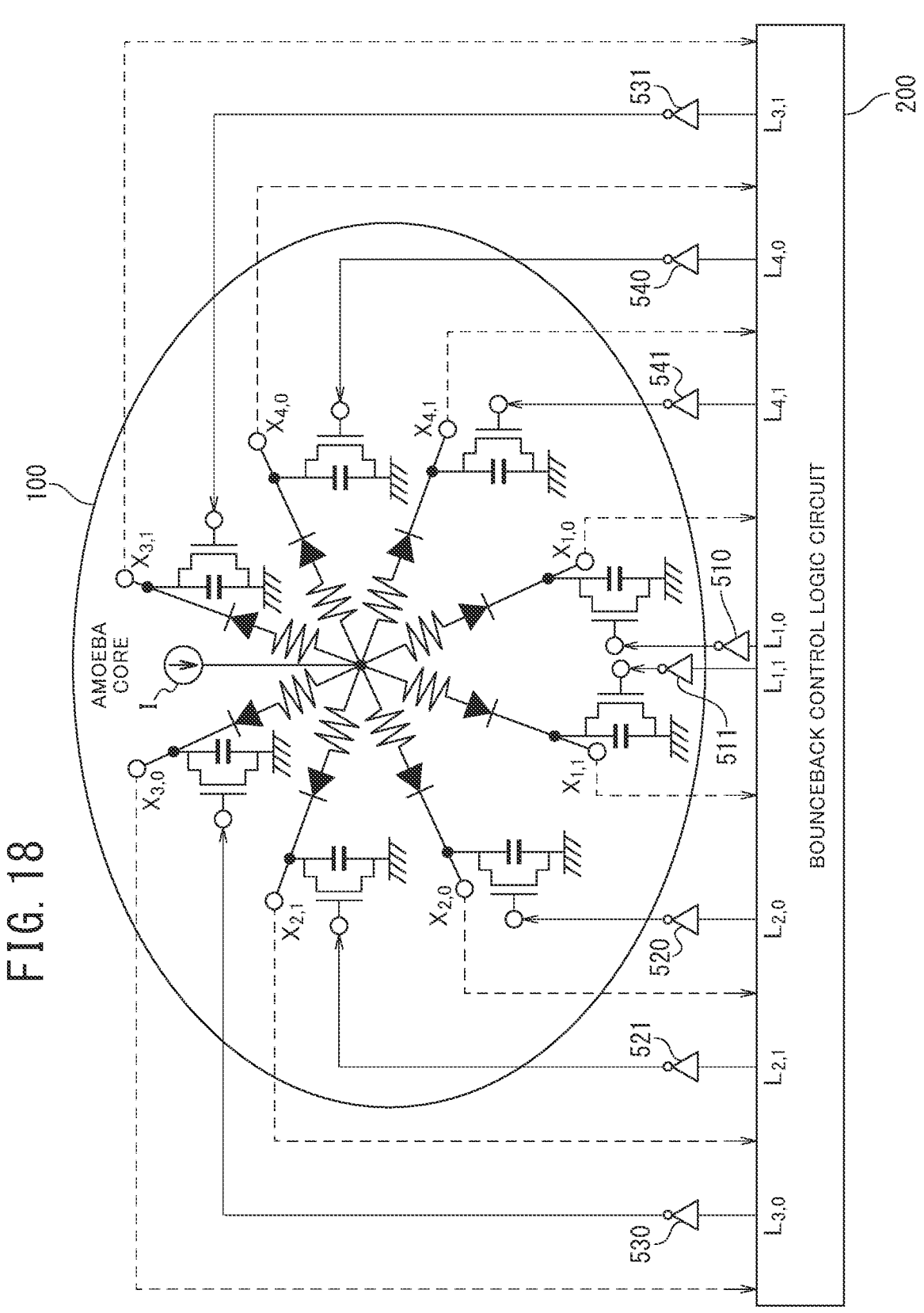
Figure 19:
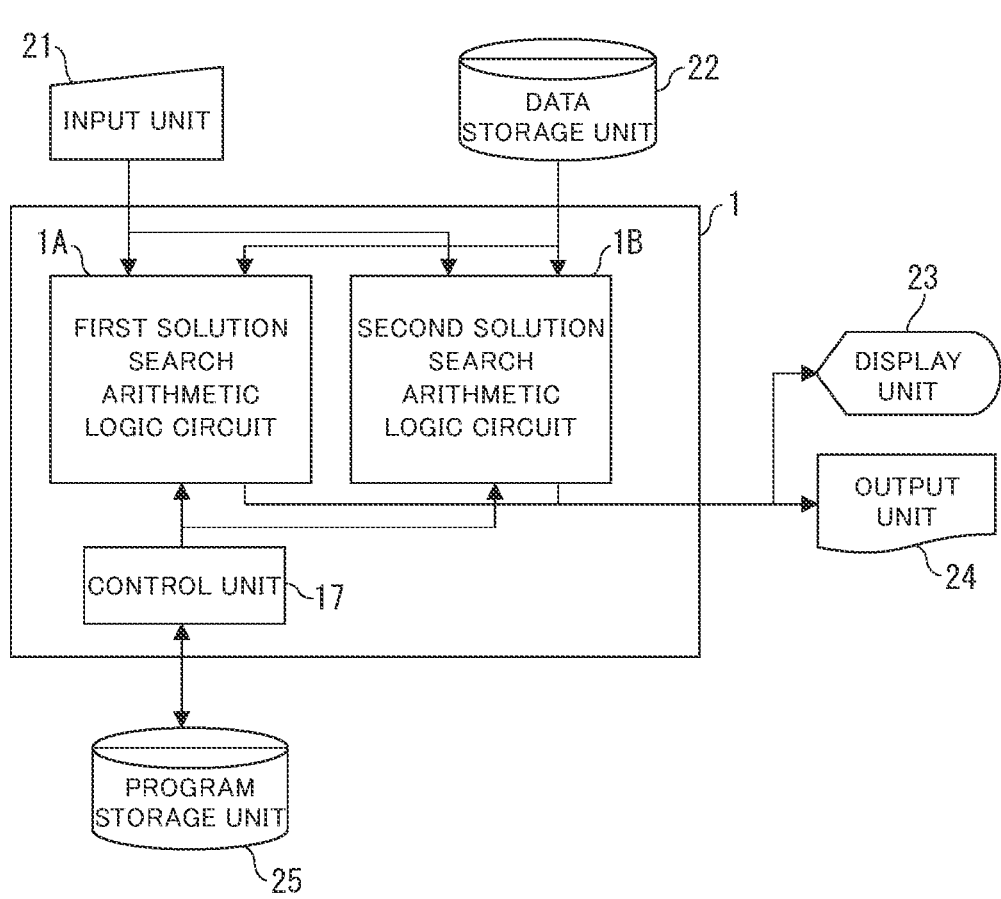
Figure 20:
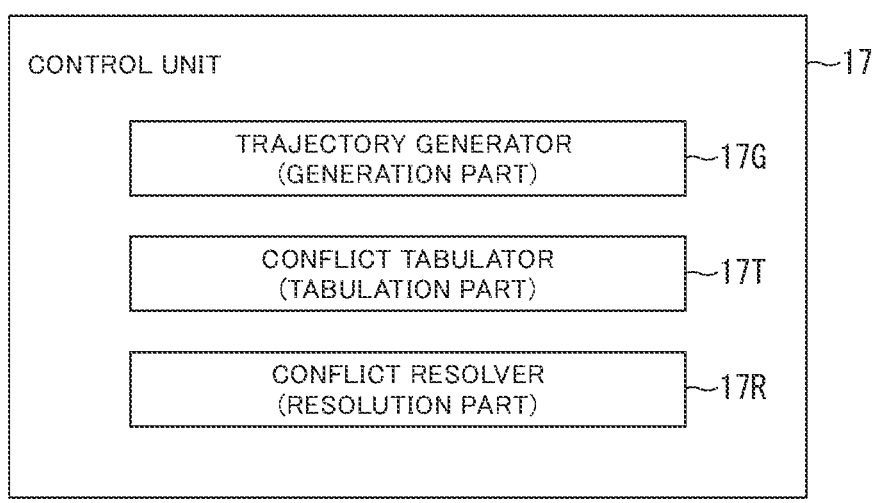
Figure 21:
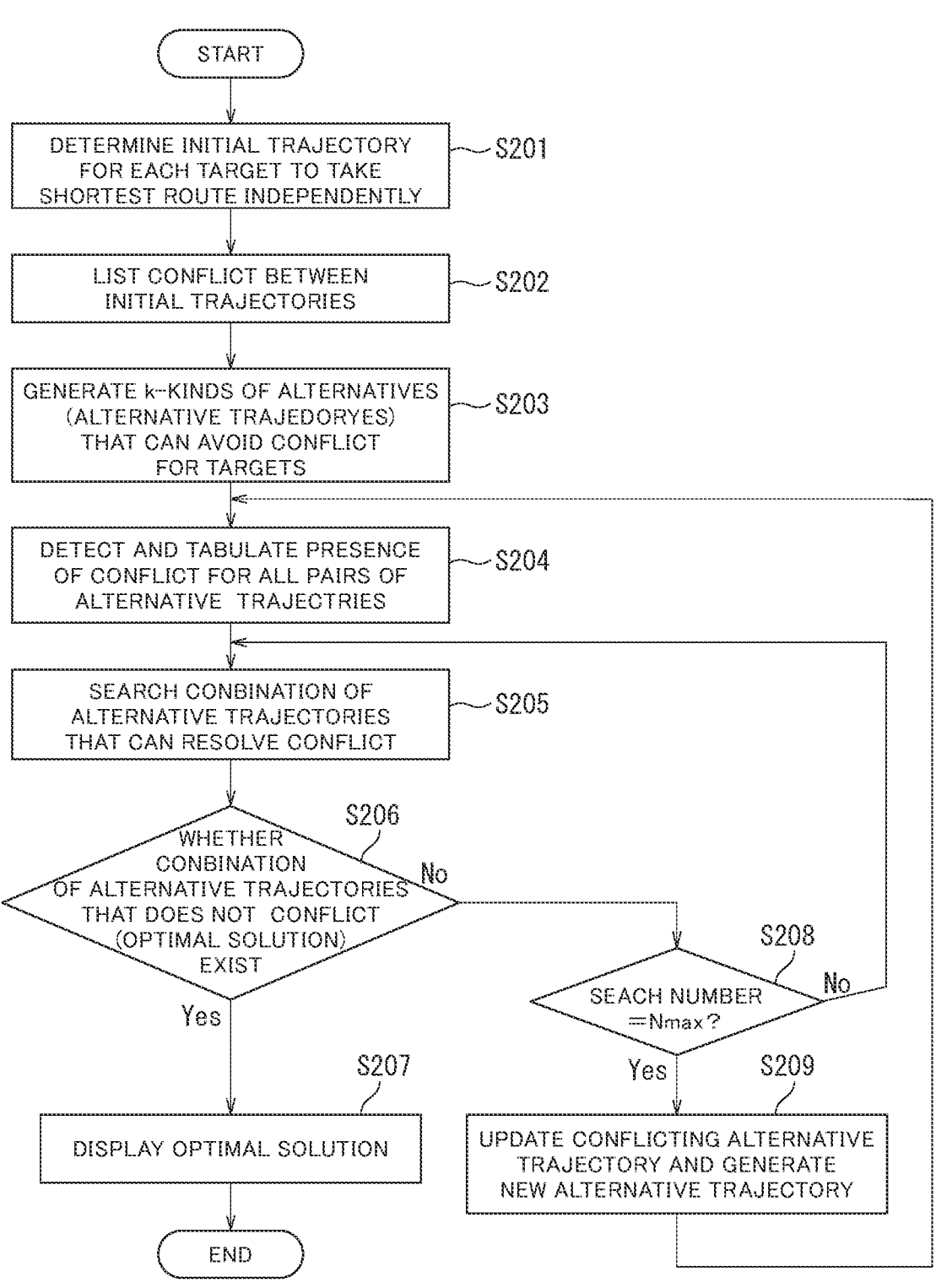
Figure 23:
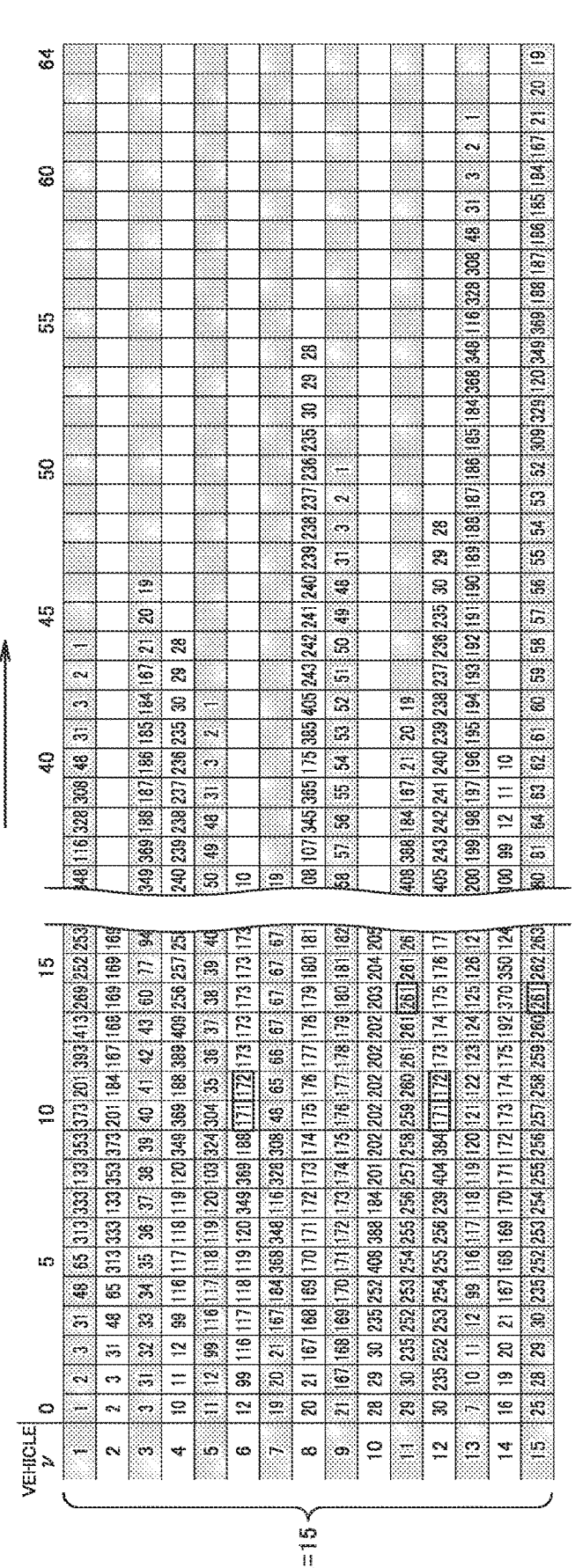
Figure 25:
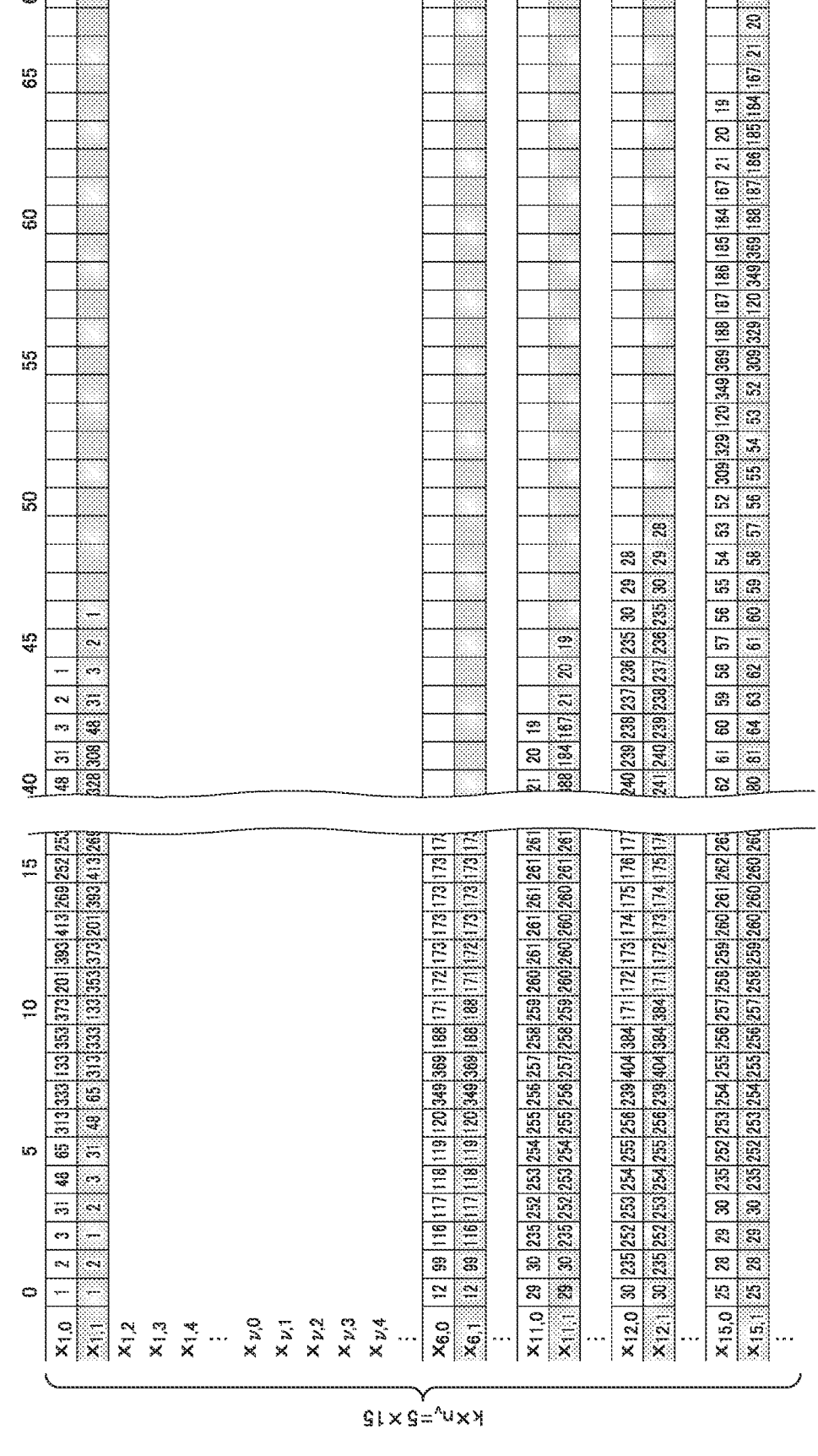

FIG. 13 is a diagram illustrating a case of solving various problem instances on the same electronic circuit by changing program variables;

FIG. 14A is a diagram illustrating case when a first vehicle is specified to be located in the second cell;

FIG. 14B is a diagram illustrating another case where program variables are fixed such that the vehicle stays at fourth cell for quadruple operation-unit times;

FIG. 14C is a diagram illustrating a still another cases where program variables are fixed such the vehicle at 66th cell for quadruple operation-unit times;

FIG. 15A is a diagram illustrating "INTRA rules" of the propositional formulae illustrated in FIG. 5;

FIG. 15B is a diagram illustrating "INTER rules" of the propositional formulae illustrated in FIG. 5;

FIG. 15C is a diagram illustrating "CONTRA rules" of the propositional formulae illustrated in FIG. 5;

FIG. 16 is a flow chart illustrating a processing flow of a solution-searching method or a solution-searching program according to the first embodiment;

FIG. 17 is a diagram illustrating a case when representing the assignment of a value to one variable by double data conversion units in an earlier technique where CONTRA rules are required;

FIG. 18 is a diagram illustrating an example of a circuit configuration using earlier electronic amoeba that requires application of the CONTRA rule;

FIG. 19 a diagram illustrating an entire configuration of a hybrid optimal-solution computation system according to a second embodiment of the present invention;

FIG. 20 is a diagram illustrating components installed in a control unit of the hybrid optimal-solution computation system according to the second embodiment;

FIG. 21 is a flow chart illustrating a processing flow of the hybrid optimal-solution computation-method or an optimal solution computer program for executing the hybrid optimal-solution computation-method according to the second embodiment;

FIG. 22 is a diagram illustrating a possible combination of a search system (a solution method) used by a conflict-resolution solution-search arithmetic-logic circuit to search for a combination of alternative trajectories (an optimal solution) that can resolve a conflict, and a search system (a solution method) used by a trajectory generator to generate new alternative trajectories to replace k-kinds of alternative trajectories;

FIG. 23 is a diagram illustrating an illustrative example of an initial trajectory determined in step S201 of the flowchart illustrated in FIG. 21 in an application example of the hybrid optimal-solution computation-method to a multistory warehouse problem according to the second embodiment;

FIG. 24 is a diagram illustrating an illustrative example of a conflict between the initial trajectory listed in step S202 of the flowchart illustrated in FIG. 21 in the application example of the hybrid optimal-solution computation-method to the multistory warehouse problem according to the second embodiment;

FIG. 25 is a diagram illustrating an illustrative example of k-kinds of the alternative trajectories generated in step S203 of the flowchart illustrated in FIG. 21 in an application example of the hybrid optimal-solution computation-method to the multistory warehouse problem according to the second embodiment;

FIG. 26 is a diagram illustrating an illustrative example of with or without conflict regarding all pairs of alternative trajectories tabulated in step S204 of the flowchart illustrated in FIG. 21 in the application example of the hybrid optimal-

Figure 27:
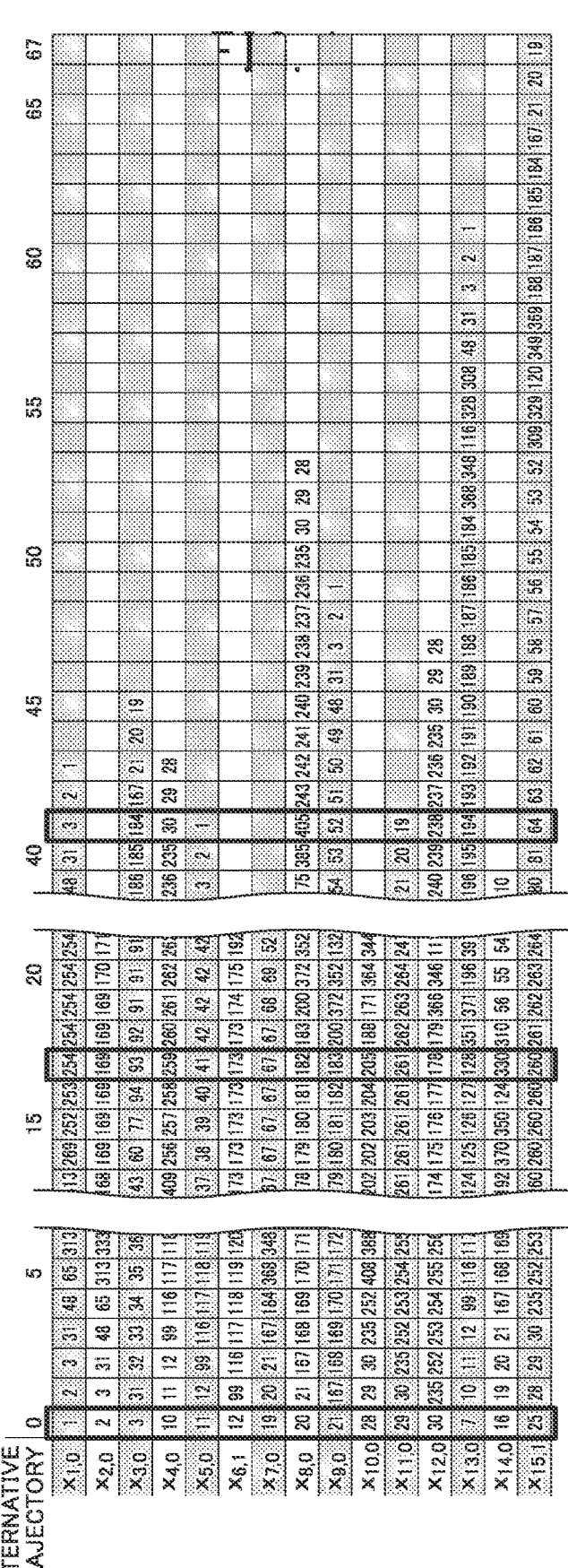

6 solution computation-method to the multistory warehouse problem according to the second embodiment; and FIG. 27 is a diagram illustrating an illustrative example of a combination (a solution) of non-conflicting alternative trajectories obtained in the search of step S205 of the flowchart illustrated in FIG. 21 in the application example of the hybrid optimal-solution computation-method to the multistory warehouse problem according to the second embodiment.

DETAILED DESCRIPTION OF THE INVENTION

For convenience in describing the present invention, first and second embodiments will be exemplified and exemplarily described with reference to the drawings. In the following description of the drawings, the same or similar parts are denoted by the same or similar reference numerals. However, it should be noted that the drawings are schematic, the relationship between the thickness and the planar dimension, the ratio of the size of each member, and the like may be different from the actual one. Therefore, specific thicknesses, dimensions, sizes, and the like should be determined more variously by considering the gist of the technical ideas that can be understood from the following description. In addition, it should also be understood that the respective drawings are illustrated with the dimensional relationships and proportions different from each other.

In addition, the first and second embodiments described below exemplify methods for embodying the technical idea of the present invention and apparatuses used in the methods, and the technical idea of the invention does not specify the material, shape, structure, arrangement and the like of the elements, and the procedures of the methods, and the like described below. The technical idea of the present invention is not limited to the content described in the first and second embodiments, and various modifications can be made within the technical scope defined by the claims.

First Embodiment

A first embodiment of the present invention is addressing to a "social scheduling optimization problem", which refers to a solution-capable problem such that an optimal solution can be obtained by the schemes of the present invention. Namely, the social scheduling optimization problems are directed to problems for optimizing various kinds of scheduling schemes that can occur in the general society. For example, as illustrated in the top row of FIG. 1, a distribution-warehouse transportation-system optimization, a work-schedule optimization, etc. can be exemplified. The "distribution-warehouse transportation-system optimization" denotes, for example, as will be explained later with reference to FIG. 7B, the case in which the most efficient scheduling is found out as the optimal solution when a plurality of automated guided-vehicles carrying packages move on a common path in the distribution warehouse. Although FIG. 7B represents the "scheduling problem" with two vehicles, transportation systems for the vehicles in the distribution warehouses shall require dozens to hundreds of vehicles to make efficient deliveries, while responding to transportation requests that are updated from time to time, resulting in extremely complicated and enormous computations. Note that, FIG. 7B is an example, and the optimizations of the transportation systems are not limited to the "distribution warehouses", but the same optimizations are applied to transportation systems in food factories, electronics factories, automobile factories, etc.

Figure 1:
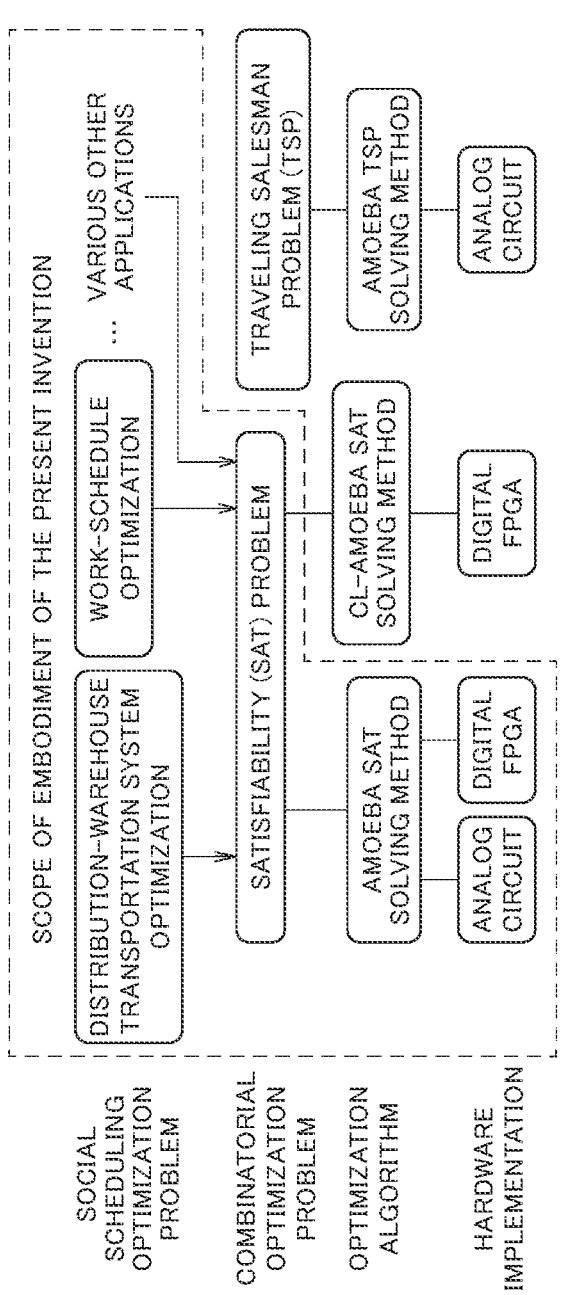
FIG. 1 is a diagram illustrating an entire picture of a combinatorial optimization problem according to a first embodiment of the present invention.

Similarly, the "work-schedule optimization" illustrated in the top row of FIG. 1 denotes scheduling of the work places and times so that employees can achieve most productive performances, by efficiently using those resources such as space resources and time resources, which are limited in a company or other organization. Here, the space resources may include desks, meeting rooms, and facilities for use, and the time resources may include work start and end times. Although not illustrated in FIG. 1, the scheduling optimizations for real-time routings in wireless communication networks, delivery plannings by automated vehicles, object movement plannings by robotic arms or the like, and distributed peer-to-peer (P2P) trading operations of goods, services and energy, are also the "social scheduling optimization problems" according to the definition of the first embodiment. Thus, the solution-searching system according to the first embodiment solves the social scheduling optimization problem (hereinafter, referred to as the "optimization problem") that includes various problems other than those illustrated in FIG. 1 as the combinatorial optimization problem. Note that, a "CL-Amoeba SAT Solving Method" illustrated outside of the area enclosed by dashed line in FIG. 1, the dashed line represents a regime addressed by the present invention, refers to an algorithm of the Circuit-Level amoeba SAT Solving Method.

Namely, the CL-Amoeba SAT Solving Metho is a simplified version of the Amoeba SAT Solving Method as recited in WO2019/017412A1, which assumes digital circuit implementation of the Amoeba SAT Solving Method.

The "combinatorial optimization problem" according to the first embodiment is for determining (formulating) a propositional formula to be used for solving the optimization problem, which correspond to a SAT problem, a traveling salesman problem (TSP), and the like. The "SAT problem" denotes a problem configured to determine whether an entire value of the propositional formula F can be made satisfiable, or namely, can be made true (True: 1), by assigning respectively true labels (True: 1) or false labels (False: 0) to values of each of logical variables (Boolean variables) $x_1$, $x_2$, . . . , $x_N$ in the propositional formula F, when a propositional formula (Boolean expression) F is given. The SAT problem is recognized as an example of a well-known combinatorial optimization problem (NP-complete problem) in the computer science. Here, the "NP-complete problem" denotes:

(a) a decision problem belonging to class NP (Non-deterministic Polynomial-time); and (b) a decision problem allowing polynomial-time reduction from problems belonging to any class NP.

The reason why any algorithm for solving the SAT problem, or the NP-complete problem, in the polynomial time is not known is the number of candidate solutions for the SAT problem increases exponentially with the problem size, and the increase will cause a combinatorial explosion.

The "TSP" is a problem of finding a closed path having the smallest sum of weights (cost), that is the shortest route, in a given weighted graph, among the closed paths—Hamilton cycles—that pass through all the vertices only once. In other words, given a plurality of cities, the problem is to find the shortest route for visiting each city exactly once and returning to the start. The TSP is considered as an example of a well-known combinatorial optimization problem—NP-hard problem—in computer science.

A term "optimization algorithm" refers to a procedure for solving an optimal solution to the above-mentioned social problems by using the logical formula formulated as the combinatorial optimization problem. The solution-searching system according to the first embodiment is based on an "amoeba SAT solving method". The amoeba SAT solving method is an optimization algorithm that uses an information processing principle of an amoeba, which is a living organism surviving in nature. It is an algorithm for a biological computer that learns from the behavior of a single-celled amoeba, which adapts to the environment and deforms a shape into an optimal pattern, and solves the complex combinatorial optimization problem, such as the TSP and the SAT problem, at high-speed using an electronic circuit that simulates a single-celled amoeba. As described below with reference to FIG. 11, an "amoeba computer", which imitates the movement of the single-celled amoeba, can provide a faster and more reliable method to get an appropriate pattern than an earlier Neumann computer, taking advantage of parallelism of current dynamics through circuits and stochastic operation resulting from device fluctuations.

The single-celled amoeba, which is a living organism, is going to extend as many pseudopods as possible to maximize nutrient acquisition, but when illuminated, the single-celled amoeba is forced to retract. One of the inventors has found that, a quasi-optimal solution to the combinatorial optimization problem, or the "TSP", can be searched in the deformation processes of the single-celled amoeba, which extends only a combination of pseudopods that can minimize the risks of light irradiations by trial and error, by employing a feedback rule for updating the on-and-off operations of light irradiations according to shapes—extension and retraction of the pseudopod—of the single-celled amoeba. In the "amoeba computer", the freely varying multiple pseudopods of the single-celled amoeba and a hub (a core) of the pseudopods store the experiences of light irradiations, generate appropriate "stochastic fluctuations" of responses to light stimuli, and have effectiveness similar to the "annealing" of a quantum computer, due to the complex spatiotemporal vibration dynamics of large degrees of freedom generated by the pseudopods.

Although there are other optimization algorithms than the amoeba SAT solving method, as illustrated in FIG. 1, the present invention assumes the amoeba SAT solving method modeled on the living organism, and therefore, descriptions distinguishable from the amoeba SAT solving method will be omitted here. As will be described later, in the present invention, increasing relatively or decreasing relatively an occurrence-frequency of a specific variable is referred to as giving "non-uniformity" to the occurrence-frequency. And the SAT optimization algorithm with such non-uniformity is referred to as a "non-uniform SAT algorithm". Although an earlier uniform-amoeba SAT solving method has been disclosed in JP6011928B, the solution-searching system according to the first embodiment provides an improved novel non-uniform-amoeba SAT solving method as the optimization algorithm.

A term "hardware implementation" defined in the first embodiment refers to an electric circuit for realizing the proposed non-uniform SAT algorithm, and there are analog circuits for analogously achieving the above optimization algorithm and digital circuits for digitally achieving the above optimization algorithm. In the following, a problem instance related to the optimization problem will be formulated as the SAT problem. And, description will be given with examples, in which the non-uniform-amoeba SAT solving method is used as the optimization algorithm, and an optimal solution is found by implementing the optimization algorithm in the analog circuit or the digital circuit.

A term "SAT solution" in the description for the solution-searching system according to the first embodiment denotes a assignment of variables that can satisfy all the constraints of a given propositional formula, and a single propositional formula is called "instance". In the first place, since the original SAT does not have the concept of finding an "optimal solution" or a "highly optimal solution", a variable assignment that satisfies the propositional logic is referred to an "SAT solution". The solution-searching system of the first embodiment is unique in that the concept of "optimality" has been introduced into the earlier SAT. However, there can be instances with multiple SAT solutions, or instances without any SAT solutions, etc. in general. From these situations, the "optimal solution" and the "highly optimal solution" are defined below. The "optimal solution" in the description of the solution-searching system according to the first embodiment refers to a solution that maximizes the "optimality". That is, the "optimal solution" is defined by a largeness or a smallness of numerous numbers of variables, each having a specific suffix "1" or "0" among the variables in the SAT solutions, the specific suffixes are specified by the user. However, it is difficult to always find the "optimal solution" in the strict sense. Therefore, the solution-searching system according to the first embodiment is directed to a scheme, which will find a "highly optimal solution", in addition to a scheme finding the optimal solution. Note that, a term "highly optimal solution" is defined as a solution having an "optimality" that is closer and closer to the "optimal solution" among multiple "SAT solutions". That is, in the description of the solution-searching system according to the first embodiment below, the term "optimal solution" may be read by the term "highly optimal solution".

Solution-Searching System of First Embodiment

Figure 2:
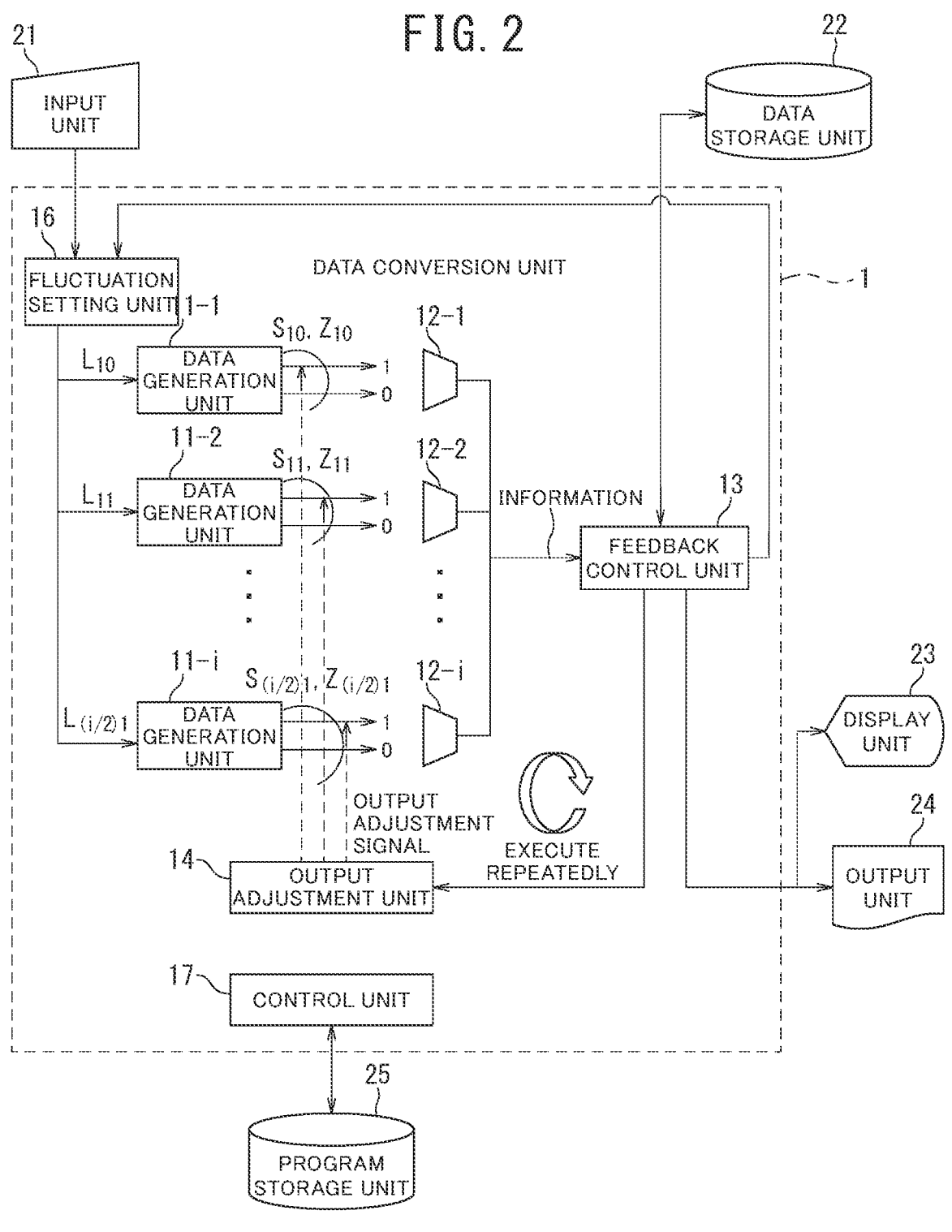
FIG. 2 is a diagram illustrating an entire configuration of a solution-searching system according to the first embodiment.

As illustrated in FIG. 2, the solution-searching system according to the first embodiment of the present invention includes a first data generation unit 11-1, a second data generation unit 11-2, . . . , and an i-th data generation unit 11-$i$, which generate binary data. Here, "i" is a suffix of variable $x_i$, and for example, when N is a positive integer greater than or equal to 2 and there are N variables, i=1 to N. The solution-searching system further includes a first data conversion unit 12-1, a second data conversion unit 12-2, . . . , and an i-th data conversion unit 12-$i$, which read and convert the data generated by the first data generation unit 11-1, the second data generation unit 11-2, . . . , and the i-th data generation unit 11-$i$ into information, respectively. The solution-searching system still further includes an output adjustment unit 14, a feedback control unit 13 and a central processing unit (CPU) 1. The output adjustment unit 14 adjusts the outputs of binary data by transmitting output-adjustment signals—bounce-back signals—to the first data generation unit 11-1, the second data generation unit 11-2, . . . , and the i-th data generation unit 11-$i$, respectively.

The feedback control unit 13 displays the optimal solutions of search-problem information by repeatedly controlling whether or not to transmit the output-adjustment signals, or to transmit the output-adjustment signals and updated fluctuation probability values, to each of the first data generation units 11-1, the second data generation unit 11-2, . . . , and the i-th data generation unit 11-$i$, based on the information converted by the first data conversion unit 12-1, a second data conversion unit 12-2, . . . , and an i-th data conversion unit 12-$i$ and search-problem information, which are preliminarily entered. The CPU 1 has a fluctuation setting unit 16 that supplies data $Z_{i,b}$ of non-uniform fluctuation probability so as to generate non-uniform occurrence-frequency in the data transmitted from each of the first data generation unit 11-1, second data generation unit 11-2, . . . , and the i-th data generation unit 11-$i$ (hereinafter abbreviated as "fluctuation probability data $Z_{i,b}$"). Here, "b" is the value of binary data, namely b="0" or "1".

Figure 9:
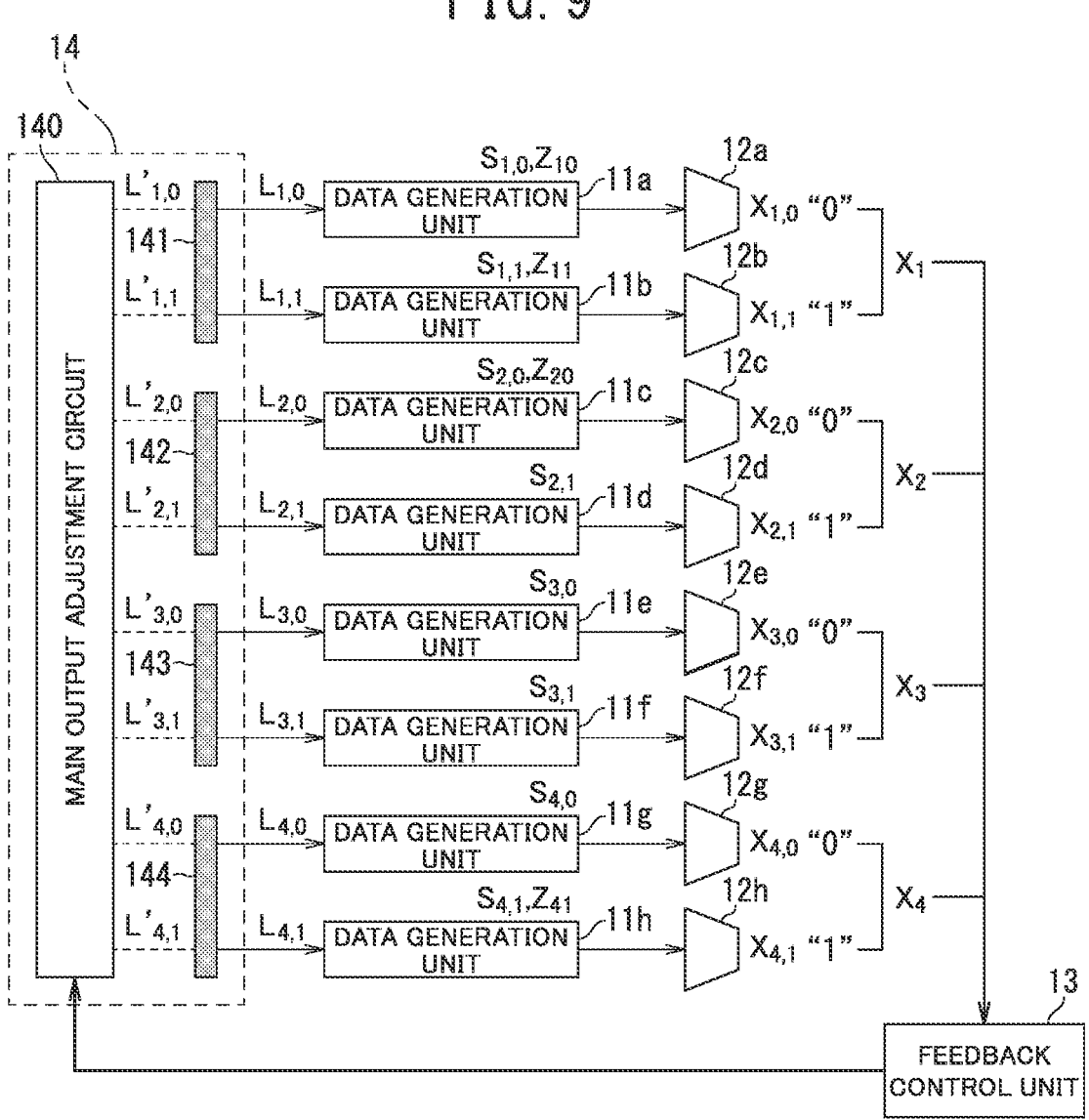
FIG. 9 is a diagram illustrating a case where assignments of values to each of single specific variables are prescribed individually by outputs from double data conversion units, respectively, according to the solution-searching system pertaining to the first embodiment.

As illustrated in FIG. 9, the output adjustment unit 14 of the solution search system according to the first embodiment includes a first signal adjustment circuit 141, a second signal adjustment circuit 142, a third signal adjustment circuit 143 and a fourth signal adjustment circuit 144. Then, as illustrated in FIG. 2, the first signal adjustment circuit 141 is connected to the first data generation unit 11-1 and the second data generation unit 11-2. And, the second signal adjustment circuit 142 is connected to the third data generation unit 11-3 and the fourth data generation unit 11-4, the third signal adjustment circuit 143 is connected to the fifth data generation unit 11-5 and the sixth data generation unit 11-6, and the fourth signal adjustment circuit 144 is connected to the seventh data generation unit 11-7 and the eighth data generation unit 11-8 (See FIGS. 10A-10C). Furthermore, as illustrated in FIG. 9, the output adjustment unit 14 of the solution-searching system according to the first embodiment includes a main output adjustment circuit 140 that supplies signals to the first to fourth signal adjustment circuits 141 to 144. When a signal is sent from the feedback control unit 13 to the main output adjustment circuit 140, a couple of provisional output-adjustment signals $L'_{1,0}$ and $L'_{1,1}$ as "provisional decisions" are fed to the first signal adjustment circuit 141, a couple of provisional output-adjustment signals $L'_{2,0}$ and $L'_{2,1}$ as "provisional decisions" are fed to the second signal adjustment circuit 142, a couple of provisional output-adjustment signals $L'_{3,0}$ and $L'_{3,1}$ as "provisional decisions" are fed to the third signal adjustment circuit 143, and a couple of provisional output-adjustment signals $L'_{4,0}$ and $L'_{4,1}$ as "provisional decisions" are fed to the fourth signal adjustment circuit 144, respectively, by the main output adjustment circuit 140.

If the output-adjustment signal $L'_{i,0}$ and the output-adjustment signal $L'_{i,1}$ are both "1" ($L'_{i,0}=L'_{i,1}=$"1") under conditions that the suffix "i" of variable $x_i$ is any one of 1 to 4, the first signal adjustment circuit 141 to the fourth signal adjustment circuit 144, which implement the output adjustment unit 14 of the solution-searching system according to the first embodiment, execute "final decisions". The "final decisions" are prescribed by final output-adjustment signal $L_{i,0}=$"0" and final output-adjustment signal $L_{i,1}=$"1" with bias probability "$p_i$", and by final output-adjustment signal $L_{i,0}=$"1" and final output-adjustment signal $L_{i,1}=$"0" with bias probability "1-$p_i$". If the provisional output-adjustment signal $L'_{i,0}=L'_{i,1}=$"0" or the provisional output-adjustment signal $L'_{i,0} \neq L'_{i,1}$, the first to fourth signal adjustment circuits 141 to 144 execute "final decisions" with the final output-adjustment signal $L_{i,0}=L'_{i,0}$ and the final output-adjustment signal $L_{i,1}=L'_{i,1}$. The bias probability $p_i$ may also be set independently for each suffix "i" of variable $x_1$ (usually $p_i=0.5$ for the suffix "i" for all variables $x_1$).

The fluctuation setting unit 16 individually sets specific fluctuation probabilities for specific variables configured to relatively increase or decrease the occurrence-frequency of the specific variable. That is, the fluctuation setting unit 16 delivers the fluctuation probability data $Z_{i,b}$ to the first data generation unit 11-1, the second data generation unit 11-2, . . . , and the eighth data generation unit 11-8. Here, "i" is a suffix of variable $x_i$, and in the case of FIG. 9, i=1 to 4, b is binary data "0" or "1". Although not shown in FIG. 9, as can be seen from FIG. 2, the fluctuation probability data $Z_{1,0}$ is fed to the first data generation unit 11-1 and the fluctuation probability data $Z_{1,1}$ is fed to the second data generation unit 11-2. The fluctuation probability data $Z_{2,0}$ is fed to the third data generation unit 11-3, and the fluctuation probability data $Z_{2,1}$ is fed to the fourth data generation unit 11-4 . . . . Then, similarly, the fluctuation probability data $Z_{4,0}$ is fed to the seventh data generation unit 11-7, and the fluctuation probability data $Z_{4,1}$ is fed to the eighth data generation unit 11-8 (See FIGS. 10A-10C).

As a result, the first data generation unit 11a delivers binary data $S_{1,0}$="0" or "1" determined from an input signal $L_{1,0}$ and a fluctuation probability data $Z_{1,0}$ as illustrated in FIG. 9. Similarly, the second data generation unit bib delivers binary data $S_{1,1}$="0" or "1" determined from an input signal $L_{1,1}$ and a fluctuation probability data $Z_{1,1}$. Furthermore, the third data generation unit 11c delivers binary data $S_{2,0}$="0" or "1" determined from an input signal $L_{2,0}$ and a fluctuation probability data $Z_{2,0}$ . . . . The eighth data generation unit 11h delivers binary data $S_{4,1}$="0" or "1" determined from an input signal $L_{4,1}$ and a fluctuation probability data $Z_{4,1}$.

Figure 11:
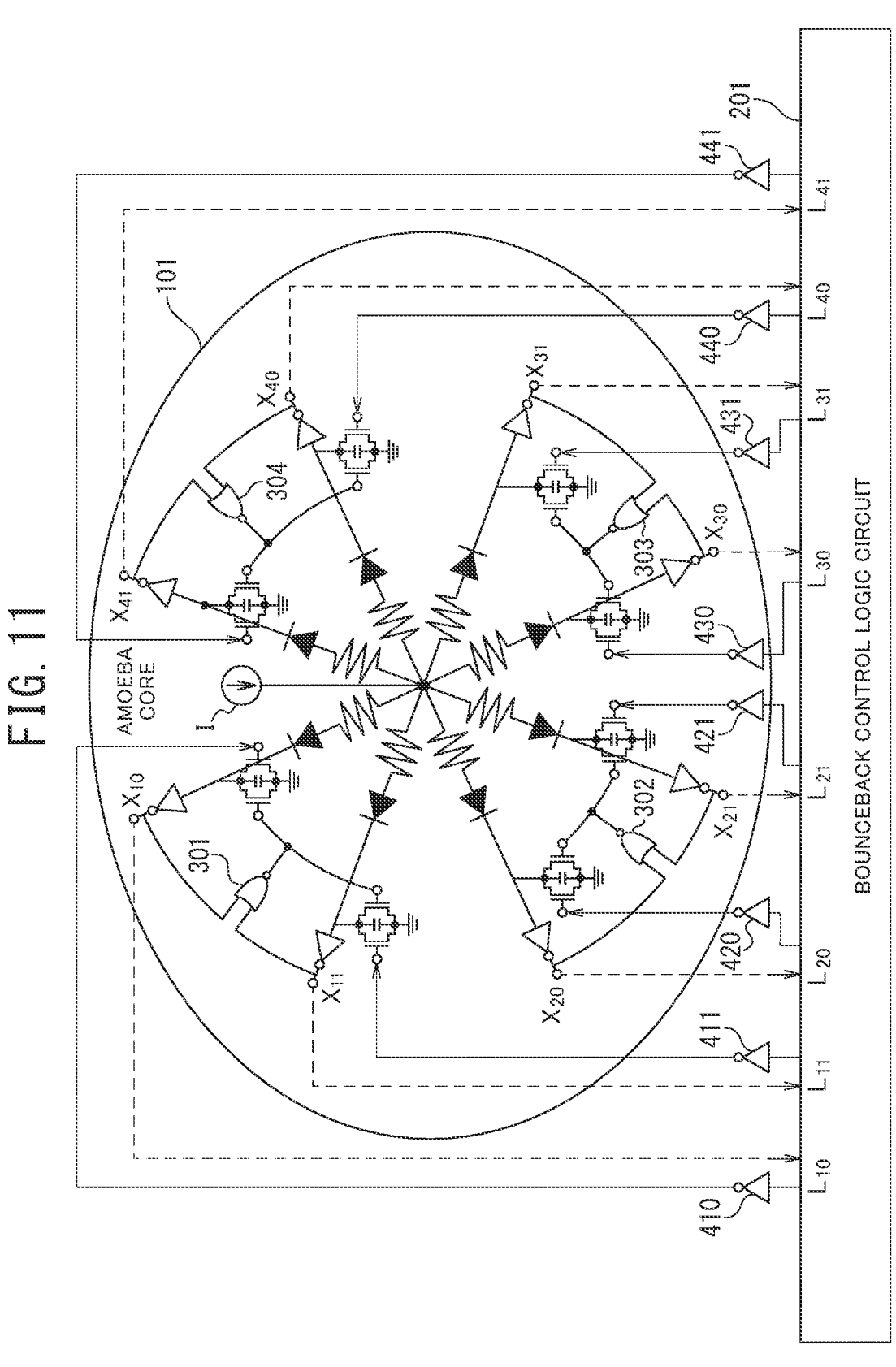
FIG. 11 is a diagram illustrating an example of a circuit using an electronic amoeba as one of specific configuration examples of the solution-searching system according to the first embodiment.

Turning back to FIG. 2, a first set (a first tandem-connected set) implemented by tandem connection of the first data generation unit 11-1 and the first data conversion unit 12-1, a second set (a second tandem-connected set) implemented by tandem connection of the second data generation unit 11-2 and the second data conversion unit 12-2, . . . , and an i-th set (an i-th tandem-connected set) implemented by tandem connection of the i-th data generation unit 11-i and the i-th data conversion unit 12-i can functionally correspond to one amoeba-pseudopod of an amoeba computer, respectively. For example, as illustrated in FIG. 9, when i=eight, each of the octuple tandem-connected sets can functionally correspond to one of octuple pseudopod units, each provided with a series circuit of a resistor and a diode as illustrated in FIG. 11. While an amoeba core 101 illustrated in FIG. 11 exemplifies a structure with the octuple pseudopod units arranged radially, corresponding to the structure of the single-celled amoeba having octuple pseudopods, the structure illustrated in FIG. 2 can correspond to a more general structure of the single-celled amoeba having "i" pieces of pseudopods.

As illustrated in FIG. 11, an input terminal of a double-input NOR gate 301 is connected between a pair of output terminals $X_{1,0}$ and $X_{1,1}$ which correspond to the double pseudopods of the single-cell amoeba, responsible for determining a value of variable $x_i$. Similarly, input terminals of double-input NOR gates 302, 303, 304 are connected between a pair of output terminals $X_{2,0}$ and $X_{2,1}$ responsible for determining a value of variable $x_2$, a pair of output terminals $X_{3,0}$ and $X_{3,4}$ responsible for determining a value of variable $x_3$ and a pair of output terminals $X_{4,0}$ and $X_{4,1}$ responsible for determining the value of variable $x_4$. Using the suffix "i" for variable $x_1$ to denote an output terminal of the amoeba core 101 illustrated in FIG. 11, the double-input NOR gates 301, 302, 303, 304 can be used to force the circuit to destabilize when $X_{i,0}$=$X_{i,1}$="0", thereby promoting a stochastic transition to either state $X_{i,0}$="1" or $X_{i,1}$="1", making application of CONTRA rules unnecessary. The octuple pseudopod units illustrated in FIG. 11 electrically retract to decrease the output voltages when suppression signals called output-adjustment signals—bounce-back signals—are applied, and electrically extend to increase the output voltages under other conditions. However, as with the single-celled amoeba, which is a living organism, even when the pseudopod unit can electrically extend so as to increase the output voltage, "fluctuating behavior" in which the pseudopod unit does not extend occurs with a certain fluctuation probability. In accordance with the solution-searching system pertaining to the first embodiment, individual "fluctuation probabilities" imitating the behaviors of the single-cell amoeba are externally set non-uniformly or updated every steps according to user-prescribed rules.

Each of the first data conversion unit 12-1, the second data conversion unit 12-2, . . . , and the i-th data conversion unit 12-i reads the data transferred from each of the first data generation unit 11-1, the second data generation unit 11-2, . . . , and the i-th data generation unit 11-i, and converts the data into information. Each of the first data conversion unit 12-1, the second data conversion unit 12-2, . . . , and the i-th data conversion unit 12-i reads digital data, for example, when "1" is transmitted as the digital data, from each of the first data generation unit 11-1, the second data generation unit 11-2, . . . , and the i-th data generation unit 11-i, and delivers a value, which is obtained by adding "+1" to the value of the current step, as corresponding information.

Also, for example, when "0" is transmitted as the digital data from each of the first data generation unit 11-1, the second data generation unit 11-2, . . . , and the i-th data generation unit 11-i, each of the first data conversion unit 12-1, the second data conversion unit 12-2, . . . , and the i-th data conversion unit 12-i reads the digital data, and delivers a value, which is obtained by adding "−1" to the value of the current step, as corresponding information. Since the octuple pseudopod units of the amoeba core 101 illustrated in FIG. 11 can supply $\{-1, 0, 1\}$, which represents the extending/retracting state of the pseudopod in the single-celled amoeba, each of the first data conversion unit 12-1, the second data conversion unit 12-2, . . . , and the i-th data conversion unit 12-i makes the output of the octuple pseudopod units correspond to the $\{-1, 0, 1\}$ information read out from each of the first data generation unit 11a, the second data generation unit 11b, . . . , and i-data generation unit 11-i.

However, a possible value for each of the first data conversion unit 12-1, the second data conversion unit 12-2, . . . , and the i-th data conversion unit 12-i may be limited so that the maximum value is $X_{max}$ and the minimum value is $-X_{min}$. In such case, the possible value for each of the first data conversion unit 12-1, the second data conversion unit 12-2, . . . , and the i-th data conversion unit 12-i may be one of $-X_{min}$, . . . −1, 0, +1, and . . . $+X_{max}$, where $X_{min}$ and $X_{max}$ may be any value. It indicates that the outputs of the "i" pieces of pseudopod units can take multiple kinds (multiple steps) of values.

It is a simple example to express the extending/retracting state of the single-celled amoeba illustrated in FIG. 11 in terms of the ternary value of $\{-1, 0, 1\}$, in the solution-searching system of the first embodiment, but it is not limited to the ternary value. It is also possible to express the extending/retracting state with a quinary value $\{-2, -1, 0, 1, 2\}$, and the extending/retracting state can generally be designed to take a K-value with K as a positive odd number. In order to take quintuple kinds of values, for example, considering that $-X_{min}$ is −2 and $+X_{max}$ is +2, then when the value of the current step of each of the first data conversion unit 12-1, the second data conversion unit 12-2, . . . , and the i-th data conversion unit 12-i is "+2", the value "+1" will be transmitted in the next step regardless of the value of the output data from each of the first data generation unit 11-1, the second data generation unit 11-2, . . . , and the i-th data generation unit 11-i, and when the value of the current step of each of the first data conversion unit 12-1, the second data conversion unit 12-2, . . . , and the i-th data conversion unit 12-i is "−2", the value "−1" will be transmitted in the next step regardless of the value of the output data from each of the first data generation unit 11-1, the second data generation unit 11-2, . . . , and the i-th data generation unit 11-$i$. Note that, the output information from the first data conversion unit 12-1, the second data conversion unit 12-2, . . . , and the i-th data conversion unit 12-$i$ is not limited to those described above, but can be any information as long as it is based on data from each of the first data generation units 11-1, the second data generation unit 11$b$, . . . , and the i-th data generation unit 11-$i$, and further the information can be correspond to the extension and retraction of the pseudopod of the single-celled amoebae and the fluctuation in the extension and retraction of the pseudopod of the single-celled amoebae can be utilized.

As illustrated in FIG. 2, the solution-searching system according to the first embodiment further includes an input unit 21, a display unit 23, an output unit 24, a data storage unit 22, a program storage unit 25, etc., as in a normal Neumann computer system. The fluctuation probability values can be set by the user of the solution-searching system according to the first embodiment via the input unit 21 illustrated in FIG. 2 from outside the system, so that the fluctuation setting unit 16 can independently specify any fluctuation probability value for each of the first data generation unit 11-1, the second data generation unit 11-2, . . . , and the i-th data generation unit 11-$i$. Furthermore, the problem instance related to the optimization problem can be entered via the input unit 21 as multiple constraints in the implication form and information of a logical conjunction of the constraints. The "implication form" denotes the form of "if-then" in logic. That is, the form of the conditional statement "if A, then B" is the implication form when A is the antecedent and B is the consequent. The SAT problem can be expressed by the multiple constraints in the implication form entered via the input unit 21 and the logical conjunction of the constraints. The search-problem information formulated as the SAT problem can be stored in the data storage unit 22.

The feedback control unit 13 of the solution-searching system according to the first embodiment determines whether an optimal solution for the SAT problem has been found based on the information converted by the first data conversion unit 12-1, the second data conversion unit 12-2, . . . , and the i-th data conversion unit 12-$i$, and the search-problem information stored in the data storage unit 22. If it is determined that the optimal solution has not been found, the feedback control unit 13 repeats the operations of transmitting the output-adjustment signals (the bounce-back signals) to each of the first data generation unit 11-1, the second data generation unit 11-2, . . . , and the i-th data generation unit 11-$i$ through the first signal adjustment circuit 141, the second signal adjustment circuit 142, the third signal adjustment circuit 143 and the fourth signal adjustment circuit 144 in the output adjustment unit 14 until an optimal solution is found. When multiple SAT solutions are found from the search-problem information, a specific SAT solution having an occurrence-frequency for one specific variable, the occurrence-frequency will more increase or more decrease than other occurrence-frequencies of SAT solutions for other variables than the specific variable, relatively, is selected from entire multiple SAT solutions. And the selected specific SAT solution is displayed as the objective SAT solution on the display unit 23 or the output unit 24.

As illustrated in FIG. 2, the CPU 1 further includes a control unit 17. And, the operations of the first data generation unit 11$a$, the second data generation unit 11$b$, . . . , the i-th data generation unit 11-$i$, the first data conversion unit 12-1, the second data conversion unit 12-2, . . . , the i-th data conversion unit 12-$i$, the feedback control unit 13, the output adjustment unit 14, and the fluctuation setting unit 16 are controlled by the control unit 17 via a bus, although the bus is not illustrated. That is, although instruction-transmission paths are not illustrated in FIG. 2, there are the instruction-transmission paths from the control unit 17 to the first data generation unit 11$a$, the second data generation unit 11$b$, . . . , the i-th data generation unit 11-$i$, the first data conversion unit 12-1, the second data conversion unit 12-2, . . . , the i-th data conversion unit 12-$i$, the feedback control unit 13, the output adjustment unit 14, and the fluctuation setting unit 16. Similarly, although the instruction-transmission path is not illustrated in FIG. 2, the information entered via the input unit 21 is stored in the data storage unit 22 via the bus. Information stored in the data storage unit 22 can be read by the fluctuation setting unit 16 or the feedback control unit 13 via the bus.

Although, a sequence circuit is not illustrated in FIG. 2, the control unit 17 follows a time sequence read out from the sequencing circuit, and the control unit 17 delivers instructions sequentially, configured to control the operations of the data generation unit 11, the data conversion unit 12, the feedback control unit 13, the output adjustment unit 14, and the fluctuation setting unit 16 in accordance with the procedures ordered by the solution-searching program according to the first embodiment, which is stored in the program storage unit 25. The program storage unit 25 stores solution-searching programs represented by algorithms as illustrated in FIG. 16, which will be described later. Each of constituent-elements, such as the first data generation unit 11$a$, the second data generation unit 11$b$, . . . , the i-th data generation unit 11-$i$, the first data conversion unit 12-1, the second data conversion unit 12-2, . . . , the i-th data conversion unit 12-$i$, the feedback control unit 13, the output adjustment unit 14, and the fluctuation setting unit 16, is not limited to the organization of the amoeba computer as illustrated in FIG. 11, but may be embodied in any existing circuit and device, apparatus, or the like that realizes those functions.

Outline of Solution-Searching Method by First Embodiment

In a solution-searching method according to the first embodiment, at first, via the input unit 21 illustrated in FIG. 2, a user of the solution-searching system feeds problem instances related to an optimization problem as multiple constraints in implication forms in step S101 illustrated in a flowchart of FIG. 16. The constraints entered are formulated as a SAT problem by the logical conjunction of the constraints so as to construct a set of search-problem information, and the search-problem information is stored in the data storage unit 22. Further, in step S102, the user enters a plurality of fluctuation probabilities $\varepsilon_{i,b}$ that can be separately assigned to each variable via the input unit 21, and stores the entered fluctuation probabilities $\varepsilon_{i,b}$ in the data storage unit 22 ("i" is the suffix of variable $x_i$, "b" is the value of the binary data, and b="0" or "1").

In the solution-searching method according to the first embodiment, the user can set the fluctuation probabilities $\varepsilon_{i,b}$ from outside the solution-searching system according to the first embodiment through the input unit 21 so that, for example, the optimal solution can be obtained at high-speed and high-probability, by increasing relatively or decreasing relatively the occurrence-frequency of the state $x_j$="1" for a set of specific variables $x_j$. When finding a solution with higher probability is desired, such that a probability of finding a number resulting in $x_j$="1" for specific variables shall be as small as possible than the number of $x_1$="1" for other remaining variables shall be higher, the user may individually feed the fluctuation probability $\varepsilon_{j,1}$ through the input unit 21. Namely, the fluctuation probability $\varepsilon_{j,1}$ greater than $\varepsilon_{j,0}$, $\varepsilon_{i,0}$, and $\varepsilon_{i,1}$ will be entered individually through the input unit 21. That is, $$\varepsilon_{j,1} > \varepsilon_{j,0} = \varepsilon_{i,0} = \varepsilon_{i,1}, \tag{1}$$

here, "j" is a suffix to the specific variable $x_j$. In the solution-searching method according to the first embodiment, the fluctuation probability $\varepsilon_{i,b}$ is externally set to make the occurrence-frequency of the specific variable $x_j$="1" relatively larger or smaller than other variables, so that the occurrence-frequencies are non-uniform. The SAT optimization algorithm creating such non-uniformity of the occurrence-frequencies is referred as the "non-uniform SAT algorithm".

Each value of the fluctuation probabilities $\varepsilon_{i,b}$ may be updated at every step according to a rule prescribed by the user. As an example, let the value of the fluctuation probability of the amoeba-pseudopod (i,b) in a step "t" be $\varepsilon_{i,b}(t)$ and the value of the data conversion unit of the amoeba-pseudopod (j,c) in the step "t" be $X_{j,c}(t)$. In such case, the value of the fluctuation probability $\varepsilon_{i,b}(t+1)$ of each amoeba-pseudopod in the next step "t+1" may be updated by a user-prescribed activation function "f" as represented by the following Eq. (2), $$\varepsilon_{i,b}(t+1) = f(\Sigma_{j,c} \, w_{i,b,j,c} X_{j,c}(t)) \tag{2}$$

The activation function "f" in Eq. (2) is a sum-of-product operation function, namely the sum of the vectors each of which is determined by a product of the value $X_{j,c}(t)$ and the user-prescribed weight matrix $w_{i,b,j,c}$, for of all of the data conversion units. If the weight matrices $w_{i,b,j,c}$ and the activation function "f" are set appropriately and adequately according to the objective functions of the problem instances related to the optimization problems, the values of the fluctuation probability $\varepsilon_{i,b}$ are dynamically updated every step, and it becomes possible to derive the more optimal solution.

Then, in step S103, in view of the search-problem information stored in the data storage unit 22, the set of the multiple fluctuation probabilities $\varepsilon_{i,b}$ stored in the data storage unit 22 is read out by the fluctuation setting unit 16. In step S103, the multiple fluctuation probabilities $\varepsilon_{i,b}$ including different fluctuation probabilities are individually supplied to each of the first data generation unit 11-1, the second data generation unit 11-2, . . . , and the i-th data generation unit 11-i. Then, in step S104, each of the first data generation unit 11-1, the second data generation unit 11-2, . . . , and the i-th data generation unit 11-i relies on the independent and different fluctuation probabilities to generate a set of non-uniform data, and prescribes the occurrence-frequency of one specific variable output by each of the first data generation unit 11-1, the second data generation unit 11-2, . . . , and the i-th generation unit 11-i to a value different from each value of the occurrence-frequency of other variables. Further, in step S105, the first data conversion unit 12-1, the second data conversion unit 12-2, . . . , and the i-th data conversion unit 12-i which have the same ordinal number as the first data generation unit 11-1, the second data generation unit 11-2, . . . , and the i-th data generation unit 11-i, read the data generated by the first data generation unit 11-1, the second data generation unit 11-2, . . . , and the i-th data generation unit 11-i, to convert the data into the information, respectively.

In step S106 indicated in the flowchart of FIG. 16, the feedback control unit 13 determines whether the SAT solution has been found, based on the information converted by the first data conversion unit 12-1, the second data conversion unit 12-2, . . . , and the i-th data conversion unit 12-i, and the search-problem information preliminarily entered. When the feedback control unit 13 determines in step S106 that the SAT solution has been found, the process proceeds to step S108, where a final SAT solution—an optimal solution—is transferred to the display unit 23 or the output unit 24, and the final SAT solution is displayed by the display unit 23 or the output unit 24. When the feedback control unit 13 determines in step S106 that the SAT solution has not been found, the process proceeds to step S107, where the output adjustment unit 14 transmits the output-adjustment signals—the bounce-back signals—to each of the first data generation unit 11-1, the second data generation unit 11-2, . . . , and the i-th data generation unit 11-i.

Furthermore, in step S107, the feedback control unit 13 may update the values of each fluctuation probability $\varepsilon_{i,b}$ according to the rule prescribed by the user, and transmit the values to the fluctuation setting unit 16. The feedback control unit 13 sends instruction-signals to the output adjustment unit 14 until it is determined that the SAT solution has been found, to repeatedly control the processing of the loops from step S104 to step S105 to step S106 to step S107 and to step S104 so that the output adjustment unit 14 repeats the operations of either transmitting the output-adjustment signals, or transmitting the output-adjustment signals and the updated fluctuation probability values, to each of the first data generation unit 11-1, the second data generation unit 11-2, . . . , and the i-th data generation unit 11-i. Thus, the iterative loop process continues until the feedback control unit 13 determines that the final SAT solution—the optimal solution—to the SAT problem expressed in terms of multiple constraints in the implication form and the logical conjunction of the constraints has been found.

Outline of Solution-Searching Program by First Embodiment

A series of process steps of the solution-searching method illustrated in FIG. 16 can be executed by controlling the solution-searching system illustrated in FIG. 2 by a computer-software program with an algorithm equivalent to the process flow illustrated in FIG. 16. The program may be stored in the program storage unit 25 of the computer system implementing the solution-searching system of the present invention. In addition, the solution-searching program according to the first embodiment can execute a series of steps in the solution-searching method of the present invention, after storing the solution-searching program in a computer-readable recording-medium, and reading out the solution-searching program from the recording medium into the program storage unit 25 in the solution-searching system. Here, the "computer-readable recording-medium" refers to, for example, a medium capable of recording programs, such as an external memory of a computer, a semiconductor memory, a magnetic disk, an optical disk, a magneto-optical (MO) disk, and a magnetic tape.

Specifically, the "computer-readable recording media" includes a flexible disk, a Compact Disc Read only memory (CD-ROM), a MO disk, an open-reel tape and the like. For example, the main body of the information processing device can be manufactured to incorporate or externally connect a flexible disk device (a flexible disk drive) and an optical disk device (an optical disk drive). By inserting the flexible disk into the flexible disk drive or the CD-ROM into the optical disk drive through a loading slot and executing a predetermined reading operation, the solution-searching program stored in the recording media can be installed in the program storage unit 25 implementing the solution-searching system. Furthermore, the solution-searching program according to the first embodiment can be stored in the program storage unit 25 via an information processing network such as the internet.

In other words, in the solution-searching program pertaining to the first embodiment, when a user of the solution-searching system according to the first embodiment enters the problem instances related to the optimization problem through the input unit 21 illustrated in FIG. 2 as the constraints in the implication form, corresponding to step S101 in the flowchart of FIG. 16. Then, the control unit 17 formulates the entered constraints as a SAT problem, which is a logical conjunction of the constraints, and the formulated SAT problem is defined as search-problem information. And the control unit 17 sends an instruction to store the search-problem information in the data storage unit 22. Furthermore, when the user enters the multiple fluctuation probabilities $\varepsilon_{i,b}$, bias probabilities $p_i$, and threshold values $\theta_{i,b}$, each of which can be separately assigned for each variable, through the input unit 21 in step S102, the control unit 17 sends an instruction to store the entered fluctuation probabilities $\varepsilon_{i,b}$, the bias probabilities $p_i$, and the threshold values $\theta_{i,b}$ in the data storage unit 22.

Further, corresponding to step S103 in the flowchart of FIG. 16, the control unit 17 transmits an instruction to the fluctuation setting unit 16 to read out from the data storage unit 22 the externally entered information of the fluctuation probability $\varepsilon_{i,b}$, the bias probability $p_i$, and the threshold value $\theta_{i,b}$. The fluctuation setting unit 16 supplies the independent and different fluctuation probability to each of the first data generation unit 11-1, the second data generation unit 11-2, . . . , and the i-th data generation unit 11-$i$ based on the information of fluctuation probabilities $\varepsilon_{i,b}$ retrieved from the data storage unit 22. Also, based on the information of the bias probabilities $p_i$ retrieved from the data storage unit 22, the fluctuation setting unit 16 supplies the independent and different bias probability to each of the first signal adjustment circuit 141, the second signal adjustment circuit 142, . . . , and the i-th signal adjustment circuit. Furthermore, the fluctuation setting unit 16 supplies the independent and different threshold values to each of the first data conversion unit 12-1, the second data conversion unit 12-2, . . . , and the i-th data conversion unit 12-$i$ based on the information of the threshold values $\theta_{i,b}$ retrieved from the data storage unit 22.

Then, corresponding to step S104, the first data generation unit 11-1, the second data generation unit 11-2, . . . , and the i-th data generation unit 11-$i$ generate the set of non-uniform data based on the independent and different fluctuation probabilities, and the occurrence-frequency of same specific variables provided by each of the first data generation unit 11-1, the second data generation unit 11-2, . . . , and the i-th generation unit 11-$i$ is set to a value different from each value of the occurrence-frequency of other variables. Then, corresponding to step S105, the control unit 17 transmits instructions to the first data conversion unit 12-1, the second data conversion unit 12-2, . . . , and the i-th data conversion unit 12-$i$, which have the same ordinal number as the first data generation unit 11-1, the second data generation unit 11-2, . . . , and the i-th data generation unit 11-$i$, to read-out the data generated by the first data generation unit 11-1, the second data generation unit 11-2, . . . , and the i-th data generation unit 11-I, respectively, and further, to convert the retrieved data into the information, respectively.

Corresponding to step S106 in the flowchart of FIG. 16, the control unit 17 transmits an instruction to the feedback control unit 13 to determine whether the optimal solution has been found, based on the information converted by the first data conversion unit 12-1, the second data conversion unit 12-2, . . . , and the i-th data conversion unit 12-$i$, and the search-problem information preliminarily entered. When the feedback control unit 13 determines in step S106 that the SAT solution has been found, the control unit 17 transmits an instruction to proceed to step S108. By an instruction corresponding to step S108, the control unit 17 delivers the final SAT solution—the optimal solution—using the display unit 23 or the output unit 24. When the feedback control unit 13 determines in step S106 that the SAT solution has not been found, the control unit 17 sends an instruction to proceed to step S107. Then, corresponding to step S107, the control unit 17 sends an instruction to the output adjustment unit 14 to transmit the output-adjustment signals (the bounce-back signals) to each of the first data generation unit 11-1, the second data generation unit 11-2, . . . , and the i-th data generation unit 11-$i$. In addition, in step S107, it is also possible to cause the feedback control unit 13 update each value of the fluctuation probabilities $\varepsilon_{i,b}$ according to the rule prescribed by the user, and send those values to the fluctuation setting unit 16.

The control unit 17 transmits an instruction to the output adjustment unit 14 to continue transmitting the instruction-signals to the output adjustment unit 14 until it is determined that the final SAT solution—the optimal solution—is found. And, with the instruction, the output adjustment unit 14 repeats the operations of transmitting the output-adjustment signals, or alternatively, repeats the operations of transmitting the output-adjustment signals and the updated fluctuation probability values, to each of the first data generation unit 11-1, the second data generation unit 11-2, . . . , and the i-th data generation unit 11-$i$. As a result, procedures corresponding to a loop from the step S104 to the step S104, via the step S105, the step S106 and the step S107 are repeatedly controlled by the feedback control unit 13. Thus, in the solution-searching program pertaining to the first embodiment, the optimal solution of the SAT problem expressed by the constraints in the implication form and the logical conjunction of the constraints can be found.

In accordance with the solution-searching system pertaining to the first embodiment illustrated in FIG. 2, the solution-searching method pertaining to the first embodiment illustrated in the flowchart of FIG. 16, and the solution-searching program pertaining to the first embodiment corresponding to the algorism represented by the flowchart of FIG. 16, it is possible to find the optimal solution even if a CONTRA rule, which is one of the constraints required in the earlier uniform-amoeba SAT solving method, is deleted, apart from the non-uniform fluctuation. The CONTRA rule will be described later. That is, according to the solution-searching system, the solution-searching method and the solution-searching program pertaining to the first embodiment, one objective of solving the SAT problem may be achieved without complicating the optimization algorithm. In addition, even in a case when the multiple SAT solutions may be found from the search-problem information, the SAT problem can be quickly and efficiently solved, by setting non-uniformly the fluctuation probabilities for specific data so that the occurrence probabilities of the variables in each SAT solution can be individually defined according to the solution-searching system, the solution-searching method and the solution-searching program pertaining to the first embodiment. That is, by setting non-uniformly the fluctuation probabilities for specific data so that the occurrence-frequency of one specific variable can be determined to increase relatively, or to decrease relatively, compared with occurrence-frequencies of the other variables, the SAT problem can be quickly and efficiently solved. Furthermore, since various problem instances can be represented by allowing the program variables in search-problem information—a single formulated logical expression—to be changed, the optimal solution can be obtained without replacing the hardware-resources, that is, on the same electronic circuit even if the problem instance is changed. The processing of making the program variables modifiable will be described later.

The first data generation unit 11-1, the second data generation unit 11-2, . . . , and the i-th data generation unit 11-i supply a set of non-uniform data in accordance with the predetermined non-uniform fluctuation probabilities, respectively. The set of non-uniform data transferred from the first data generation unit 11-1, the second data generation unit 11-2, . . . , and the i-th data generation unit 11-i may be binarized digital data or analog data, but in the following description, the case in which either "1" or "0" is transferred will be used as an example. Also, one or more of the first data generation unit 11-1, the second data generation unit 11-2, . . . , and the i-th data generation unit 11-i receive the output-adjustment signals (bounce-back signals) transmitted from the output adjustment unit 14. Then, the first data generation unit 11-1, the second data generation unit 11-2, . . . , and the i-th data generation unit 11-i, which have received the output-adjustment signals, control the set of non-uniform data to be transmitted, based on the output-adjustment signals.

Figure 3:
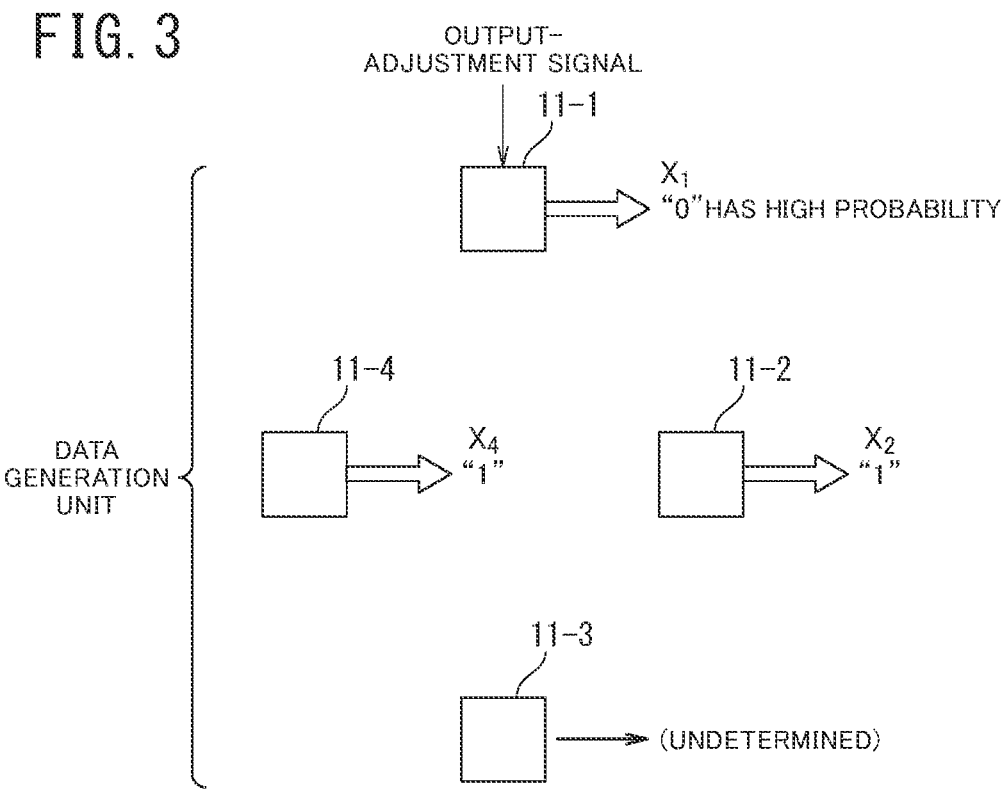
FIG. 3 is a diagram illustrating a control of output data from a data generation unit due to transmitting an output-adjustment signal.
Figure 4:
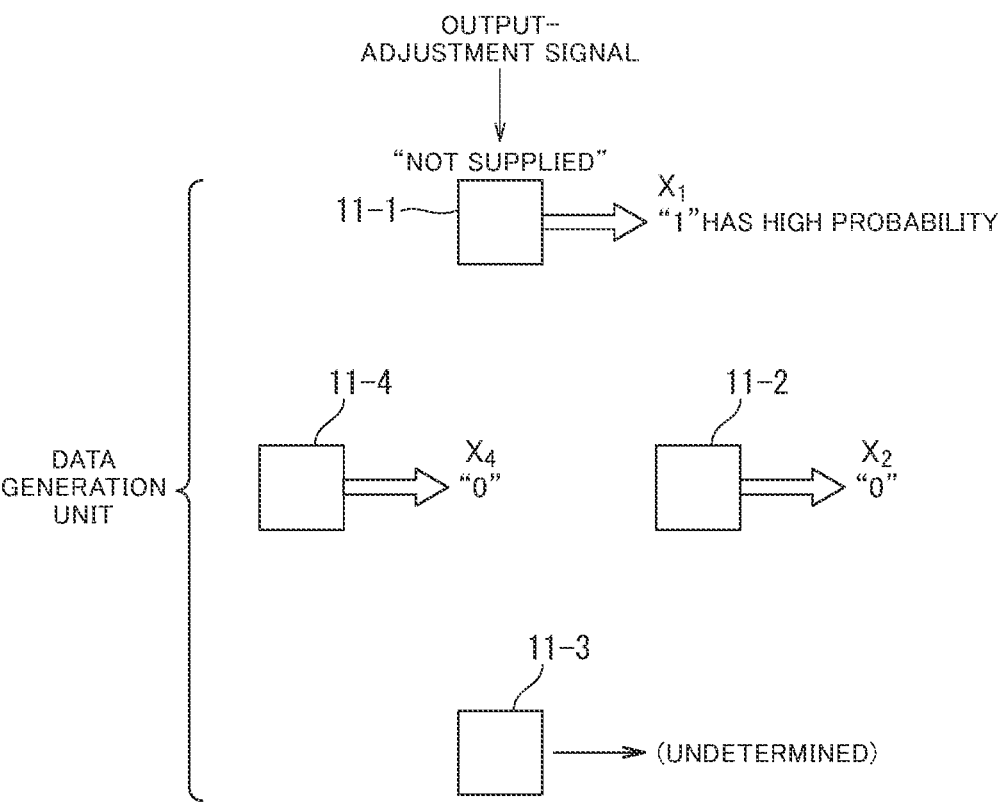
FIG. 4 is another diagram illustrating the control of the output data from the data generation unit du to transmitting an output-adjustment signal.

As illustrated in FIG. 3, focusing on the first data generation unit 11-1, when the output-adjustment signal is supplied to the first data generation unit 11-1, the first data generation unit 11-1 is set to increase the frequency of transmitting "0". On the contrary, as illustrated in FIG. 4, when the output-adjustment signal is not supplied to the first data generation unit 11-1, the frequency of transmitting "1" is set to be increased by the first data generation unit 11-1 in such situation. Note that, the first data generation unit 11-1, the second data generation unit 11-2, . . . , and the i-th data generation unit 11-i may be embodied in any form as long as the functions illustrated in FIGS. 3 and 4 can be implemented. Each of the first data generation unit 11-1, the second data generation unit 11-2, . . . , and the i-th data generation unit 11-i may be implemented by, for example, a circuit unit of the amoeba computer capable of transferring either "1" or "0" at constant time intervals. Or, alternatively, when executing the solution-searching program pertaining to the first embodiment by the computer, the first data generation unit 11-1, the second data generation unit 11-2, . . . , and the i-th data generation unit 11-I are not limited to physical hardware-resources, but can also be implemented by virtually defined conceptual components—logical circuits—in software.

The data transferred from the first data generation unit 11-1, the second data generation unit 11-2, . . . , and the i-th data generation unit 11-i of the solution-searching system according to the first embodiment include not only randomly delivered data such as uncorrelated stochastic random numbers, but also data transmitted with fluctuations having spatial and temporal correlations, which are transmitted from a system such as a chaotic dynamical system and a nonlinear coupled oscillator system. The characteristics of the non-uniform occurrence-frequency to be given to the output data are determined based on the non-uniform fluctuation probability supplied by the fluctuation setting unit 16. As described above, each of the first data conversion unit 12-1, the second data conversion unit 12-2, . . . and the i-th data conversion unit 12-i receives the data transferred from each of the first data generation units 11-1, the second data generation unit 11b, . . . , and the i-th data generation unit 11-i, and executes information conversion on the transferred data. Each of the first data conversion unit 12-1, the second data conversion unit 12-2, . . . , and the i-th data conversion unit 12-i delivers the information converted data.

Here, each of the first data generation units 11-1, the second data generation unit 11b, . . . and the i-th data generation unit 11-I can transmit information as to whether each possible value of $-X_{min}$, . . . , $-1$, $0$, $+1$, . . . , $+X_{max}$ for the first data conversion unit 12-1, the second data conversion unit 12-2, . . . , and the i-th data conversion unit 12-i is greater than or less than a certain threshold value $\theta_{i,b}$. The threshold value $\theta_{i,b}$ can also be determined independently for each "i" and "b" associated with the data conversion unit. Further, the information transmitted from each of the first data conversion unit 12-1, the second data conversion unit 12-2, . . . , and the i-th data conversion unit 12-i is not limited to the positive or negative binary data, and may be any information based on the converted data.

Further, when there are N pieces of variables, the number of units covering the first data generation unit 11-1, the second data generation unit 11-2, . . . , and the number of units covering the i-th data generation unit 11-i and each of the first data conversion unit 12-1, the second data conversion unit 12-2, . . . , and the i-th data conversion unit 12-i may be N or 2N. Each of the information transmitted from the first data conversion unit 12-1, the second data conversion unit 12-2, . . . , and the i-th data conversion unit 12-i is sent to the feedback control unit 13. Also, the transmitted information may also be displayed on a screen of the display unit 23 and the like.

The feedback control unit 13 receives the information converted and transmitted from each of the first data conversion unit 12-1, the second data conversion unit 12-2, . . . , and the i-th data conversion unit 12-i. The feedback control unit 13 controls the transmission of the output-adjustment signals (bounce-back signals) by the output adjustment unit 14 on the basis of the received information and the search-problem information preliminarily entered and stored in the data storage unit 22. In concrete terms, the feedback control unit 13 controls the jobs of confirming whether the output-adjustment signals are transmitted, or not transmitted to each of the first data generation unit 11-1, the second data generation unit 11-2, . . . , and the i-th data generation unit 11-i, respectively, to which the output-adjustment signals shall be transmitted individually. Further, the feedback control unit 13 displays the optimal solution for the search-problem information based on the information finally converted by the first data conversion unit 12-1, the second data conversion unit 12-2, . . . , and the i-th data conversion unit 12-i through the iteration of the transmission controls of the output-adjustment signals. The optimal solution may be displayed on a user interface such as the display unit 23.

Based on the control from the feedback control unit 13, the output adjustment unit 14 transmits the output-adjustment signals, or transmits the output-adjustment signals and the updated fluctuation probability values, to each of the first data generation unit 11-1, the second data generation unit 11-2, . . . , and the i-th data generation unit 11-i. The output-adjustment signals may be supplied to all of the first data generation units 11-1, the second data generation units 11-2, . . . , and the i-th data generation units 11-i, or, vice versa, not to all of the first data generation units 11-1, the second data generation units 11-2, . . . , and the i-th data generation units 11-i, based on the controls from the feedback control unit 13. Each of the first data generation units 11-1, the second data generation units 11-2, . . . , and the i-data generation units 11-i, to which the output-adjustment signal is supplied respectively, will have a different tendency in the output data, respectively, compared to each of the first data generation units 11-1, the second data generation units 11-2, . . . , and i-data generation units 11-i to which the output-adjustment signal is not supplied respectively.

The fluctuation setting unit 16 is an apparatus that assigns the non-uniform occurrence-frequency to the data transferred from the first data generation unit 11-1, the second data generation unit 11-2, . . . , and the i-th data generation unit 11-i, respectively, by supplying the non-uniform fluctuation probabilities. As illustrated in the flow chart of FIG. 16, according to the solution-searching system pertaining to the first embodiment, the operations are repeatedly executed in the order of the first data generation unit 11-1, the second data generation unit 11b, . . . , the i-th data generation unit 11-i, the first data conversion unit 12-1, the second data conversion unit 12-2, . . . , the i-th data conversion unit 12-i, and the feedback control unit 13, by transmitting the output-adjustment signals from the output adjustment unit 14 until the final SAT solution—optimal solution—is found.

In accordance with the solution-searching system pertaining to the first embodiment, whether or not to transmit the output-adjustment signals (bounce-back signals) to each of the first data generation units 11-1, the second data generation unit 11b, . . . , or the i-th data generation unit 11-i is controlled based on the search-problem information preliminarily entered and stored in the data storage unit 22. In other words, the feedback control unit 13 controls the transmissions of the output-adjustment signals by the output adjustment unit 14 based on two factors. Namely, the first factor includes the information transmitted from the first data generation unit 11-1, the second data generation unit 11-2, . . . , and the i-th data generation unit 11-i, and converted by the first data conversion unit 12-1, the second data conversion unit 12-2, . . . , and the i-th data conversion unit 12-i, respectively. And the second factor includes the search-problem information stored in the data storage unit 22.

The "search-problem information" encompasses the problem information, such as all constraints and objective functions including those represented by propositional formulas. The search-problem information stored in the data storage unit 22 may be understood as any problem information related to the optimum solution search problem. The search-problem information stored in the data storage unit 22 may be represented by, for example, a propositional formula consisting of N pieces of variables. The search-problem information is $(P_0 ?P_1? . . . ?P_n)$="true" ("1") or "false" ("0"). Here "?" denotes any arithmetic symbol, such as logical sum (OR), logical product (AND), and the like, may be applied. In accordance with the solution-searching system pertaining to the first embodiment, in order to search for the optimal solution of the search-problem information, the supply of the output-adjustment signals is controlled to eliminate the information that does not satisfy the propositional formula as the search-problem information. Namely, the supply of the output-adjustment signals is controlled based upon the information transferred from the first data generation unit 11-1, the second data generation unit 11-2, . . . , and the i-th data generation unit 11-I, and furthermore, converted by the first data conversion unit 12-1, the second data conversion unit 12-2, . . . , and the first data conversion unit 12-i, respectively. By controlling the supply of the output-adjustment signals, the search for the solution becomes possible, by giving a SAT problem that sleuths for a variable as the search-problem information, in order to make the overall value of a propositional formula "true" ("1"), for example.

For example, FIG. 5 illustrates a propositional formula for the logical conjunction of sextuple disjunctive clauses expressed by the given Boolean expressions F11 to F16 to be "1" ("true"). The propositional formula is an expression with the quadruple variables $x_1$, $x_2$, $x_3$, $x_4$ and the sextuple disjunctive clauses. Since the sextuple disjunctive clauses are connected by conjunction (AND), it can be seen that in order for the conjunction of the sextuple disjunctive clauses to be "1", all the disjunctive clauses must be "1". For example, when focusing on the Boolean expression F11=($x_1$ or ~$x_2$) in FIG. 5, if $x_1$ is "0", the Boolean expression F11 cannot be set to "1" unless $x_2$ is set to "0". Note that, in the present specification, negation (NOT) is indicated by the Boolean logic symbol "~" in the notation of the Boolean expression shown in parentheses. When $x_1$="0" in the Boolean expression F11=($x_1$ or ~$x_2$), control is made to negate that $x_2$ is "1". Further, when $x_2$ is "1", the Boolean expression F11 cannot be set to "1" if $x_1$ is "0". When $x_2$="1" in the Boolean expression F11=($x_1$ or ~$x_2$), control is made so as to negate that $x_1$ is "0".

Further, when focusing on the Boolean expression F12= (~$x_2$ or $x_3$ or ~$x_4$), if $x_3$ is "0" and $x_4$ is "1", the Boolean expression F12 cannot be set "1" if $x_2$ is "1". In such a case, control is made so as to negate that $x_2$ is "1". Similarly, if $x_2$ is "1" and $x_3$ is "0", the Boolean expression F12 cannot be set to "1" if $x_4$ is "1". In such a case, control is made so as to negate that $x_4$ is "1". Similarly, if $x_2$ is "1" and $x_4$ is "1", the Boolean expression F12 cannot be set to "1" if $x_3$ is "0". In such a case, control is made so as to negate that $x_3$ is "0".

As for the remaining Boolean expressions F13=($x_1$ or $x_3$) to F16=(~$x_1$ or $x_4$), based on the same logic as illustrated in FIG. 5, in order to make the entire value of the propositional formula "true", control is made so as to eliminate the information that do not satisfy the propositional formula. Thus, it is possible to derive the entire value of the propositional formula to "true". Further, in executing such a solution search, according to the solution-searching system pertaining to the first embodiment, the output-adjustment signals (bounce-back signals) can be supplied to each of the first data generation unit 11-1, the second data generation unit 11-2, . . . , and the i-th data generation unit 11-i to eliminate the information that do not satisfy the propositional formula as the search-problem information, according to the information held by the first data conversion unit 12-1, the second data conversion unit 12-2, . . . , and the i-th data conversion unit 12-i.

Therefore, by giving the search-problem information implemented by the propositional formulas as illustrated in FIG. 5, and executing the operations of supplying the output-adjustment signals in accordance with the search-problem information, each of the output states from the first data conversion unit 12-1, the second data conversion unit 12-2, . . . , and the i-th data conversion unit 12-I, which satisfies the propositional formula as the search-problem information, can be reached finally.

In particular, even in the case of solving propositional formulas provided with the logical conjunctions of multiple disjunctive clauses, such as Boolean expressions F11 to F16 illustrated in FIG. 5, by feeding the propositional formula as the search-problem information in the feedback control unit 13, the supply of the output-adjustment signals can be controlled, in accordance with the search-problem information stored in the data storage unit 22, for deriving the solution. Note that, although the SAT solution illustrated in FIG. 5 is $$(x_1, x_2, x_3, x_4) = (1,1,1,1),$$

and the SAT solution can be obtained by the solution-searching system of the first embodiment. Further, according to the solution-searching system pertaining to the first embodiment, in the case of solving the propositional formula, the problem instance related to the optimization problem is formulated as the SAT problem expressed by a plurality of constraints in "if-then" form—implication form—and logical conjunctions of the constraints. The "constraints in the implication form" correspond to an INTER rule of the amoeba SAT solving method which will be described later. As a result, even if the CONTRA rule of the amoeba SAT solving method described later is deleted, the optimum solution can be obtained, and the SAT problem can be solved without complicating the optimization algorithm.

Figures 6A, 6B:
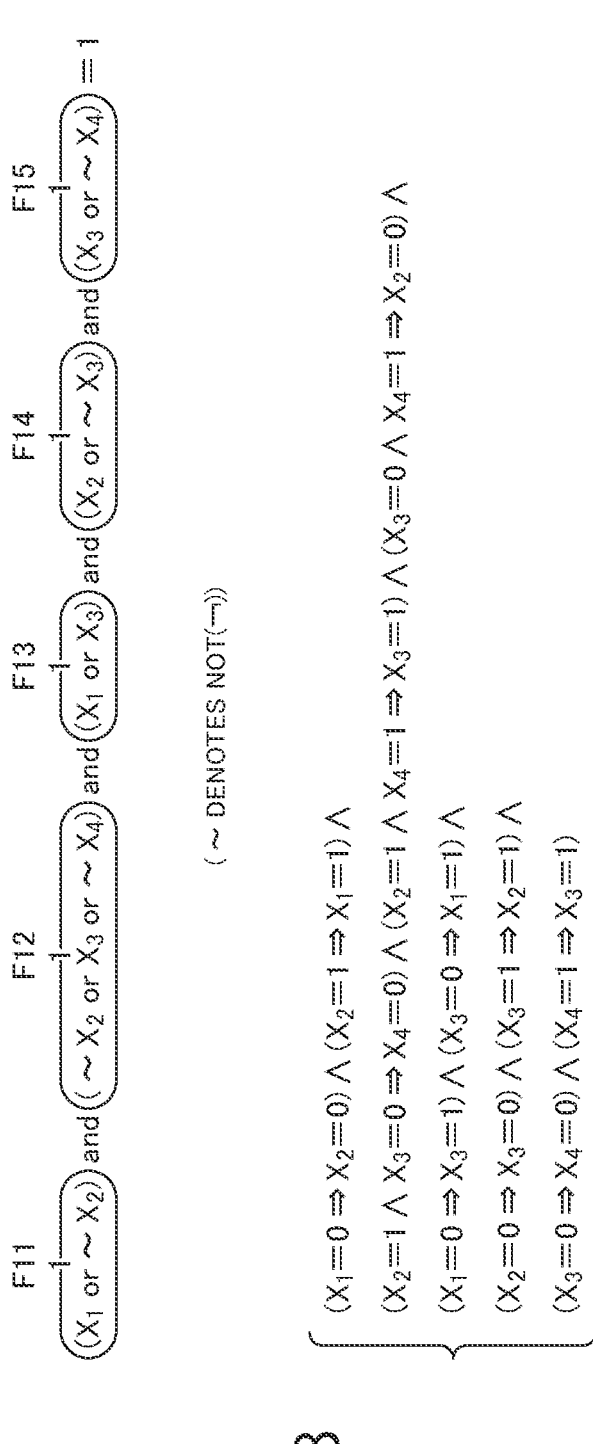
FIG. 6A is a diagram illustrating another example of the propositional formula.
FIG. 6B is expressions for explaining that the propositional formula illustrated in FIG. 6A is expressed by conjunctions of constraints in the implication form.

However, for example, in the case of the propositional formula illustrated in FIG. 6A, the propositional formula has quadruple SAT solutions:

$$(x_1, x_2, x_3, x_4) = (1,1,1,1), \ (1,1,1,0), \ (1,1,0,0), \text{ and } (1,0,0,0).$$

FIG. 6B illustrates that the propositional formula illustrated in FIG. 6A is represented by the logical conjunctions of the constraints of the "if-then" form—implication form—corresponding to the respective quintuple disjunctive clauses. It is necessary to select an optimum solution from the propositional formula illustrated in FIG. 6A. And therefore, the solution-searching system of the first embodiment can select one solution quickly and efficiently, by facilitating individual settings of the occurrence-probabilities for variables in each SAT solution. That is, by prescribing the fluctuation probabilities such that the occurrence-frequency of one of the variables among $x_1$, $x_2$, $x_3$ and $x_4$ is relatively more or less than the occurrence-frequencies of the other variables, the one solution can be selected quickly and efficiently. As an example, when introducing the "non-uniformity" by setting to select the solutions for occurrence-frequencies of $x_j$ (j is odd number)=1 is the lowest, the solutions can be narrowed down to double of:

$$(x_1, x_2, x_3, x_4) = (1,1,0,0) \text{ and } (1,0,0,0).$$

Figure 7A:
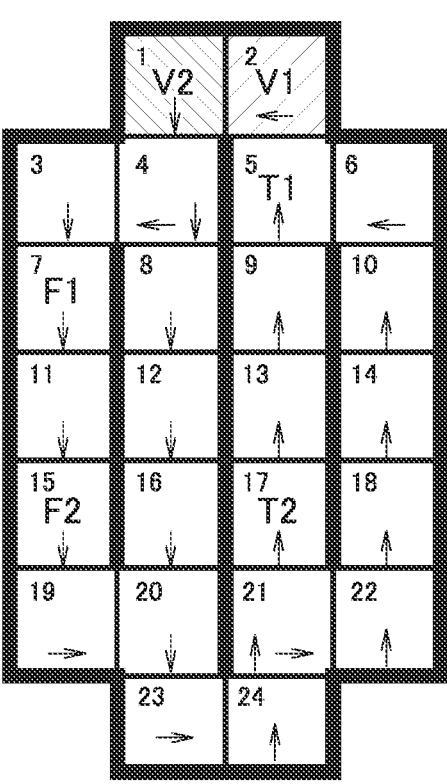
FIG. 7A is a diagram illustrating an example of a moving route of a vehicle in a distribution warehouse when optimization for an automated transportation system is taken up as the combinatorial optimization problem.
Figure 7B:
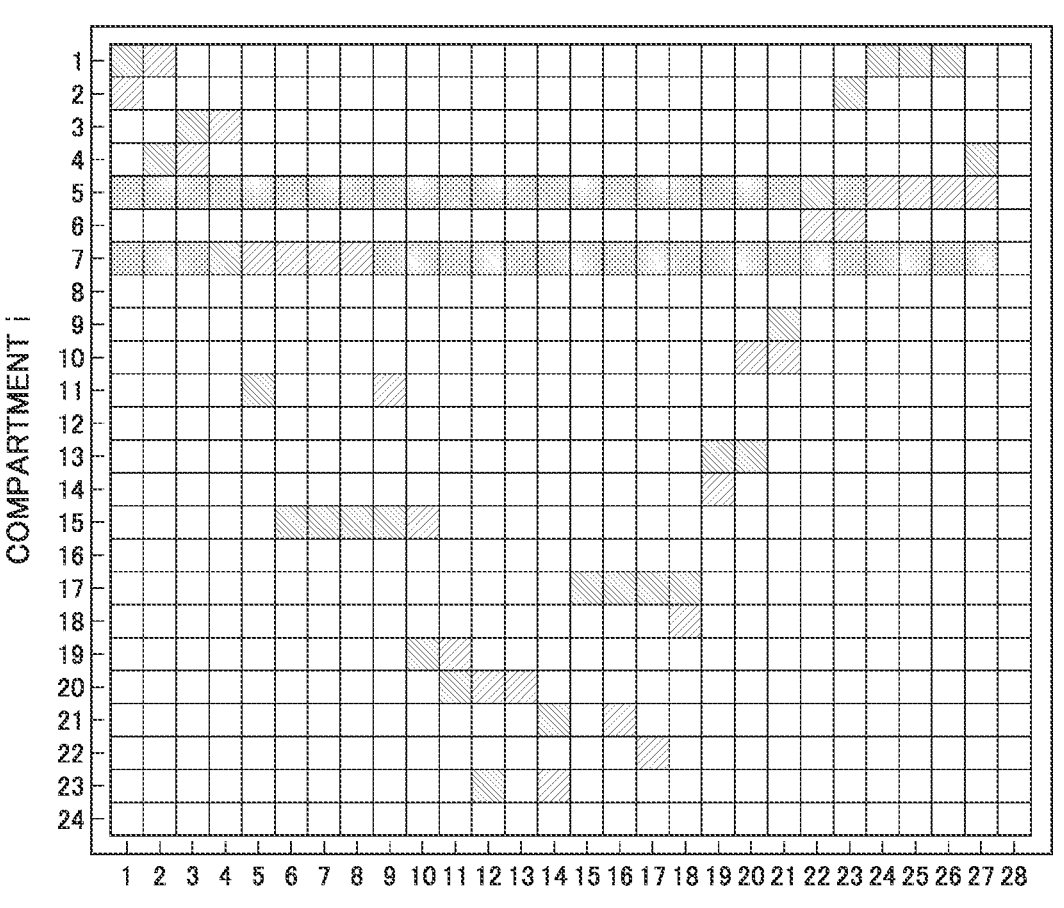
FIG. 7B is a diagram illustrating an example of a trajectory that satisfies a transportation requirement.

In FIGS. 7A and 7B, the optimization of an automated transportation system for vehicles in a distribution warehouse will be described as an example of the constraints expressed in the implication form—"if-then" form—according to the solution-searching system pertaining to the first embodiment. FIG. 7A illustrates a two-dimensional arrangement of unit transportation compartments (cells) in the distribution warehouse. Arrows in the unit transportation compartments indicate constraints on the movement direction. The abscissa of FIG. 7B is a time axis with an operation-unit time as a cell size. In FIG. 7B, an array of twenty-eight operation-unit times is illustrated on the abscissa provided with times one to 28 of the operation-unit times. The ordinate of FIG. 7B represents a coordinate system indicating a spatial position of the unit transportation compartment as the cell size, converting the two-dimensional array of the unit transportation compartments in the distribution warehouse illustrated in FIG. 7A into a one-dimensional array along the ordinate. In FIGS. 7A and 7B, the cells with upward-sloping hatching indicate first vehicles v1 and the cells with downward-sloping hatching indicate second vehicles v2. Here, $x_{v,i,p}=1$ denotes that vehicle v stays in "i"-th unit transportation compartment (cell) at time (operation-unit time) "p". When the first vehicle v1 is requested to convey a package from a loading seventh cell—labeled by F1—to an unloading fifth cell—labeled by T1—, and the second vehicle v2 is requested to convey another package from a loading 15th cell—labeled by F2—to an unloading 17th cell—labeled by T2—, a solution that satisfies all of the first to third constraints can represent a schedule (FIG. 7B) that satisfies demand for the operation of the vehicle, by defining a set of triple constraints as follows.

(FIRST CONSTRAINT): prohibits alternatives or partitions of the same vehicle into multiple cells: if $x_{v,i,p}=1$, then $x_{v,j,p}=0$.

(SECOND CONSTRAINT): prohibits coexistence of multiple vehicles in the same cell: if $x_{v,i,p}=1$, then $x_{w,i,p}=0$.

(THIRD CONSTRAINT): constraint for expressing transportation requirements to a certain vehicle: the vehicle must go to the appointed loading/unloading cell and stay for a prescribed time $t_v$.

As illustrated in FIG. 7B, the first vehicle v1, filled with the upward-sloping hatching, is located in the second cell at the time 1, then moves to the first cell on the left-side face of the second cell at the time 2 and moves to the fourth cell below the first cell at the time 3. Further, the first vehicle v1 filled with the upward-sloping hatching moves to the third cell on the left-side face of the fourth cell at time 4, and then moves to the seventh cell, labeled by F1, below the third cell at the time 5 to stay until the time 8 for loading. The first vehicle v1 filled with the upward-sloping hatching moves to the 11th cell below the seventh cell at the time 9, moves to the 15th cell below the 11th cell at the time 10, moves to the 19th cell below the 15th cell at the time 11, and then moved to the 20th cell on the right side of the 19th cell at the time 12 to stay until the time 13.

Furthermore, the first vehicle v1, filled with the upward-sloping hatching, moves to the 23th cell below the 20th cell at the time 14, moves to the 24th cell on the right side of the 23th cell at the time 15, moves to the 21th cell above the 24th cell at the time 16, and then moves to the 22th cell on the right of the 21th cell at the time 17. Furthermore, the first vehicle v1, filled with the upward-sloping hatching, moves to the 18th cell above the 22th cell at the time 18, moves to the 14th cell above the 18th cell at the time 19, and then moves to the 10th cell above the 14th cell at the time 20 to stay until the time 21. Then, the first vehicle v1, indicated by upward-sloping hatching, moves to the sixth cell above the 10th cell at the time 22 to stay until the time 23, and then moves to the fifth cell, labeled by T1 as destination, on the left-side face of the sixth cell at the time 24 to stay until the time 27 for unloading.

The second vehicle v2, indicated by downward-sloping hatching, is located in the first cell at the time 1, then moves to the fourth cell below the first cell at the time 2 and moves to the third cell on the left-side face of the fourth cell at the time 3. Further, the second vehicle v2, indicated by downward-sloping hatching, moves to the seventh cell below the third cell at the time 4, moves to the 11th cell below the seventh cell at the time 5, and moves to the 15th cell, labeled by F2, below the 11th cell at the time 6 to stay until the time 9 for loading. Furthermore, the second vehicle v2, indicated by downward-sloping hatching, moves to the 19th cell below the 15th cell at the time 10, moves to the 20th cell on the right side of the 19th cell at the time 11, moves to the 23th cell below the 20th cell at the time 12, moves to the 24th cell on the right side of the 23th cell at the time 15, moves to the 21th cell above the 24th cell at the time 14, and then moves to the 17th cell, labeled by T2 as the destination, above the 21th cell to stay until the time 18 for unloading. Furthermore, the second vehicle v2, indicated by downward-sloping hatching, moves to the 13th cell above the 17th cell at the time 19 to stay until the time 20. Then, the second vehicle v2 moves to the ninth cell above the 13th cell at the time 21, moves to the fifth cell above the ninth cell at the time 22, moves to the second cell above the fifth cell at the time 23, moves to the first cell on the left-side face of the second cell at the time 24 to stay until the time 26, and then moves to the fourth cell below the first cell at the time 25.

Figure 8A:
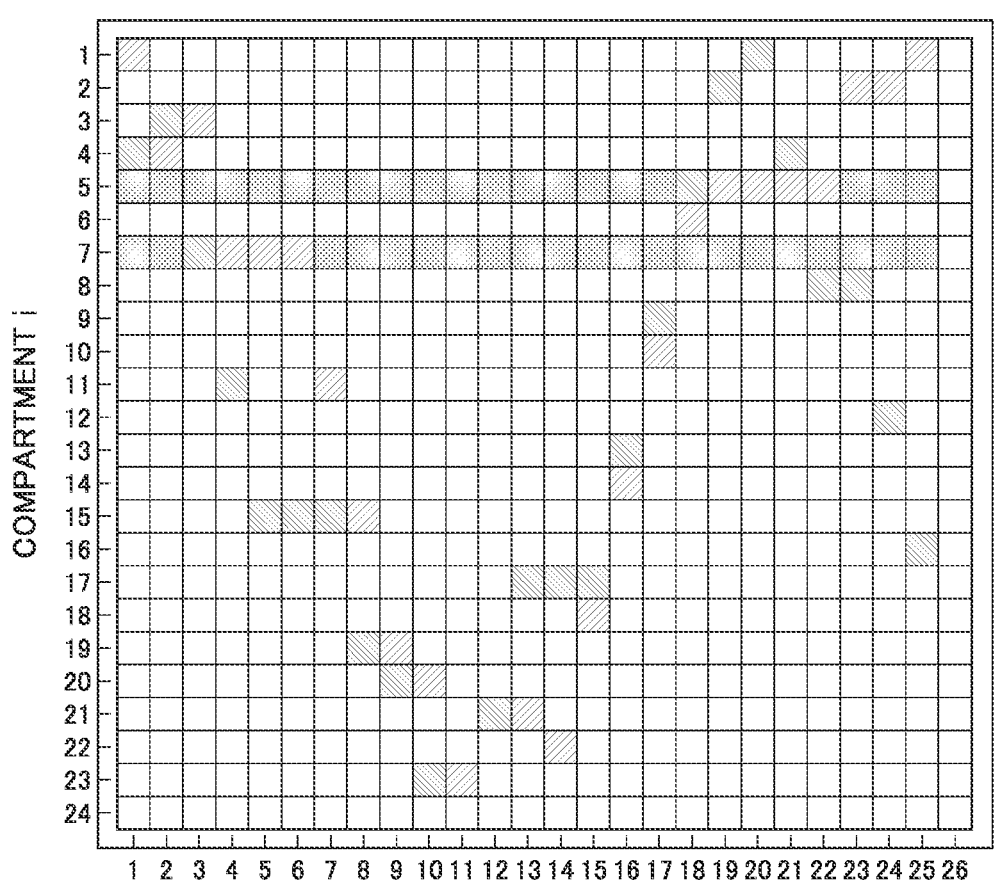
FIG. 8A is a diagram illustrating an example of a highly optimal solution—trajectory—found when an algorithm for a non-uniform SAT problem according to the first embodiment is used.
Figure 8B:
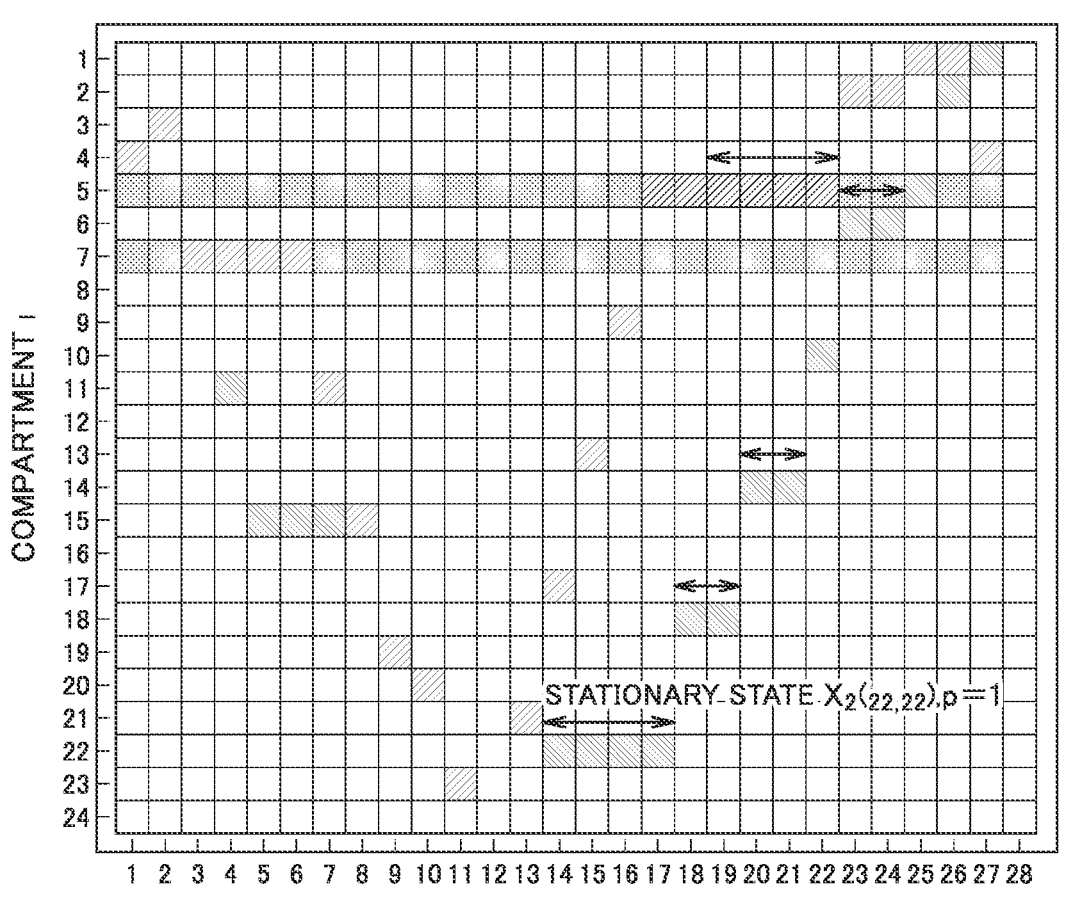
FIG. 8B is a diagram illustrating an example of a less optimal solution—trajectory—found by using an earlier algorithm.

In addition, FIG. 8A illustrates the effectiveness of applying the solution-searching system of the first embodiment, which uses a novel non-uniform-amoeba SAT solving method, to the optimization of the automated transportation system for vehicles in the distribution warehouse, where the fluctuations assigned to the data are non-uniform. FIG. 8B illustrates, for comparison, the effectiveness of applying the earlier uniform-amoeba SAT solving method to the optimization of an automated transportation system for vehicles in a similar distribution warehouse. As in FIGS. 7A and 7B, each abscissa in FIGS. 8A and 8B is the time axis with the operation-unit time as cell size. Each ordinate in FIGS. 8A and 8B represents a coordinate system illustrating the spatial position of the unit transportation compartment as cell size. As in FIGS. 7A and 7B, in FIGS. 8A and 8B, the cell with the upward-sloping hatching indicates the first vehicle v1 and the cell with the downward-sloping hatching indicates the second vehicle v2. In the scheduling by the solution-searching system of the first embodiment using the novel non-uniform-amoeba SAT solving method, illustrated in FIG. 8A, the first vehicle v1, filled with upward-sloping hatching, is located in the first cell at the time 1, then moves to the fourth cell below the first cell at the time 2, and moves to the third cell on the left-side face of the fourth cell at the time 3.

Furthermore, the first vehicle v1 moves to the seventh cell, labeled by F1 in FIG. 7A, below the third cell at the time 4 to stay in the seventh cell until the time 6 for loading. After loading, the first vehicle v1 moves to the 11th cell below the seventh cell at the time 7, moves to the 15th cell below the 11th cell at the time 8, moves to the 19th cell below the 15th cell at the time 9, and moves to the 20th cell on the right side of the 19th cell at the time 10. Furthermore, the first vehicle v1, filled with upward-sloping hatching, moves to the 23th cell below the 20th cell at the time 11, moves to the 24th cell on the right side of the 23th cell at the time 12, moves to the 21th cell above the 24th cell at the time 13, and moves to the 22th cell on the right side of the 21th cell at the time 14. Furthermore, the first vehicle v1, indicated with the upward-sloping hatching, moves to the 18th cell above the 22th cell at the time 15, moves to the 14th cell above the 18th cell at the time 16, and moves to the 10th cell above the 14th cell at the time 17. Then, the first carriage v1, filled with the upward-sloping hatching, moves to the sixth cell above the 10th cell at the time 18, and moves to the fifth cell, labeled by T1 as the destination, on the left-side face of the sixth cell at the time 19 to stay until the time 22 for unloading. After unloading, the first vehicle v1 moves to the second cell above the fifth cell at the time 24 to stay until the time 25, and then returns to the first cell on the left-side face of the second cell at the time 26.

The second vehicle v2, filled with downward-sloping hatching in FIG. 8A, is located in the fourth cell at the time 1, and then moves to the third cell on the left-side face of the fourth cell at the time 2. Furthermore, the second vehicle v2, filled with downward-sloping hatching, moves to the seventh cell below the third cell at the time 3, moves to the 11th cell below the seventh cell at the time 4, and moves to the 15th cell, labeled by F2 in FIG. 7A, below the 11th cell at the time 5 to stay until the time 7 for loading. After loading, the second vehicle v2 moves to the 19th cell below the 15th cell at the time 8, moves to the 20th cell on the right side of the 19th cell at the time 9, moves to the 23th cell below the 20th cell at the time 10, moves to the 24th cell on the right side of the 23th cell at the time 11, moves to the 21th cell above the 24th cell at the time 12, and moves to the 17th cell, labeled by T2 in FIG. 7A as the destination, above the 21th cell at the time 13 to stay until the time 15 for unloading. After unloading, the second vehicle v2 moves to the 13th cell above the 17th cell at the time 16, moves to the ninth cell above the 13th cell at the time 17, moves to the fifth cell above the ninth cell at the time 18, moves to the second cell above the fifth cell at the time 19, moves to the first cell on the left-side face of the second cell at the time 20, and moves to the fourth cell below the first cell at the time 21. The second vehicle v2, which has finished unloading, and moves to the eighth cell below the fourth cell at the time 22 to stay until the time 23. Then, the second vehicle v2 moves to the 12th cell below the eighth cell at the time 24, and moves to the 16th cell below the 12th cell at the time 25.

On the contrary, in the scheduling by the earlier uniform-amoeba SAT solving method illustrated in FIG. 8B, the first vehicle v1, filled with upward-sloping hatching, is located in the fourth cell at the time 1, moves to the third cell on the left-side face of the fourth cell at the time 2, and moves to the seventh cell, labeled by F1 in FIG. 7A, below the third cell at the time 3 to stay in the seventh cell until the time 6 for loading. After loading, the first vehicle v1 moves to the 11th cell below the seventh cell at the time 7, moves to the 15th cell below the 11th cell at the time 8, moves to the 19th cell below the 15th cell at the time 9, and moves to the 20th cell on the right side of the 19th cell at the time 10. Furthermore, the first vehicle v1, filled with upward-sloping hatching, moves to the 23th cell below the 20th cell at the time 11, moves to the 24th cell on the right side of the 23th cell at the time 12, moves to the 21th cell above the 24th cell at the time 13, and moves to the 17th cell above the 21th cell at the time 14. Furthermore, the first vehicle v1, filled with upward-sloping hatching, moves to the 13th cell above the 17th cell at the time 15, moves to the ninth cell above the 13th cell at the time 16, and moves to the fifth cell, labeled by T1 in FIG. 7A as the destination, above the ninth cell at the time 17 to stay until the time 22 for unloading. After unloading, the first vehicle v1 moves to the second cell above the fifth cell at the time 23 to stay until the time 24, then returns to the first cell on the left-side face of the second cell at the time 25 to stay until the time 26, and then moves to the fourth cell below the first cell at the time 27.

In the scheduling by the earlier uniform-amoeba SAT solving method illustrated in FIG. 8B, the second vehicle v2, filled with downward-sloping hatching, is located in the 11th cell below the seventh cell at the time 4, and then moves to the 15th cell, labeled by F2 in FIG. 7A, below the 11th cell at the time 5 to stay until the time 7 for loading. Although the intermediate course is unknown, after loading the second vehicle v2 is located in the 22th cell at the time 14 and stays until the time 17. The second vehicle v2 moves to the 18th cell above the 22th cell at the time 18 to stay until the time 19, and then moves to the 14th cell above the 18th cell at the time 20 to stay until the time 21. The second vehicle v2 moves to the 10th cell above the 14th cell at the time 22 and moves to the sixth cell above the 10th cell at the time 23 to stay until the time 24. The second vehicle v2 moves to the fifth cell on the left-side face of the sixth cell at the time 25 and moves to the second cell above the fifth cell at the time 26. The second vehicle v2 moves to the first cell on the left-side face of the second cell at the time 27.

As illustrated in FIG. 8A, the solution-searching system of the first embodiment using the non-uniform-amoeba SAT solving method provides a highly optimal solution requiring fewer cells for the stagnated detention state of the vehicle. On the contrary, the solution obtained by the earlier uniform-amoeba SAT solving method, as illustrated in FIG. 8B, provides a less optimal solution requiring more cells for the stagnated detention state of the vehicle, indicated by horizontal double-headed arrows. In FIG. 8A, the stagnant time for unloading in the fifth cell of the first vehicle v1 is quadruple operation-unit times, the specified stay time from the time 19 to the time 22, whereas in FIG. 8B, the stagnant time is sextuple operation-unit times from the time 17 to the time 22. Also, in the solution obtained by the earlier uniform-amoeba SAT solving method illustrated in FIG. 8B, the second vehicle v2, filled with the upward-sloping hatching, stays in 22th cell for quadruple operation-unit times, indicated by the horizontal double-headed arrow from the time 14 to the time 17. Furthermore, in the solution obtained by the earlier uniform-amoeba SAT solving method illustrated in FIG. 8B, the second vehicle v2 stays for double operation-unit times in the 18th cell from the time 18 to time 19, in the 14th cell from the time 20 to the time 21, and in the sixth cell from the time 23 to the time 24, respectively, indicated by the horizontal double-headed arrows.

In the solution-searching system of the first embodiment, the "highly optimal solution" denotes a scheduling solution that can finish conveying all vehicles in a shorter time, that is, a scheduling solution in which the number of the stagnated detention state in "i"-th cell represented by $x_{v,(i,i),p}=1$, is fewer. For example, in the earlier uniform-amoeba SAT solving method illustrated in FIG. 8B, the stagnated detention state in 22th cell is indicated by $x_{2,(22,22),p}=1$. In the case of the automated transportation system for vehicles in the distribution warehouse, the fluctuation probability of a pseudopod with the index (i,i) should be relatively larger than the fluctuation probability of the other amoeba pseudopod—with the index (i,j≠i)—so that the amoeba pseudopod $x_{v,(i,i),p},1$ representing the stagnated detention state of vehicle $x_{v,(i,i),p}=1$ is relatively elongated and difficult to take value "1". Here, the "amoeba pseudopod $x_{v,(i,i),p},1$" is an output voltage of a pseudopod unit, which corresponds to a radial circuit mimicking a structure of a single-celled amoeba with the multiple pseudopods, as illustrated in FIG. 11. By using a multi-pseudopod-amoeba computer, as illustrated in FIG. 11, highly optimal solutions—highly optimal schedules—can be selectively found with high-probability, by utilizing the concurrency of current dynamics flowing through the circuit and the stochastic behavior resulting from device fluctuations.

The SAT problem is used in many applications, including software/hardware verification and information security-related technologies, and is expected to increase in importance in the future, and the solution-searching system of the first embodiment, which uses the novel non-uniformamoeba SAT solving method, makes it possible to quickly and easily find the optimal solution for scheduling. Furthermore, according to the solution-searching system pertaining to the first embodiment, the solution can be obtained by the same method by preliminarily reading the propositional formula into the registers of the feedback control unit 13. For example, a problem, such as the Hamilton cycle problem and the knapsack problem, can be solved by converting the problem into the SAT problem, and the feedback control unit 13 may have those conversion functions. Thus, even if information of a search problem, which belongs to a category other than the SAT problem is entered, it is also possible to find a solution by converting the search problem into the SAT problem. As a scheme for converting the search problem, which belongs to a category other than the SAT problem, into the SAT problem, any earlier architecture can be employed.

The SAT problem will be implemented based on the triple rules of constraints defined by the amoeba algorithm:

INTRA,

INTER, and

CONTRA.

In accordance with the solution-searching system pertaining to the first embodiment, as described above, has the remarkable effectiveness that the optimal solution can be reached even if the CONTRA rule is deleted. That is, even if the CONTRA rule, which has the largest size and the highest assembling cost such as memory space and circuit area/inter-connections, is deleted, the optimal solution can be obtained by controlling the state values of the output-adjustment signals (bounce-back signals).

Here, the triple rules of constraints of the amoeba computer, the "INTRA rule", the "INTER rule" and the "CONTRA rule" will be described. For example, each tandem-connected set of a first set including the first data generation unit 11a and the first data conversion unit 12a, a second set including the second data generation unit 11b and the second data conversion unit 12b, . . . , and an eighth set including the eighth data generation unit 11h and the eighth data conversion unit 12h according to the solution-searching system pertaining to the first embodiment illustrated in FIG. 9 corresponds to one of the octuple pseudopod units, each provided with a series circuit of resistors and diodes as illustrated in FIG. 11. A case, in which the assignments of values to each of the quadruple variables $x_1$, $x_2$, $x_3$, and $x_4$ are prescribed respectively by outputs from each pair of double data conversion units, is assumed as illustrated in FIG. 9.

That is, according to the solution-searching system pertaining to the first embodiment, a single specific variable $x_1$ is prescribed by an output from a pair of the first data conversion unit 12a and the second data conversion unit 12b, arranged first and second from the top, as illustrated in FIG. 9. Further, an output from a pair of the third data conversion unit 12c and the fourth data conversion unit 12d, arranged third and fourth from the top, prescribes a single specific variable $x_2$. Further, an output from a pair of the fifth data conversion unit 12e and the sixth data conversion unit 12f, arranged fifth and sixth from the top, prescribes a single specific variable $x_3$. Further, an output from a pair of the seventh data conversion unit 12g and the eighth data conversion unit 12h, arranged seventh and eighth from the top, prescribes a single specific variable $x_4$.

In FIG. 9, the truth values—"0" or "1"—of the quadruple variables $x_1$, $x_2$, $x_3$, and $x_4$ are represented by the states of the first to eighth data generation units 11a to 11h corresponding to the octuple pseudopods of the single-celled amoeba and the first to eighth data conversion units $12a$ to $12h$ that receive the data transferred from the first to eighth data generation units $11a$ to $11h$. As can be seen from FIG. 9, in general, 2N pieces of data generation units and 2N pieces of data conversion units that receive the data transferred from the data generation units are required to represent the truth values of N pieces of variables. In FIG. 9, for each variable $x_i$ to $x_4$, the odd-numbered first data conversion unit $12a$, third data conversion unit $12c$, fifth data conversion unit $12e$, and seventh data conversion unit $12g$ represent that the value "0" is assigned to each variable $x_i$. Also, for the even-numbered second data conversion unit $12b$, fourth data conversion unit $12d$, sixth data conversion unit $12f$ and eighth data conversion unit $12h$, the value "1" is assigned to each variable $x_i$.

As illustrated in FIG. 9, if the assignment of the Boolean values (true-and-false values) for quadruple variables $x_1$, $x_2$, $x_3$, and $x_4$ is desired, by using the first to eighth data conversion units $12a$ to $12h$, for example, when only the second data conversion unit $12b$, the fourth data conversion unit $12d$, the sixth data conversion unit $12f$ and the eighth data conversion unit $12h$, ordered by even numbers, represent values greater than a predetermined threshold value— e.g. greater than 0—, while the first data conversion unit $12a$, the third data conversion unit $12c$, the fifth data conversion unit $12e$ and the seventh data conversion unit $12g$, ordered by odd numbers, represent values less than a predetermined threshold value—e.g. less than or equal to 0—, a Boolean-value assignment $(x_1, x_2, x_3, x_4)=(1,1,1,1)$ is established. When only the first data conversion unit $12a$, the fourth data conversion unit $12d$, the fifth data conversion unit $12e$ and the eighth data conversion unit $12h$ take values greater than the predetermined threshold values, the Boolean-value assignment is represented by (0101). Also, when only the second data conversion unit $12b$, the third data conversion unit $12c$, the sixth data conversion unit $12f$, and the seventh data conversion unit $12g$ take values larger than the predetermined threshold values, the Boolean-value assignment is represented by (1010).

In the case of using 2N pieces of data conversion units that represent the Boolean-value assignment of N pieces of variables as illustrated in FIG. 9, when focusing on a pair of data conversion units that represent the truth value of a specific single variable $x_i$, the "INTRA rule" is a rule of constraints that supplies an output-adjustment signals (bounce-back signals) to prevent both of the data conversion units from taking a value greater than the predetermined threshold values—inconsistency that the specific single variable $x_i$ has the value "0" and the value "1"—. Therefore, if one of the pair of data conversion units corresponding to the specific single variable $x_i$ takes a positive value, the supply of the output-adjustment signal to the corresponding data generation unit is controlled so that the other data conversion unit does not take a positive value. FIG. 15A illustrates the INTRA rules of the propositional formula illustrated in FIG. 5 with octuple conditional expressions. For example, if the data conversion unit corresponding to $x_1$ of "0" takes a value greater than the predetermined threshold values (EXCITED), the output-adjustment signal is supplied to the corresponding data generation unit to inhibit the data conversion unit corresponding to $x_1$ of "1" from taking a value greater than the predetermined threshold values. Similarly, if the data conversion unit corresponding to $x_1$ of "1" takes a value greater than the predetermined threshold values (EXCITED), the output-adjustment signal is supplied to the corresponding data generation unit to inhibit the data conversion unit corresponding to $x_1$ of "0" from taking a value greater than the predetermined threshold values.

The "INTER rule" is a rule of constraints that provides the output-adjustment signals (bounce-back signals) based on the given search-problem information. FIG. 15B illustrates the INTER rule of the propositional logic formula illustrated in FIG. 5 with thirteen conditional expressions. For example, focusing on F $11=(x_1$ or $\sim x_2)$ in FIG. 5, when the data conversion unit corresponding to $x_2$ of "1" takes a value larger than the predetermined threshold values (EXCITED), the output-adjustment signal is supplied to the corresponding data generation unit to inhibit the data conversion unit corresponding to $x_1$ of "0" from taking a value larger than the predetermined threshold values. Similarly, when the data conversion unit corresponding to $x_1$ of "0" takes a value greater than the predetermined threshold values (EXCITED), an output-adjustment signal is supplied to the corresponding data generation unit to inhibit the data conversion unit corresponding to $x_2$ of "1" from taking a value greater than the predetermined threshold values.

The "CONTRA rule" is a rule of constraints that provides an output-adjustment signal to eliminate logical inconsistencies that arise when attempting to control the supply of the output-adjustment signals (bounce-back signals) based on the INTER rule. In the case of the propositional formula illustrated in FIG. 5, the following Boolean expressions are defined:

$$F11=(x_1 \text{ or } \sim x_2), \text{ negates the state } x_1=\text{"0"} \text{ when } x_2=\text{"1"},$$

$$F13=(x_1 \text{ or } x_3), \text{ negates the state } x_1=\text{"0"} \text{ when } x_3=\text{"0", and}$$

$$F16=(\sim x_1 \text{ or } x_4), \text{ negates the state } x_1=\text{"1"} \text{ when } x_4=\text{"0".}$$

Therefore, for example, if $x_2$ is "1" and $x_4$ is "0", a logical contradiction arises in that $x_1$ is not allowed to be either "0" or "1". In order to prevent such a situation, the CONTRA rule is used to prevent the occurrence of $x_2$ being "1" and $x_4$ being "0" at the same time in such case. Similarly, if $x_3$ is "0" and $x_4$ is "0", a contradiction arises in that $x_1$ is not allowed to be either "0" or "1". To prevent such a situation, the CONTRA rule is used to prevent the occurrence of $x_3$ to be "0" and the state of $x_4$ to be "0" at the same time in such case.

Also, in the propositional formula illustrated in FIG. 5, Boolean expression $$F12=(\sim x_2 \text{ or } x_3 \text{ or } \sim x_4)$$

is defined to negate the state of $x_3=\text{"0"}$ when $x_2=\text{"1"}$ and $x_4=\text{"1"}$. Similarly, Boolean expression $$F14=(x_2 \text{ or } \sim x_3)$$

is defined to negate the state of $x_3=\text{"1"}$ when $x_2=\text{"0"}$. Therefore, if $x_2$ is "1", $x_4$ is "1" and $x_2$ is "0", then $x_3$ cannot be either "0" or "1", resulting in a logical contradiction. Similarly, in such a case, the CONTRA rule is used to prevent the simultaneous occurrence of $x_2$ being "1", $x_4$ being "1" and $x_2$ being "0". FIG. 15C illustrates the CONTRA rule of the propositional formula illustrated in FIG. 5 with nine conditional expressions. The CONTRA rule is a set of constraints obtained by listing combinations of states that prohibit each variable from taking either the "true" value or the "false" value in the INTER rule applied to the Boolean expression that controls the supply of the output-adjustment signals (bounce-back signals) based on the search-problem information. The solution-searching system of the first embodiment has the remarkable effectiveness of removing the CONTRA rule.

One of the features of the solution-searching system of the first embodiment is that a highly optimal solution can be obtained without application of the CONTRA rule. Handling of the output-adjustment signals differs between the earlier system that require application of the "CONTRA rule" and the solution-searching system of the first embodiment configured to eliminate the need for the "CONTRA rule". In the case of the earlier scheme requiring the application of the "CONTRA rule", with "i" as one of the indices i=1 to 4 of variable $x_i$ and "b" as binary data="0" or "1", the output-adjustment signal $L_{i,b}$ determined by the output adjustment unit 149 for each "i" and "b" are directly fed to the first data generation unit 11*a* to the eighth data generation unit 11*h* as illustrated in FIG. 17. Then, the first data generation unit 11*a* to the eighth data generation unit 11*h* deliver binary data $S_{i,b}$="0" or "1" determined from the output-adjustment signal $L_{i,b}$ and the fluctuation probability data $Z_{i,b}$.

In contrast, according to the solution-searching system pertaining to the first embodiment, for the suffix "i" of each variable $x_i$, as described above with reference to FIG. 9, double "provisional decisions" of the output-adjustment signal $L'_{i,0}$ and the output-adjustment signal $L'_{i,1}$ taken by the main output adjustment circuit 140 in the output adjustment unit 14 are fed to the first to fourth signal adjustment circuits 141 to 144, respectively. Then, if the output-adjustment signal $L'_{i,0}$ and the output-adjustment signal $L'_{i,1}$ are both "1" ($L'_{i,0}=L'_{i,1}$="1"), the first to fourth signal adjustment circuits 141 to 144 take "final decisions" as the output-adjustment signal $L_{i,0}=0$ and the output-adjustment signal $L_{i,1}=1$ with the bias probability $p_i$, and the output-adjustment signal $L_{i,0}=1$ and the output-adjustment signal $L_{i,1}=0$ with the bias probability 1-$p_i$, and otherwise ($L'_{i,0}=L'_{i,1}=0$ or $L'_{i,0}\neq L'_{i,1}$), then, the "final decisions" are made as the output-adjustment signal $L_{i,0}=L'_{i,0}$ and the output-adjustment signal $L_{i,1}=L'_{i,1}$. The bias probability $p_i$ is set independently for each suffix "i" (usually $p_i$=0.5). Then, the first data generation unit 11*a* to the eighth data generation unit 11*h* determine and transmit the binary data $S_{i,b}$="0" or "1" determined from the unit 14 to the first data generation unit 11-1, the fourth data generation unit 11-4 and the fifth data generation unit 11-5. In such case, the valid allocation number NUM=3. In such case, the setting values of the parameters for adjusting the fluctuations are changed to the first fluctuation adjustment parameter $\beta^-(3)$=0.25 and the second fluctuation adjustment parameter $\beta^+(3)$=0.05. Thus, the sixth data generation unit 11-6 has a 25% probability of generating the "0" when no output-adjustment signal is supplied and a 5% probability of generating the "1" when the output-adjustment signal is supplied. In other words, as the valid allocation number NUM increases, the probability for occurring "error"-like situation is controlled to decrease.

Figures 10A, 10B, 10C:
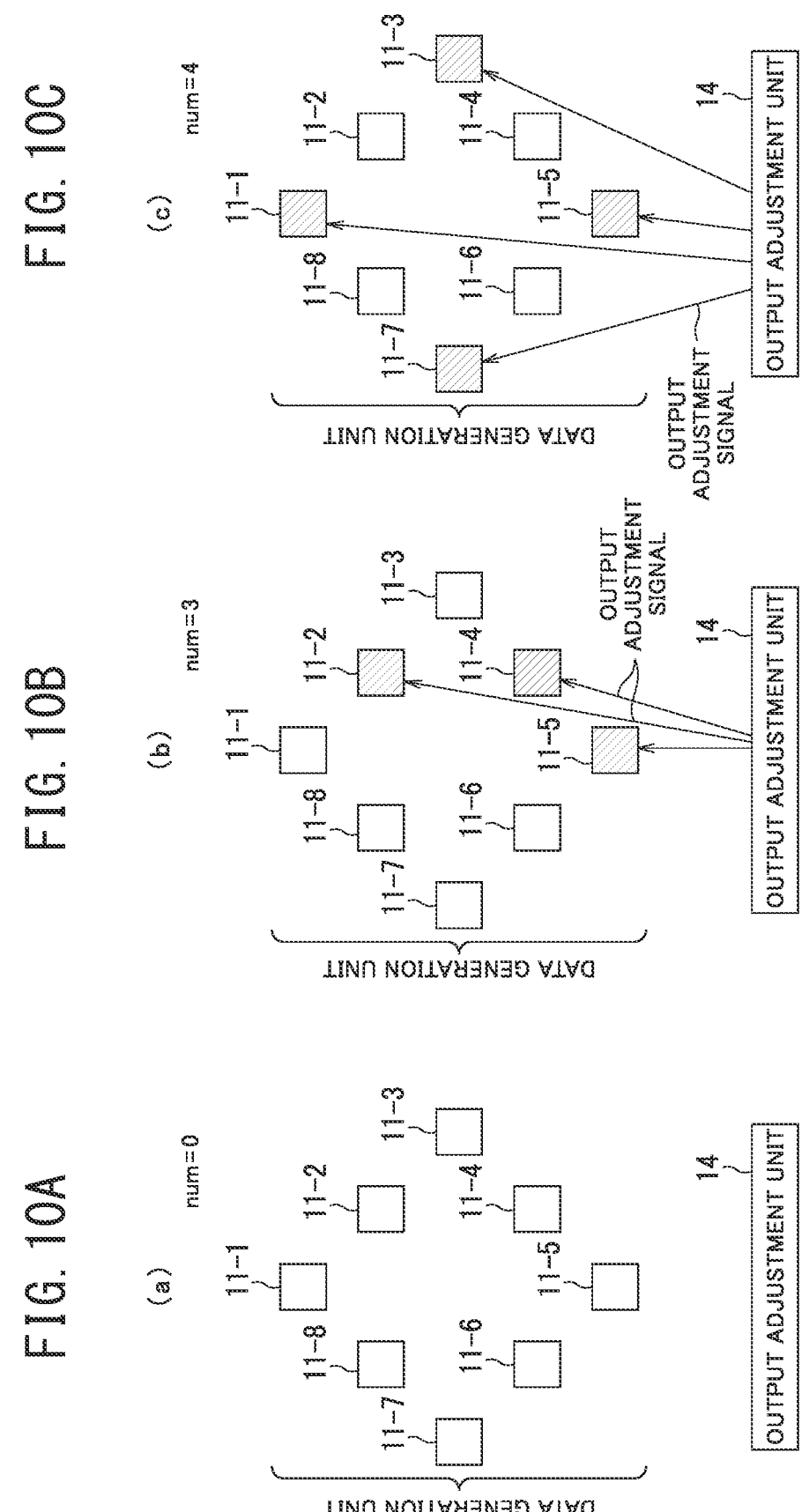
FIG. 10A is a diagram illustrating, a scheme for assigning double kinds of uniform fluctuations based on spatial correlations recited in JP6011928B.
FIG. 10B is another diagram illustrating, for comparison, another scheme for assigning double kinds of uniform fluctuations based on spatial correlations recited in JP6011928B.
FIG. 10C is a still another diagram illustrating, for comparison, a still another scheme for assigning double kinds of uniform fluctuations based on spatial correlations recited in JP6011928B.

In FIG. 10C, it is assumed that output-adjustment signals are supplied from the output adjustment unit 14 to the first data generation unit 11-1, the third data generation unit 11*c*, the fifth data generation unit 11-5, and the seventh data generation unit 11-7, and that the valid allocation number NUM=4. In this case, by changing the first fluctuation adjustment parameter $\beta^-(4)$=0.05 and the second fluctuation adjustment parameter $\beta^+(4)$=0.00, and thus, the sixth data generation unit 11-6 has a 5% probability where "0" is generated when no output-adjustment signal is supplied, and a 0% probability where "1" is generated when the output-adjustment signals are supplied, respectively. In other words, when the valid allocation number NUM is further increased, the occurrence-probabilities of the "error"-like situation is controlled to be further decreased.

The fluctuation adjustment unit in the invention recited in JP6011928B adjusts the double kinds of uniform fluctuations assigned to the data transmitted from each of the first data generation unit 11-1 to the eighth data generation unit 11-8 according to the number of the first data generation unit 11-1 to the eighth data generation unit 11-8 to which the output-adjustment signals are supplied. In concrete terms, the first data generation unit 11-1 to the eighth data generation unit 11-8 transmit the binary digital data of "0" or "1", but instead of transmitting "0" or "1" at random with equal probability, double kinds of the uniform fluctuations are set so that either "0" or "1" is transmitted more frequently.

Unlike the invention recited in JP6011928B, according to the solution-searching system pertaining to the first embodiment, the fluctuation probabilities are prescribed individually from outside the system for the fluctuation setting unit 16, and the occurrence probability of each variable can be changed. More specifically, the solution-searching system of the first embodiment adopts a non-uniform method in which the user can individually enter the occurrence probabilities of each variable in the logical equation used in the earlier uniform-amoeba SAT solution method, using the input unit 21 from outside the system. As illustrated in FIGS. 10A-10C, in the uniform-amoeba SAT solution method recited in JP6011928B, double uniform values, $\beta^-$(NUM) and $\beta^+$(NUM), were assigned to all the amoeba pseudopods to make the occurrence-frequencies of the state $x_i$="1" for each variable $x_i$ uniform. On the other hand, according to the solution-searching system pertaining to the first embodiment, the user can set the fluctuation probability $\varepsilon_{i,b}$ from outside the system so that the optimal solution can be obtained at high-speed and high-probability by increasing relatively or decreasing relatively the occurrence-frequencies of state $x_j$="1" for a set of specific variables $x_j$.

The electronic amoeba in the solution-searching system of the first embodiment has a structure that imitates the single-cell amoeba that is a living organism, for example, as illustrated in FIG. 11 previously described, the amoeba core 101 with octuple pseudopod units each provided with the series circuit of a resistor (a passive element) and a diode (a nonlinear element) and a bounce-back control logic circuit 201 that controls the operation of the amoeba core 101, namely the non-uniform SAT algorithm. The bounce-back control logic circuit 201 has the function of supplying bounce-back signals (output-adjustment signals) to the octuple pseudopod units of the amoeba core 101, and thus has the function of the output adjustment unit 14 in the configuration of the solution-searching system of the first embodiment illustrated in FIG. 2. However, contrasting FIG. 11 with FIG. 2, it can be seen that the bounce-back control logic circuit 201 also has the functions of the feedback control unit 13, the fluctuation setting unit 16 and the data storage unit 22 illustrated in FIG. 2. The pseudopod units of the amoeba core 101 corresponds to the pseudopods of the living organism of the single-celled amoeba.

The amoeba core 101 represents the extension and retraction of a plurality of pseudopods of the single-celled amoeba by varying the terminal voltages of the electronic circuit. The pseudopod units can adopt shapes of connected circuits to form a radial star-shaped network, for example, imitating the topology of the single-celled amoeba, as illustrated in FIG. 11. However, FIG. 11 is only an illustration, and the shape of the amoeba core 101 may be another topology which is electrically equivalent and is not limited to the illustrated radial star-shaped topology.

Under an environment, in which an undesirable state transition is inhibited by the bounce-back rule transmitted by the bounce-back control logic circuit 201, all the pseudopods extend and retract in parallel simultaneously to search for a solution while repeating trial and error. Then, the SAT solution is found when a stable state is reached in which all the pseudopods can maintain the extending states to which the inverted signals of the bounce-back signal $L_{1,0}$, $L_{1,1}$, ..., $L_{4,0}$, and $L_{4,1}$ from the bounce-back control logic circuit 201 are not applied. 2N number of the amoeba pseudopods are required to solve the SAT problem which has N number of variables. And, each of the terminals on the tip sides of the single-cell amoeba pseudopods connected to the bounce-back control logic circuit 201 is grounded through a parallel grounded-circuit, respectively. Here, the parallel grounded-circuit includes a first nMOS transistor—first switching element—, a second nMOS transistor—second switching element—and a capacitor—charge storage element—. Each of the parallel grounded-circuits determines the values of the output terminals $X_{1,0}$, $X_{1,1}$, ..., $X_{4,0}$, and $X_{4,1}$ of each of the pseudopod units, respectively. The first and second switching elements implement a discharge control circuit that controls the exhaust operations of the charges stored in the charge storage element—capacitor—. The first and second switching elements implementing the discharge control circuit of the parallel grounded-circuit are only examples. The discharge control circuits of the parallel grounded-circuits connected to the tips of the pseudopods of the single-cell amoeba can be replaced by various circuits such as logic gates, as long as each of the circuits has a control function to exhaust the charges stored in the charge storage element. And therefore, the discharge control circuits can be implemented by various equivalent circuits.

For example, an output terminal of the double-input NOR gate 301 connected between a pair of output terminals $X_{1,0}$ and $X_{1,1}$ of the pseudopod units, which are responsible for determining the value of variable $x_i$, is connected to a control electrode—gate electrode—of the second switching element implementing a parallel circuit (hereafter referred to as "parallel grounded-circuit") connected between the output terminal $X_{1,0}$ and the ground potential. And the output terminal of the double-input NOR gate is simultaneously connected to a control electrode of the second switching element implementing a parallel grounded-circuit of the output terminal $X_{1,1}$. Furthermore, as illustrated in FIG. 11, an inverted signal of the bounce-back signal (output-adjustment signal) $L_{i,0}$ is supplied to a control electrode of another first switching element implementing the parallel grounded-circuit at the output terminal $X_{1,0}$ of the pseudopod units via an inverter 410. Also, an inverted signal of the bounce-back signal $L_{1,1}$ is entered via an inverter 411 to a control electrode of another first switching element implementing the parallel grounded-circuit at the output terminal $X_{1,1}$ of the pseudopod units. Then, the output signals from the output terminals $X_{1,0}$ and $X_{1,1}$ of the pseudopod units are fed to the bounce-back control logic circuit 201, respectively.

Similarly, an output terminal of the double-input NOR gate 302 connected between the output terminals $X_{2,0}$ and $X_{2,1}$, which are responsible for determining the value of variable $x_2$, is connected both to a control electrode of the second switching element implementing a parallel grounded-circuit at the output terminal $X_{2,0}$ and to a control electrode of the second switching element implementing a parallel grounded-circuit at the output terminal $X_{2,1}$. Furthermore, via inverters 420 and 421, inverted signals of the bounce-back signal $L_{2,0}$ and $L_{2,1}$ are independently fed to control electrodes of the first switching elements of the parallel grounded-circuits of the respective output terminals $X_{2,0}$ and $X_{2,1}$ of the pseudopod units. Then, output signals from the output terminals $X_{2,0}$ and $X_{2,1}$ of the pseudopod units are fed to the bounce-back control logic circuit 201, respectively. Similarly, an output terminal of the double-input NOR gate between the output terminals $X_{3,0}$ and $X_{3,1}$, which are responsible for determining the value of variable $x_3$, is connected both to a control electrode of the second switching element of a parallel grounded-circuit at the output terminal $X_{3,0}$ and to a control electrode of the second switching element of a parallel grounded-circuit at the output terminal $X_{3,1}$. And, via inverters 430 and 431, inverted signals of the bounce-back signal $L_{3,0}$ and $L_{3,1}$ are supplied independently to control electrodes of the first switching elements of the respective parallel grounded-circuits at the output terminal $X_{3,0}$ and output terminal $X_{3,1}$. Then, the output signals from the output terminals $X_{3,0}$ and $X_{3,1}$ of the pseudopod units are fed to the bounce-back control logic circuit 201, respectively.

Similarly, an output terminal of the double-input NOR gate between the output terminals $X_{4,0}$ and $X_{4,1}$, which is responsible for determining the value of variable $x_4$, is connected both to a control electrode of the second switching element of a parallel grounded-circuit at the output terminal $X_{4,0}$ and to a control electrode of the second switching element of a parallel grounded-circuit at the output terminal $X_{4,1}$. And, via inverters 440 and 441, inverted signals of the bounce-back signal $L_{4,0}$ and $L_{4,1}$ are supplied independently to control electrodes of the first switching elements of the respective parallel grounded-circuits at the output terminal $X_{4,0}$ and $X_{4,1}$. Then, output signals from the output terminals $X_{4,0}$ and $X_{4,1}$ of the pseudopod units are fed to the bounce-back control logic circuit 201, respectively. Thus, the inverted signals of the independent bounce-back signal $L_{1,0}$, $L_{1,1}$, ..., $L_{4,0}$, and $L_{4,1}$ are independently applied to each of the control electrodes of the first switching elements of the parallel grounded-circuit of the octuple pseudopod units, thereby change the conduction states of the corresponding respective first switching elements. Then, just as a single-celled amoeba that survives in nature adapts to the environment and changes lengths of the pseudopods, the output signals from the output terminals $X_{1,0}$, $X_{1,1}$, ..., $X_{4,0}$, and $X_{4,1}$ of the pseudopod units, which implements the electronic circuit imitating the amoeba, are changed by bounce-back signal $L_{1,0}$, $L_{1,1}$, ..., $L_{4,0}$, and $L_{4,1}$ to solve the complex combinatorial optimization problem at high-speed using the algorithm of the biological computer.

A current I is supplied to the center (hub) of the star-shaped network, and the supplied current I is distributed to double or more pseudopod units. Although not illustrated, the bounce-back control logic circuit 201 has a memory (see the data storage unit 22 in FIG. 2) in which bounce-back rules are stored. The "bounce-back rule" may be a rule equivalent of the "assigned constraint" of the single-celled amoeba. Further, the bounce-back rule may also be incorporated in programs (see the program storage unit 25 in FIG. 2). Furthermore, logic functions stated in the solution-searching program of the first embodiment may be directly implemented by programmable logic devices (PLDs) such as field-programmable gate arrays (FPGAs) or circuits having logic gates.

Currents I are supplied to each of the pseudopod units, and the output signals from the output terminals $X_{1,0}$, $X_{1,1}$, ... $X_{4,0}$, and $X_{4,1}$ of each of the pseudopod units are given to a controller in the bounce-back control logic circuit

201. The controller generates feedback signals $L_{1,0}$, $L_{1,1}$, ..., $L_{4,0}$, and $L_{4,1}$ based on the bounce-back rule as the "bounce-back signals (output-adjustment signals)" for the output signals from the output terminals $X_{1,0}$, $X_{1,1}$, ..., $X_{4,0}$, and $X_{4,1}$ at the respective pseudopod units. Each of the inverted signals of the generated feedback signals $L_{1,0}$, $L_{1,1}$, ..., $L_{4,0}$, and $L_{4,1}$ is given to the control electrode of the first switching element of the parallel grounded-circuit in each of the pseudopod units. The feedback signals $L_{1,0}$, $L_{1,1}$, ..., $L_{4,0}$, and $L_{4,1}$ are prepared for updating the state variables. The operation of updating the state variables simulates the behaviors of the biological single-celled amoeba, which changes the pseudopod extension states, by changing the output signals from the output terminals $X_{1,0}$, $X_{1,1}$, ..., $X_{4,0}$, and $X_{4,1}$.

Thus, according to the solution-searching system pertaining to the first embodiment, the algorithm that can solve the complex combinatorial optimization problem, such as the TSP and the SAT problem, at high-speed can be provided, by using the electronic amoeba circuit that simulates the single-cell amoeba. And processing in the bounce-back control logic circuit 201 does not require processing equivalent to the CONTRA rule. On the other hand, according to the earlier amoeba core 100 illustrated in FIG. 18, each of the output terminals $X_{1,0}$, $X_{1,1}$, ..., $X_{4,0}$, and $X_{4,1}$ on the tip sides of the pseudopods of the single-cell amoeba connected to the bounce-back control logic circuit 200 is grounded individually by another parallel grounded-circuit implemented by a switching element (first switching element) and a capacitor (charge storage element), so the circuit topology is different from the parallel grounded-circuit employed by the solution-searching system of the first embodiment illustrated in FIG. 11. In accordance with the earlier amoeba core 100, the respective output values of the output terminals $X_{1,0}$, $X_{1,1}$, ..., $X_{4,0}$, and $X_{4,1}$ of the pseudopod units are determined by independently feeding the inverted signals of the independent bounce-back signals $L_{1,0}$, $L_{1,1}$, ..., $L_{4,0}$, and $L_{4,1}$ to the switching elements implementing the respective parallel grounded-circuits.

That is, according to the earlier amoeba core 100 illustrated in FIG. 18, the inverted signal of the bounce-back signal $L_{3,0}$ is independently fed to the control electrode of the switching element (first switching element) in the parallel grounded-circuit at the output terminal $X_{3,0}$ via an inverter 530. Similarly, via inverters 521 and 520, inverted signals of the bounce-back signals $L_{2,1}$ and $L_{2,0}$ are independently fed to the respective control electrodes of the switching elements in the parallel grounded-circuits at the output terminals $X_{2,1}$ and $X_{2,0}$ of the pseudopod units. Similarly, via the inverters 511 and 510, the inverted signals of the bounce-back signals $L_{1,1}$ and $L_{1,0}$ are fed to the respective control electrodes of the switching elements implementing the parallel grounded-circuits at the output terminals $X_{1,1}$ and $X_{1,0}$ in the pseudopod units. Similarly, via the inverters 541 and 540, the inverted signals of the bounce-back signals $L_{4,1}$ and $L_{4,0}$ are independently fed to the respective control electrodes of the switching elements in the parallel grounded-circuits at the output terminals $X_{4,1}$ and $X_{4,0}$. Then, via the inverter 531, the inverted signal of the bounce-back signal $L_{3,1}$ is independently fed to the control electrode of the switching element in the parallel grounded-circuit at the output terminal $X_{3,1}$.

Using "i" as any of suffix i=1 to 4 of variable $x_i$, according to the earlier amoeba core 100 illustrated in FIG. 18, the input terminal of the double-input NOR gate illustrated in FIG. 11 is not connected between the output terminals $X_{i,0}$ and $X_{i,1}$, which are responsible for determining the value of each variable $x_i$. That is, in the amoeba core 100 illustrated in FIG. 18, the respective values of the output signals from the output terminals $X_{1,0}$, $X_{1,1}$, ..., $X_{4,0}$, and $X_{4,1}$ are only fed back to the respective control electrodes of the switching elements (first switching elements) implementing the parallel grounded-circuits, and thus, the application of the CONTRA rule is required according to the earlier amoeba core 100. On the other hand, according to the solution-searching system pertaining to the first embodiment, as illustrated in FIG. 11, by using the double-input NOR gates 301, 302, 303 and 304 connected between the corresponding output terminals $X_{i,0}$ and $X_{i,1}$, respectively, the circuit can be forced into destabilized state, when the output signals from the output terminals $X_{i,0}$ and $X_{i,1}$ becomes $X_{i,0}=X_{i,1}=0$. And therefore, the need for applying the CONTRA rule is eliminated, because the stochastic transitions of the output signals transmitted from the output terminals $X_{i,0}$ and $X_{i,1}$ to either state of $X_{i,0}=1$ or $X_{i,1}=1$ can be promoted.

Here, an example of setting the occurrence-probabilities in optimization of the automatic transportation system will be given by taking the case described in FIGS. 7A, 7B, 8A and 8B. For example, by prescribing the fluctuation probability as $$\varepsilon_{v,(i,i),p,1} > \varepsilon_{v,(i,j),p,1},$$

a solution having a high "optimality" can be found with fewer detention states of the vehicle, such that the state $x_{v,(i,i),p}=1$ representing that vehicle v stays at time p in "i"-th cell is less likely to be realized than the state $x_{v,(i,j),p}=1$ representing that vehicle v moves from "i"-th cell to "j"-th cell at time p.

A solution—of trajectory or schedule—having a high "optimality" in the optimization of the automated transportation system of the first embodiment is a solution that can finish the transportation of all the vehicles in a shorter time, that is, a solution with fewer states $x_{v,(i,i),p}="1"$, that is the detention states, in the "i"-th cell as illustrated in FIG. 8A. Therefore, the fluctuation probability of the pseudopod with suffix (i, i) is made relatively larger than the fluctuation probability of the other pseudopod—having suffixes of (i,j≠i)—. Namely, the probabilities for taking the value "1" are forced to become small, by extending the amoeba pseudopod $X_{v,(i,i),p,1}$ relatively, which represents the vehicle-detention state $x_{v,(i,i),p}="1"$. By setting the fluctuation probability as $$\varepsilon_{v,(i,i),p,1} > \varepsilon_{v,(i,j),p,1} \text{ for } (i,j \neq i),$$

the solution—of trajectory or schedule—with the high "optimality" is selectively found with a high-probability.

In accordance with the solution-searching system pertaining to the first embodiment, a single instance is prepared with a variable $y_i$ called a "program variable" and the constraints in the implication form "If $y_i$=b and $x_j$=b', then $x_k$=b'"". If the value of the program variable $y_i$ is set to be fixed at b ("0" or "1") during the solution search, the antecedent of the constraint condition can be true only when the program variable $y_i$=b, enabling the constraint condition "if $x_j$=b', then $x_k$=b'"", and when the program variable $y_i$=1−b, the antecedent of the constraint condition is false, disabling the constraint condition where the antecedent is false. Thus, various search for solutions of miscellaneous different problem instances can be achieved, without replacing the hardware-resources, that is, on the same electronic circuit, because the constraint can be enabled or disabled, by simply changing the fixed value of the program variable $y_i$.

For example, when a solution is obtained using the propositional logic expression F2 illustrated in FIG. 12A, the quadruple solutions of the propositional logic expression F2 are $(x_1, x_2, x_3, y_4)=(1,1,1,1)$, $(1,1,1,0)$, $(1,1,0,0)$, and $(1,0,0,0)$. In such case, $y_4$ is called a "program variable" and the other triple variables $x_1$, $x_2$ and $x_3$ are called search variables. FIG. 12B illustrates that the propositional logic expression illustrated in FIG. 12A is expressed by the logical conjunction of the constraints in the implication form, and a part of the expression illustrated in FIG. 6B is fixed to the program variable $y_4=0$, thereby omitting the constraints in the latter part of second line and the constraints in the latter part of fifth line. Solving with $y_4=$"0" fixed results in triple solutions: $(x_1, x_2, x_3, y_4)=(1,1,1,0)$, $(1,1,0,0)$ and $(1,0,0,0)$. It can be seen from FIG. 12A, various solutions of miscellaneous different problem instances can be searched, simply by changing the fixed value of the program variable $y_4$.

FIG. 13 illustrates an example in which the method for representing various problem instances by changing the program variable $y_i$ as illustrated in FIG. 12A is applied to optimization of the automated transportation system, while FIGS. 14A-14C illustrates an example in which the program variables $y^F_{v,i,s}$, $y^T_{v,j,s}$ are fixed for comparison. The abscissa in FIG. 13 is the time axis with the operation-unit time as the cell size, as in FIG. 7B. In FIG. 13, an array of twenty-eight operation-unit times consisting of time 0 to time 27, each of which constitutes an operating unit time, is illustrated on the abscissa. The ordinate of FIG. 13 represents a coordinate system of the two-dimensional array of the unit transportation compartments (cells) in the distribution warehouse. In the present Specification, any movement from "i"-th cell to "j"-th cell in the two-dimensional array shall be denoted as "edge (i, j)". And edges (i, j) are converted into a one-dimensional array to construct the ordinate in FIG. 13. Arrows in each of cells, as illustrated in FIG. 7A, indicate the constraints on the directions of movements, but when the detention state occurs in a particular "i"-th cell, it is indicated as edge (i, i) and included in the left-most column along ordinate. In the optimal scheduling illustrated in FIG. 13, the cell indicated by the downward-sloping hatching represents the first vehicle v1. The movement of vehicle v from the "i"-th cell to the "j"-th cell is denoted as $x_{v,(i,j),p}=$"1", and staying in the "i"-th cell is denoted as $x_{v,(i,i),p}=$"1". As illustrated in FIG. 13, the first vehicle v1, illustrated by the downward-sloping hatching, moves from the fourth cell to the third cell at the time 2 and from the third cell to the second cell at the time 3. Although intermediate step is omitted, the first vehicle v1 indicated by the downward-sloping hatching stays in the 77th cell from the time 25 to the time 27.

The ordinate in FIG. 14A represents a coordinate system obtained by converting the two-dimensional array of the unit transportation compartments (cells) in the distribution warehouse into the one-dimensional array of the first cell to 80th cell. In FIG. 14A, the gray cell denotes the program variables $y^F_{V,i}$ at the initial position of the first vehicle v1 when the program variables are fixed. As illustrated in FIG. 14A, the first vehicle v1 is specified (programmed) to be located in the second cell at the time 1.

The abscissa of FIG. 14B is the time axis with the operation-unit time as the cell size, and an array of decuple operation-unit times consisting of operation-unit time 1 to operation-unit time 10 is indicated on the abscissa. The ordinate in FIG. 14B represents a coordinate system converted into a one-dimensional array from the first cell to the 80th cell in a two-dimensional array of the unit transportation compartments (cells) in the distribution warehouse. FIG. 14B illustrates that when the program variable $y^F_{v,i,s}$ is fixed, vehicle v is specified (programmed) to stay at the loading point, the fourth cell (F6), indicated by the downward-sloping hatching, for quadruple operation-unit times. The abscissa in FIG. 14C is also the time axis with the operation-unit time as the cell size, and an array of decuple operation-unit times consisting of the operation-unit time 1 to the operation-unit time 10 is illustrated on the abscissa. The ordinate in FIG. 14C represents a coordinate system converted into a one-dimensional array from the first cell to the 80th cell in a two-dimensional array of the unit transportation compartments (cells) in the distribution warehouse. FIG. 14C illustrates that when the program variable $y^T_{v,j,s}$ is fixed, vehicle v is specified (programmed) to stay at the unloading point, the 66th cell (T7), filled with the upward-sloping hatching, for quadruple operation-unit times.

As can be seen from the comparison between FIGS. 13 and 14, the number of vehicles, the initial point of vehicle, the loading point, the unloading point, the loading time, the unloading time, etc. can be set arbitrarily, by changing the values of the program variables, and furthermore, the optimal solution can be searched as to the instances pertaining to various different vehicle transfer requirements, according to the solution-searching system of the first embodiment.

The solution-searching system of the first embodiment can be constructed by a circuit that enables faster computation. When implemented by such circuit, the optimization algorithm configuration may be based on an application specific integrated circuit (ASIC), FPGA, or the like. The solution-searching system of the first embodiment may also be implemented by a solution-searching program, other than when physically constructed as a solution-searching system. In such cases, logical functions equivalent to hardware-resources can be established, by executing functions for the constituent elements of the data conversion units 12-1, 12-2, . . . , and 12-i, the feedback control unit 13, the output adjustment unit 14 and the fluctuation setting unit 16 described above, in the virtual data generation units 11-1, 11-2, . . . , and 11-i generated logically for each of steps in the program.

In addition, according to the solution-searching system pertaining to the first embodiment, the feedback control unit 13 may be a circuit implementing a part of the CPU. Or alternatively, instead of the device having such advanced information processing capability as the CPU, the feedback control unit 13 may be implemented by any simple means, such as a so-called switch, which has only a function of converting the input signals from the data conversion unit 12-1, 12-2, . . . , and 12-i based on rules, and supplying output signals to the data generation unit 11-1, 11-2, . . . , and 11-i.

Thus, according to the SAT algorithm of the solution-searching system of the first embodiment, the SAT problem can be solved without complicating the optimization algorithm, because the constraint conditions are expressed in implication form, and the solution can be reached even if the CONTRA rules, which are rule of constraints, are removed. In addition, by adopting a method in which the "occurrence probability" of each variable state can be individually entered, and by adopting a method in which various problem instances are solved by changing the "program variable", ASIC creation or FPGA synthesis for each instance can be eliminated. In other words, the solution-searching system of the first embodiment makes it possible to quickly and efficiently solve the SAT problem in the same electronic circuit for different instances, when various real scheduling problems are formulated as SAT problems.

Second Embodiment: Hybrid Solution-Searching System

In accordance with the solution-searching system, the solution-searching method, and the solution-searching program pertaining to the first embodiment described above, the "social scheduling optimization problem" for different instances can be solved quickly and efficiently, using the same electronic circuit, without complicating the algorithm, when the various real scheduling problems are formulated as the SAT problems. However, for example, if the number of variables and constraints such as INTRA-rules for finding the SAT solution becomes enormous, such as the transportation system optimization problem in the distribution warehouse, where several hundred vehicles loaded with packages need to make efficient deliveries in response transportation requirements that are updated from time to time, the amount of required hardware-resources increases accordingly, and the various costs for quickly and efficiently finding the optimal solution increase. Therefore, a computational method for quickly and efficiently find the optimal solution at low cost is required, by decreasing the number of variables and constraints used to obtain the SAT solution, and by decreasing the amount of employed hardware-resources.

In addition, terms, such as the "social scheduling optimization problem", the "combination optimization problem", the "SAT problem", the "amoeba computer" and the "amoeba SAT solution", defined at the beginning of the first embodiment are similarly applicable to a hybrid solution-searching system according to a second embodiment of the present invention. However, an aspect pertaining to the TSP shall be included in the hybrid solution-searching system of the second embodiment, although the TSP and the like are illustrated outside of the area enclosed by dashed line in FIG. 1, for excluding the TSP from the scope of the first embodiment, as explained at the beginning of the first embodiment.

For example, the solution method on the amoeba computer for solving the TSP is referred to as the "amoeba TSP solution method", and the hybrid solution-searching system according to the second embodiment will be described below. Then, in the hybrid solution-searching system according to the second embodiment, a hybrid optimal-solution computation-method will be described, which can quickly and efficiently find an optimal solution even in a case when the number of variables and constraints has been increased, and even in a case when the amount of hardware-resources to be used has been increased, in solving the "social scheduling optimization problem" using the solution-searching system of the first embodiment—the amoeba SAT solution method—, or using various solution methods distinguishable from the amoeba SAT solution method such as the amoeba TSP solution method. The computation method of the hybrid solution-searching system according to the second embodiment does not necessarily require the use of the amoeba SAT solution of the solution-searching system of the first embodiment. However, the hybrid mode combined with the amoeba SAT solution can achieve the effectiveness that the optimal solution can be obtained more quickly and more efficiently.

First, an outline of a system—optimal solution computation system—for executing the hybrid optimal-solution computation-method according to the second embodiment will be described. As illustrated in FIG. 19, the hybrid optimal-solution computation system of the second embodiment includes a CPU 1, an input unit 21, a data storage unit 22, a display unit 23, an output unit 24, and a program storage unit 25. The CPU 1 of the hybrid solution-searching system of the second embodiment corresponds to, for example, the area enclosed by dashed lines in FIG. 2 described in the solution-searching system pertaining to the first embodiment. However, the CPU 1 of the hybrid solution-searching system of the second embodiment is provided with double arithmetic-logic circuits that includes a first solution search arithmetic logic circuit 1A and a second solution search arithmetic logic circuit 1B, enabling operation in the hybrid mode. The first solution search arithmetic logic circuit 1A, for example, has a function of the solution-searching system of the first embodiment, which is capable of executing the amoeba SAT solution method.

Therefore, the first solution search arithmetic logic circuit 1A includes the first data generation unit 11-1, the second data generation unit 11b, . . . , the i-th data generation unit 11-i, the first data conversion unit 12-1, the second data conversion unit 12-2, . . . , the i-th data conversion unit 12-i, the feedback control unit 13, the output adjustment unit 14, and the fluctuation setting unit 16 in FIG. 2. The second solution search arithmetic logic circuit 1B is an arithmetic-logic circuit having an organization different from the solution-searching system of the first embodiment, and having a function, which cannot be achieved by the solution-searching system of the first embodiment. And, the second solution search arithmetic logic circuit 1B is an arithmetic-logic circuit that can perform solving methods distinguishable from the amoeba SAT solution, such as the CL-amoeba SAT solution and the amoeba TSP solution, which are excluded from FIG. 1. The "CL-amoeba SAT solution" denotes the "circuit-level amoeba SAT solution", which is excluded from the area defined by dashed line in FIG. 1. Furthermore, the second solution search arithmetic logic circuit 1B can also perform other solution schemes with different procedures and different effectiveness from the CL-amoeba SAT solution and the amoeba TSP solution.

In addition, the hybrid solution-searching system pertaining to the second embodiment illustrated in FIG. 19 can select either the amoeba SAT solution method or other solution methods, and can execute the hybrid mode, because the hybrid solution-searching system of the second embodiment encompasses the different logic circuits with different configurations and functions, namely, the first solution search arithmetic logic circuit 1A and the second solution search arithmetic-circuit 1B. And, when only the amoeba SAT solution method is used in an optimal solution computation method described below, only the first solution search arithmetic logic circuit 1A may be used, while the second solution search arithmetic-circuit 1B is omitted. When only solution methods distinguishable from the amoeba SAT solution method are used in the hybrid optimal-solution computation, a mode can be adopted in which only the second solution search arithmetic logic circuit 1B is used, while the first solution search arithmetic-circuit 1A is omitted. Furthermore, when both the amoeba SAT solution method and other solution methods are used in the hybrid optimal-solution computation, a couple of the first and second solution search arithmetic logic circuits 1A and 1B may be used simultaneously. Although omitted in FIG. 19, wider ranges of hybrid mode operations can be achieved, by adding other solution search arithmetic logic circuits, such as third and fourth solution search arithmetic logic circuits, in addition to the first solution search arithmetic logic circuit 1A and the second solution search arithmetic logic circuit 1B.

In FIG. 19, the information entered via the input unit 21 is stored in the data storage unit 22 via a bus. The information stored in the data storage unit 22 is provided to each of the first and second solution search arithmetic logic circuits 1A and 1B via the bus. The control unit 17 controls operations in the hybrid mode in each of the first and second solution search arithmetic logic circuits 1A and 1B in accordance with a solution-searching program stored in the program storage unit 25 along the time-sequence instructions transmitted from the sequence circuit. The program storage unit 25 stores a solution-searching program for the amoeba SAT solution to be executed by the first solution search arithmetic logic circuit 1A and an extra solution-searching program for different solutions distinguishable from the amoeba SAT solution to be executed by the second solution search arithmetic logic circuit 1, respectively. When an optimal solution is found in the first solution search arithmetic logic circuit 1A or the second solution search arithmetic logic circuit 1B, the optimal solution is displayed on the display unit 23 or the output unit 24.

As illustrated in FIG. 20, the control unit 17 encompasses a trajectory generator (generation part) instruction-control circuit 17G, a conflict tabulator (tabulation part) instruction-control circuit 17T, and a conflict resolver (resolution part) instruction-control circuit 17R. The trajectory generator instruction-control circuit 17G instructs and controls the operations of the first solution search arithmetic logic circuit 1A or the second solution search arithmetic logic circuit 1B so as to independently generate the most efficient initial trajectory—initial solution—for each target for which an optimal solution—trajectory—is sought for an optimization problem. In general, when referring to "route" optimization, for example, in the automated transportation system described in the first embodiment, collisions and congestion by the automated guided-vehicles are not taken into consideration. In other words, in the route optimization, each automated guided-vehicle searches only a movement route, or spatial information, that can independently minimize the cost. On the other hand, in the hybrid solution-searching system pertaining to the second embodiment, "trajectory" optimization refers to a work of finding the entire operation schedule, which can avoid collisions and congestion by the automated guided-vehicles, in the case of the automated transportation system.

More specifically, in the example of the automated transportation system, the trajectory optimization refers to the operation to find the passing time and staying time-span of the entire passing points, that is, the spatial and temporal information of all the automated guided-vehicles. Taking as an example the transportation-vehicle scheduling problem in the transportation system for the automated guided-vehicles in the distribution warehouse described in the first embodiment, the target for finding the optimal solution is each of the transportation vehicles. In addition, the trajectory generator instruction-control circuit 17G instructs and controls the operations of the first solution search arithmetic logic circuit 1A or the second solution search arithmetic logic circuit 1B so as to generate k kinds ("k" is a positive integer of two or more) of alternative trajectories—alternative solutions—of the initial trajectory for each target. Furthermore, the trajectory generator instruction-control circuit 17G updates the conflicting alternative trajectories by the amoeba SAT solution or other solution method using the first solution search arithmetic logic circuit 1A or the second solution search arithmetic logic circuit 1B based on information from the conflict tabulator instruction-control circuit 17T, to generate k kinds of updated alternative trajectories.

The conflict tabulator instruction-control circuit 17T instructs and controls the operations of the first solution search arithmetic logic circuit 1A or the second solution search arithmetic logic circuit 1B so as to list conflicts—competition states of events—between the initial trajectories generated by the trajectory generator instruction-control circuit 17G. The conflict tabulator instruction-control circuit 17T instructs and controls the operations of the first solution search arithmetic logic circuit 1A or the second solution search arithmetic logic circuit 1B so as to detect and tabulate the presence of conflicts for all pairs of alternative trajectories generated by the trajectory generator instruction-control circuit 17G. Furthermore, the conflict tabulator instruction-control circuit 17T instructs and controls the operations of the first solution search arithmetic logic circuit 1A or the second solution search arithmetic logic circuit 1B so as to provide information on the conflicts to the trajectory generator instruction-control circuit 17G. The conflict resolver instruction-control circuit 17R, based on the conflict information tabulated by the conflict tabulator instruction-control circuit 17T, instructs and controls the operations of the first solution search arithmetic logic circuit 1A or the second solution search arithmetic logic circuit 1B so as to search for a combination of alternative trajectories that can resolve the conflict. In addition, the conflict resolver instruction-control circuit 17R confirms whether or not a combination—optimal solution—of alternative trajectories that does not conflict exists, and when the optimal solution does not exist, the conflict resolver instruction-control circuit 17R instructs and controls the operations of the first solution search arithmetic logic circuit 1A or the second solution search arithmetic logic circuit 1B so as to search for a combination of the alternative trajectories that can resolve the conflict until the repeat number of search procedures reaches the upper limit.

Next, an optimal solution computation method in the hybrid mode using the optimal solution computation system pertaining to the second embodiment will be described. The optimal solution computation method according to the second embodiment is mainly executed by the first solution search arithmetic logic circuit 1A and the second solution search arithmetic logic circuit 1B by instruction-signals transmitted from the trajectory generator instruction-control circuit 17G, the conflict tabulator instruction-control circuit 17T and the conflict resolver instruction-control circuit 17R in the control unit 17. As illustrated in a flow chart of FIG. 21, first, in step S201, the trajectory generator instruction-control circuit 17G instructs and controls the operations of the first solution search arithmetic logic circuit 1A or the second solution search arithmetic logic circuit 1B so as to independently determine the most efficient initial trajectory for each target for which an optimal solution—trajectory—is to be found for the optimization problem. Subsequently, in step S202, the conflict tabulator instruction-control circuit 17T instructs and controls the operations of the first solution search arithmetic logic circuit 1A or the second solution search arithmetic logic circuit 1B so as to list the conflicts between the initial trajectories determined in step S201.

As an example, taking the transportation-vehicle scheduling problem described in the first embodiment, which was the problem of the transportation system for scheduling the automated guided-vehicles in the distribution warehouse, the conflict is, for example, a state in which two or more different vehicles exist on the same cell at the same time.

Then, in step S203, the trajectory generator instruction-control circuit 17G instructs and controls the operations of the first solution search arithmetic logic circuit 1A or the second solution search arithmetic logic circuit 1B so as to generate a total of k kinds of alternatives—alternative trajectories—that can avoid conflict (k="0" to "K–1"), including the initial trajectories determined in step S201, for each target based on the conflict information listed in step S202. The amoeba core 101 illustrated in FIG. 11 used in the description of the solution-searching system of the first embodiment corresponds to the organization of the single-cell amoeba.

In the structure illustrated in FIG. 11, the fluctuation setting unit 16 of FIG. 2 is incorporated in the bounce-back control logic circuit 201, while the set of the amoeba core 101 and the fluctuation setting unit 16 responding to the amoeba core 101 is an arithmetic logic circuit as a solution-search arithmetic-logic circuit-core implementing the CPU 1 of FIG. 19. That is, the set of the amoeba core 101 and the fluctuation setting unit 16 responding to the amoeba core 101 implement the solution-search arithmetic-logic circuit-core, and a multicellular amoeba assembled with multiple solution-search arithmetic-logic circuit-cores can implement the CPU 1 in FIG. 19. The structure of the multicellular amoeba corresponds to an aggregate of multiple solution-search arithmetic-logic circuit-cores that execute parallel computations.

For the generation of k-kinds of alternatives—alternative trajectories—in step S203, it is preferable to process using k pieces of the solution-search logic-circuits (hereafter referred to as "amoeba SAT-G") explained by the first embodiment, which is embedded in the first solution search arithmetic logic circuit 1A. That is, it is preferable for the arithmetic processing in step S203 to perform an operation of a "multicellular amoeba" using the multiple amoebas (amoeba SAT-G) embedded in the first solution search arithmetic logic circuit 1A to generate k-kinds of the alternatives—alternative trajectories—in a short time. In step S203, when the first solution search arithmetic logic circuit 1A having the configuration of the multicellular amoeba implemented by the amoeba SAT-G is generating k-kinds of the alternatives—alternative trajectories—, the first solution search arithmetic logic circuit 1A functions as a "trajectory generation solution search arithmetic logic circuit". Also, in step S204, the conflict tabulator instruction-control circuit 17T instructs and controls the operations of the first solution search arithmetic logic circuit 1A or the second solution search arithmetic logic circuit 1B so as to detect the presence of conflicts for all pairs of the alternative trajectories generated in step S203 and to tabulate the conflicts. The tabulated conflict information includes information about when and where each trajectory of the target vehicles conflicts with the trajectory of other target vehicles.

Then, the conflict resolver instruction-control circuit 17R instructs and controls the operations of the first solution search arithmetic logic circuit 1A or the second solution search arithmetic logic circuit 1B so as to search for a combination of alternative trajectories that can resolve the conflict in step S205 based on the conflict information tabulated in step S204. In accordance with the hybrid optimal-solution computation-method of the second embodiment, the amoeba SAT solution method can be used by instructing and controlling the first solution search arithmetic logic circuit 1A of FIG. 19 in step S205 in which the conflict resolver instruction-control circuit 17R searches for the combination of the alternative trajectories that can resolve conflicts. According to the hybrid solution-searching system of the second embodiment, the arithmetic logic to search for the combination of alternative trajectories that can resolve conflict by using the amoeba SAT solution method is called an "amoeba SAT-R". In step S205, when the first solution search arithmetic logic circuit 1A is searching for the combination of alternative trajectories that can resolve conflict, the first solution search arithmetic logic circuit 1A functions as a "conflict-resolution solution-search arithmetic-logic circuit". The amoeba SAT-R may be a single-celled amoeba different from the amoeba SAT-G which is built by the multicellular amoeba. Or alternatively, the amoeba SAT-R may be implemented by a part of the multicellular amoeba, such that the remainder of the part used as the amoeba SAT-G can be served as the amoeba SAT-R.

Furthermore, a portion of the multicellular amoeba implementing the amoeba SAT-G may be used as the amoeba SAT-R on a time-sharing basis, if a condition that the different timings for the amoeba SAT-G and SAT-R, each do not executes the arithmetic processing simultaneously, can be guaranteed. More specifically, the first solution search arithmetic logic circuit 1A can operate logically as either of an amoeba SAT-G serving as the trajectory generation arithmetic logic circuit, or of an amoeba SAT-R serving as the conflict resolution arithmetic logic circuit. In accordance with the amoeba SAT solution, the combinations of alternative trajectories can be searched, reflecting the objective functions and various constraints, by increasing the probabilities for extending the specific pseudopods, which can decrease the values of the objective functions. Therefore, the effectiveness of searching quickly and efficiently the optimal solution—the combination of alternative trajectories that can resolve the conflict—can be achieved, without complicating the algorithm, namely on the same electronic circuit for different instances. However, in accordance with the hybrid optimal-solution computation-method of the second embodiment, it is not essential to use the solution method of the amoeba SAT-R in step S205. That is, by instructing and controlling the operations of the second solution search arithmetic logic circuit 1i, the conflict resolver instruction-control circuit 17R can also search for the combination of the alternative trajectories that can resolve the conflict, using a different solution method distinguishable from the amoeba SAT solution method.

Also, in step S206, the conflict resolver instruction-control circuit 17R instructs and controls the operations of the first solution search arithmetic logic circuit 1A or the second solution search arithmetic logic circuit 1B so as to confirm whether or not the combination of alternative trajectories—optimal solution—, in which no conflict occurs, is existing. When the optimal solution exists, the control unit 17, in step S207, for example, displays the optimal solution on the display unit 23 of FIG. 19, or delivers the optimal solution from the output unit 24 of FIG. 19, and then, the procedure of the flowchart illustrated in FIG. 21 is ended. On the other hand, when the optimal solution does not exist, the conflict resolver instruction-control circuit 17R instructs and controls the operations of the first solution search arithmetic logic circuit 1A or the second solution search arithmetic logic circuit 1B so as to repeat a loop from step S206 to step S208, and further, from step S208 to step S205, until the repeat number of searches through the loop reaches to an upper limit value $N_{max}$, based on the conflict information tabulated in step S204.

Then, the search procedures for finding the combination of alternative trajectories—optimal solution—that can resolve the conflict is instructed and controlled to be continued. When the repeat number of search procedures reaches the upper limit value $N_{max}$ without finding the optimal solution, the conflict resolver instruction-control circuit 17R transmits instructions to execute the logic operations to the first solution search arithmetic logic circuit 1A and the second solution search arithmetic logic circuit 1B so as to generate new alternative trajectories based on the conflict information tabulated in step S204 to the trajectory generator instruction-control circuit 17G. The "conflict information" is information such as when and where the trajectory of each target conflicts with the trajectories of other target vehicles.

More specifically, the trajectory generator instruction-control circuit 17G updates the conflicting alternative trajectories based on the conflict information tabulated in step S204, and generates k-kinds of the alternative trajectories by instructing and controlling the operations of the first solution search arithmetic logic circuit 1A or the second solution search arithmetic logic circuit 1B so as to repeat the loop from step S206 to step S208, and further, from step S208 and to step S205. Here, in the hybrid-type optimal solution computation method according to the second embodiment, the trajectory generator instruction-control circuit 17G transmits instructions to generate k-kinds of the alternative trajectories to the first solution search arithmetic logic circuit 1A of FIG. 19 to execute the arithmetic process using the amoeba SAT solution method employing as the multicellular amoeba. The amoeba SAT solution method can execute search procedures for finding the combinations of alternative trajectories that reflect the objective function and various constraints, by increasing the extension probability of the pseudopod that can decrease the value of the objective function. Therefore, an effectiveness that k-kinds of the alternative trajectories can be generated quickly and efficiently for different instances on the same electronic circuit can be achieved, without complicating the algorithm by utilizing multiple amoebas (multicellular amoeba) like parallel computers.

For example, let's consider the transportation-vehicle scheduling problem in the transportation system for the automated guided-vehicles in the distribution warehouse, which has been described in the first embodiment as an example. An alternative trajectory capable of avoiding all conflicts as a solution for parallel computations can be found, by applying the amoeba SAT solution method to the alternate trajectory of each vehicle and fixing the bounce-back signals to on-states, the bounce-back signals prohibit the existence of multiple different vehicles on the same cell at the same time, based on the tabulated conflict information. However, in the hybrid optimal-solution computation-method of the second embodiment, use of the amoeba SAT solution method in steps S205 to S206 is not essential. In other words, the trajectory generator instruction-control circuit 17G can also instruct and control the operation of the second solution search arithmetic logic circuit 1B so as to generate k-kinds of the alternative trajectories using different parallel computing methods distinguishable from the amoeba SAT solution method.

Then, after the k-kinds of alternative trajectories are generated by the trajectory generator instruction-control circuit 17G, in step S204, the conflict tabulator instruction-control circuit 17T instructs and controls the operations of the first solution search arithmetic logic circuit 1A or the second solution search arithmetic logic circuit 1B so as to detect the presence of conflict for all pairs of alternative trajectories generated in step S203 and tabulate the conflicts. That is, in accordance with the hybrid optimal-solution computation-method of the second embodiment, based on the conflict information tabulated in step S204, the search procedures for finding whether or not a combination of alternative trajectories—optimal solution—, in which no conflict occurs, is executed up to $N_{max}$ times. If no optimal solution is found even after exceeding the maximum $N_{max}$ times, the process of generating a new alternative trajectory and searching is repeated again via the loop from step S204 to step S205, and further from step S205 to step S204 through steps S206, S208 and S209.

The amoeba SAT solution method or any other solution method distinguishable from the amoeba SAT solution method may be used for the steps S203, S205 to S206, and S209 in the hybrid optimal-solution computation according to the second embodiment. In any way, the operations in the hybrid mode may be summarized as four modes (a), (b), (c), and (d) as illustrated in FIG. 22.

In the first mode indicated by (a) at the top of the leftmost column, the conflict resolver instruction-control circuit 17R controls the operations of the first solution search arithmetic logic circuit in step S205, as indicated by an open circle at the top in the second column from the left, to search for a combination of the alternative trajectories—optimal solution—that can resolve the conflict. In FIG. 22, a system of searching for the combination of the alternative trajectories that can resolve conflict by using the amoeba SAT solution method is presented "Amoeba SAT-R" in the second column from the left. In addition, the trajectory generator instruction-control circuit 17G controls the operations of the first solution search arithmetic logic circuit in steps S203 and S209, as indicated by open circles at the top in the second column from the right, to generate k-kinds of the alternative trajectories. In FIG. 22, the system for finding k-kinds of the alternative trajectories by using the amoeba SAT solution method is presented as "Amoeba SAT-G" in the second column from the right. The first mode in FIG. 22 is an architecture using the multicellular amoeba configuration having the amoeba SAT-R presented in the second row from the left and the amoeba SAT-G presented in the second row from the right.

Although the amoeba core 101 illustrated in FIG. 11 corresponds to the structure of the single-celled amoeba, in order to search for k-kinds of the alternative trajectories, a configuration of the multicellular amoeba which has k-kinds of amoeba cores and furthermore adds a dedicated amoeba core for the amoeba SAT-R may be adopted. In the second mode indicated by (b) in the second row from the top of the leftmost column, the conflict resolver instruction-control circuit 17R controls the operations of the first solution search arithmetic logic circuit implemented by the amoeba SAT-R in steps S205 to S206, as indicated by open circles at the second row from the top in the leftmost column, to search for a combination of the alternative trajectories that can resolve the conflict. In addition, the trajectory generator instruction-control circuit 17G controls the operations of the second solution search arithmetic logic circuit, which is not an amoeba computer, in steps S203 and S209, as indicated by open circles at the top of the rightmost column, to generate k-kinds of the alternative trajectories. The second mode in FIG. 22 uses the configuration of the amoeba SAT-R in steps S205 to S206, but does not use the configuration of the amoeba computer described in the first embodiment in steps S203 and S209.

In the third mode indicated by (c) in the third column from the top of the leftmost column, the conflict resolver instruction-control circuit 17R controls the operations of the second solution search arithmetic logic circuit in steps S205 to S206, as indicated by open circles at the top of the third column from the left, to search for the combination of the alternative trajectories that can resolve the conflict. In addition, the trajectory generator instruction-control circuit 17G controls the operations of the first solution search arithmetic logic circuit implementing the amoeba SAT-G in steps S203 and S209, as indicated by open circles at the second row from the top in the second column from the right, to generate the k-kinds of the alternative trajectories. In the third mode of FIG. 22, the configuration of the amoeba computer described in the first embodiment is not used in steps S205 to S206, but the configuration of the amoeba computer of the amoeba SAT-G is used in steps S203 and S209. In the fourth mode indicated by (d) at the bottom of the leftmost column, the conflict resolver instruction-control circuit 17R controls the operations of the second solution search arithmetic logic circuit in steps S205 to S206, as indicated by open circles at the second row from the top in the third column from the left, to search for the combination of the alternative trajectories that can resolve the conflict. In addition, the trajectory generator instruction-control circuit 17G controls the operations of the second solution search arithmetic logic circuit in steps S203 and S209, as indicated by open circles at the bottom in the rightmost column, to generate the k-kinds of the alternative trajectories. The fourth mode in FIG. 22 is an architecture that does not use the scheme of the amoeba computer described in the first embodiment both in steps S205 to S206 and in steps S203 and S209.

Here, an architecture in which the conflict tabulator instruction-control circuit 17T detects the conflict and a mode with such architecture are defined as an "amoeba SAT-T". The amoeba SAT-T may be also implemented by the single-cell amoeba described in the solution-searching system pertaining to the first embodiment, and the amoeba SAT-T can be used as a conflict-tabulator solution-search arithmetic-logic circuit. The amoeba SAT-T may be a single-celled amoeba different from the amoeba SAT-G composed of the multicellular amoeba. Or alternatively, the amoeba SAT-T may be a part of the multicellular amoeba used as the amoeba SAT-G, namely a remainder portion used as the amoeba SAT-R shall be used as the amoeba SAT-T. Furthermore, a portion of the multicellular amoeba implementing the amoeba SAT-G may be used as a site for the amoeba SAT-R and the amoeba SAT-T on a time-sharing scheme, provided that different operation-timings of the amoeba SAT-G, SAT-R and SAT-T can be guaranteed, such that amoeba SAT-G, SAT-R and SAT-T do not execute simultaneously the arithmetic operations.

More specifically, in a logical basis, the first solution search arithmetic logic-circuit 1A can behave as the amoeba SAT-G implementing the trajectory generation arithmetic logic circuit, as a conflict resolution arithmetic logic circuit implementing the amoeba SAT-R, or as a conflict tabulation arithmetic logic circuit implementing the amoeba SAT-T. Using the definition of the amoeba SAT, a mode in which the trajectory generator instruction-control circuit 17G uses the amoeba SAT-G mode and the conflict resolver instruction-control circuit 17R uses the amoeba SAT-R mode in the hybrid optimal-solution computation according to the second embodiment can be referred to as an "amoeba SAT-GTR mode". For the sake of convenience, the following description will focus on the amoeba SAT-GTR mode pertaining to the first mode recited in FIG. 22, but as can be seen from FIG. 22, the hybrid mode of the second embodiment is not limited to the amoeba SAT-GTR mode of the first mode, and the second to fourth modes may be used.

In a process-sequence of the hybrid-mode optimal-solution computation according to the second embodiment illustrated in FIG. 21, based on a computer-software program stored in the program storage unit 25 illustrated in FIG. 19, the trajectory generator instruction-control circuit 17G, the conflict tabulator instruction-control circuit 17T, and the conflict resolver instruction-control circuit 17R in the control unit 17 illustrated in FIGS. 19 and 20 transmit the necessary instruction-signals, respectively. The program related to the hybrid optimal-solution computation-method according to the second embodiment can also be stored in a computer-readable recording-medium and read into the program storage unit 25 illustrated in FIG. 19. The computer-readable recording-medium refers to, for example, a medium capable of recording a program of the computer, such as an external memory device, a semiconductor memory, a magnetic disk, an optical disk, a MO disk, a magnetic tape.

Multistory Warehouse

When the single-cell amoeba described in the solution-searching system pertaining to the first embodiment is intended to deal with the scheduling of a large-sized transportation system, the number of constraints, such as variables and INTRA rules, may become enormous and unmanageable. Because a multistory warehouse problem involves a huge number of cells in a three-dimensional arrangement, the number of the variables and constraints may be huge. In the multistory warehouse problem, a work of carrying a package into a particular warehouse in a specific set of plural warehouses among a huge number of cells, or carrying a package out from a particular warehouse in a specific set of plural warehouses is executed in response to delivery requests, which are constantly updated, by a plurality of vehicles v, which are supposed to move on a common rail. As an illustrative example of applying the hybrid optimal-solution computation-method according to the second embodiment to a social scheduling optimization problem, the multistory warehouse problem will be described first. Then, by applying the hybrid optimal-solution computation-method according to the second embodiment, even in a situation where the number of the variables and constraints for finding the optimal solution is enormous, the increase in the amount of employed hardware-resources can be prevented, and the optimal solution can be found quickly and efficiently. A "conflict in the multistory warehouse problem" refers to a situation in which different vehicles v will exist in the same cell (location) at the same time.

While there are various types, shapes and sizes of multistory warehouses, the following multistory warehouse problem assumes a four-story warehouse including a set of 422 pieces of cells arranged in three dimensions as an example. Namely, the four-story warehouse is assumed to encompasses a section of a four-story structure having a cuboid shape and a section of single-story vehicle-allocation preparation-zone. Here, the single-story vehicle-allocation preparation-zone is connected at a front face to a first floor in the four-story structure, the front face is one of the sextuple faces of the rectangular parallelepiped. Then, in the following multistory warehouse problem, a set of first cell to 30th cell is arranged in the vehicle-allocation preparation-zone of the vehicles in the first floor. Along a left-side face of the rectangular parallelepiped defined in a direction of looking at the front face, a first vertical-movement zone is provided. a set of 31th cell to 47th cell is arranged in the first vertical-movement zone, from front face to back face on a left edge of the first floor of the multistory warehouse body.

On the first floor of the multistory warehouse, a second vertical-movement zone extends from the front face to the back face in parallel with the first vertical-movement zone on a left side of the central line. On the first floor of the multistory warehouse, a third vertical-movement zone extends from the front face to the back face in parallel with the second vertical-movement zone on a right side of the central line, and along a right-side face of the rectangular parallelepiped defined in the direction of looking at the front face, a fourth vertical-movement zone extends from the front face to the back face in parallel with the third vertical-movement zone on a right edge of the first floor of the multistory warehouse body. The first to fourth vertical-movement zones are approximately equally spaced. A set of 99th cell to 115th cell is arranged in the second vertical-movement zone, a set of 167th cell to 183th cell is arranged in the third vertical-movement zone, and a set of 235th cell to 251th cell is arranged in the fourth vertical-movement zone. A set of 303th cell to 307th cell and 323th cell to 327th cell is arranged in a parallel movement zone between the first and the second vertical-movement zones. A set of 343th cell to 347th cell and 364th cell to 367th cell is arranged in a parallel movement zone between the second the third vertical-movement zones. A set of 383th cell to 387th cell and 403th cell to 407th cell is arranged in a parallel movement zone between the third and the fourth vertical-movement zones.

On a left edge of a second floor in the multistory warehouse, a fifth vertical-movement zone in which a set of 48th cell to 64th cell is disposed is arranged so as to correspond to a horizontal alignment of the first vertical-movement zone. On the second floor in the multistory warehouse, a sixth vertical-movement zone is arranged in parallel with the fifth vertical-movement zone on a left side of the central line so as to correspond to a horizontal alignment of the second vertical-movement zone. On the second floor in the multi-story warehouse, a seventh vertical-movement zone is arranged in parallel with the sixth vertical-movement zone on a right side of the central line so as to correspond to a horizontal alignment of the third vertical-movement zone. On a right edge of the second floor in the multistory warehouse, in parallel with the seventh vertical-movement zone, an eighth vertical-movement zone extends so as to correspond to a horizontal alignment of the fourth vertical-movement zone. A set of 116th cell to 132th cell is arranged in the sixth vertical-movement zone, a set of 184th cell to 200th cell is arranged in the seventh vertical-movement zone, and a set of 252th cell to 268th cell is arranged in the eighth vertical-movement zone. A set of 208th cell to 312th cell and 328th cell to 332th cell is arranged in a parallel movement zone between the fifth and the sixth vertical-movement zones. A set of 348th cell to 352th cell and 368th cell to 372th cell is arranged in a parallel movement zone between the sixth and the seventh vertical-movement zones. A set of 388th cell to 392th cell and 408th cell to 412th cell is arranged in a parallel movement zone between the seventh and the eighth vertical-movement zones.

On a left edge of a third floor in the multistory warehouse, a ninth vertical-movement zone where a set of 65th cell to 81th cell is disposed is arranged so as to correspond to a horizontal alignment of the fifth vertical-movement zone. On the third floor, in parallel with the ninth vertical-movement zone, a tenth vertical-movement zone is arranged on a left side of the central line so as to correspond to a horizontal alignment of the sixth vertical-movement zone. On the third floor, an eleventh vertical-movement zone is arranged on a right side of the central line, in parallel with the tenth vertical-movement zone, so as to correspond to a horizontal alignment of the seventh vertical-movement zone. On a right edge of the third floor, in parallel with the eleventh vertical-movement zone, a twelfth vertical-movement zone extends so as to correspond to a horizontal alignment of the eighth vertical-movement zone. A set of 133th cell to 149th cell is arranged in the tenth vertical-movement zone, 201th cell to 217th cell is arranged in the eleventh vertical-movement zone, and a set of 269th cell to 285th cell is arranged in the twelfth vertical-movement zone. A set of 313th cell to 317th cell and 333th cell to 337th cell is arranged in a parallel movement zone between the ninth and the tenth vertical-movement zones. A set of 353th cell to 357th cell and 373th cell to 377th cell is arranged in a parallel movement zone between the tenth and the eleventh vertical-movement zones. 393th cell to 397th cell and 413th cell to 417th cell is arranged in a parallel movement zone between the eleventh and the twelfth vertical zones.

On a left edge of a fourth floor, which is a top floor of the multi-story warehouse, a thirteenth vertical-movement zone in which a set of 82th cell to 98th cell is arranged so as to correspond to the ninth vertical-movement zone. On the fourth floor, a fourteenth vertical-movement zone is arranged in parallel with the thirteenth vertical-movement zone on a left side of the central line so as to correspond to the tenth vertical-movement zone. On the fourth floor, a fifteenth vertical-movement zone is arranged in parallel with the fourteenth vertical-movement zone on a right side of the central line so as to correspond to the eleventh vertical-movement zone. On a right edge of the fourth floor, in parallel with the fifteenth vertical-movement zone, a sixteenth vertical-movement zone extends so as to correspond to the twelfth vertical-movement zone. A set of 150th cell to 166th cell is arranged in the fourteenth vertical-movement zone, a set of 218th cell to 234th cell is arranged in the fifteenth vertical-movement zone, and a set of 286th cell to 302th cell is arranged in the sixth vertical-movement zone. A set of 318th cell to 322th cell and 338th cell to 342th cell is arranged in a parallel movement zone between the thirteenth vertical-movement zone and the fourteenth vertical-movement zone. A set of 358th cell to 362th cell and 378th cell to 382th cell is arranged in a parallel movement zone between the fourteenth vertical-movement zone and the fifteenth vertical-movement zone. A set of 398th cell to 402th cell and 418th cell to 422th cell is arranged in a parallel movement zone between the fifteenth vertical zone and the sixteenth vertical zone.

Based on the cell layout inside the multistory warehouse as described above, in the multistory warehouse problem, first, in step S201 of the flowchart illustrated in FIG. 21, the "initial trajectory" is determined so that each vehicle illustrated in FIG. 23 takes the shortest route independently. In FIG. 23, the ordinate illustrates the distinction (number) of vehicle v=1 to 15, and the abscissa is the time axis representing times of sixty-four steps illustrating the movement—trajectory—position that changes in time series for each vehicle v. At the left end of the time axis is time (step)=0 and at the right end is time (step)=64. As illustrated in FIG. 23, each cell is arranged according to an initial condition required for the analysis that at the time 0, vehicle 1 is in the first cell of vehicle-allocation preparation-zone of the vehicle, vehicle 2 is in the second cell of the vehicle-allocation preparation-zone, and vehicle 3 is in the third cell of the vehicle-allocation preparation-zone. Also, the cells are arranged according to the initial conditions of the analysis that vehicle 4 is in the 10th cell of the vehicle-allocation preparation-zone, vehicle 5 is in the 11th cell of the vehicle-allocation preparation-zone, vehicle 6 is in the 12th cell of the vehicle-allocation preparation-zone, vehicle 7 is in the 19th cell of the vehicle-allocation preparation-zone, vehicle 8 is in the 20th cell of the vehicle-allocation preparation-zone, and vehicle 9 is in the 21th cell of the vehicle-allocation preparation-zone.

Also, vehicle 10 is in the 28th cell of the vehicle-allocation preparation-zone, vehicle 11 is in the 29th cell of the vehicle-allocation preparation-zone, and vehicle 12 is in the 30th cell of the vehicle-allocation preparation-zone. Also, vehicle 13 is in the seventh cell of the vehicle-allocation preparation-zone, vehicle 14 is in the 16th cell of the vehicle-allocation preparation-zone, and vehicle 15 is in the 25th cell of the vehicle-allocation preparation-zone. And thus, based on the initial conditions of the analysis, the "initial trajectory" is determined as the shortest route in step S201, to search for an optimal solution in which the trajectory of each vehicle 1 to 15 do not conflict. Then, in the multistory warehouse problem using the hybrid optimal-solution computation according to the second embodiment, it is assumed that a search condition is set in a flow where vehicle 1 loads a package at the 254th cell for loading on the second floor and finally goes to the destination cell of the first cell on the first floor followed by a predetermined trajectory via several cells. In the example of the automated transportation system of the vehicle illustrated in FIG. 7A, the "cell for loading" and "cell for unloading" were set in the distribution warehouse, respectively, but in the multistory warehouse body presented here, it is equivalent to the case where the destination cell is set to be the cell for unloading. A search condition is set for vehicle 2 in a flow to load a package at the 169th cell for loading on the first floor, followed by a predetermined trajectory via several cells to the destination cell of the 10th cell on the first floor. A search condition is set for vehicle 3 to load a package at the 91th cell for loading on the fourth floor and then to convey the package via several cells to the destination cell of the 19th cell on the first floor. A search condition is set for vehicle 4 to load a package at the 262th cell for loading on the second floor and then convey the package followed by a predetermined trajectory via several cells to the destination cell of the 28th cell on the first floor. A search condition is set for vehicle 5 to load a package at the 42th cell for loading and convey the package to the destination cell of the first cell on the first floor after passing via several cells.

Further, a search condition is set for vehicle 6 to load a package at the 173th cell for loading on the first floor and to convey the package to the destination cell of the 10th cell on the first floor after passing via several cells. A search condition is set for vehicle 7 to load a package at the 67th cell for loading on the third floor and to move to the destination cell of the 19th cell on the first floor passing a predetermined trajectory via several cells. The search condition is set for vehicle 8 to load a package at the 113th cell for loading on the first floor and to move to the destination cell of the 28th cell on the first floor passing a trajectory via several cells. A search condition is set for vehicle 9 to load a package at the 61th cell for loading on the second floor and to move to the destination cell of the 10th cell on the first floor passing a predetermined trajectory via several cells. A search condition is set for vehicle 10 to load a package at the 202th cell for loading on the third floor and to move to the destination cell of the 10th cell on the first floor along a predetermined trajectory via several cells. A search condition is set for vehicle 11 to load a package at the 261th cell for loading on the second floor and to move to the destination cell of the 19th cell on the first floor along a predetermined trajectory. A search condition is set for vehicle 12 to load a package at the 109th cell for loading on the first floor and to move to the destination cell of the 28th cell on the first floor along a predetermined trajectory. A search condition is set for vehicle 13 to load a package at the 233th cell for loading on the second floor and to move to the destination cell of the first cell on the first floor along a predetermined trajectory.

A search condition is set for vehicle 14 to load a package at the 53th cell for loading on the second floor and to move to the destination cell of the 10th cell on the first floor along a predetermined trajectory. Then, a search condition is set for vehicle 15 to load a package at the 79th cell for loading on the third floor and to move to the destination cell of the 19th cell on the first floor along a predetermined trajectory. For each of the above-mentioned search conditions, an optimum solution is searched for where the respective trajectories of vehicles 1 to 15 do not conflict. In the example of the automated transportation system illustrated in FIG. 7A, the "cell for loading" and the "cell for unloading" were set up separately in the distribution warehouse, but in the multistory warehouse body presented here, all the destination cells are located in the vehicle-allocation preparation-zone on the first floor, and a problem is the trajectory for conveying the packages from the inside of the multistory warehouse to the vehicle-allocation preparation-zone on the first floor by fifteen vehicles. That is, under such search conditions, the entire operation schedule that can avoid collisions and congestion by the respective vehicles 1 to 15 is searched, and the passing times and staying time-spans on the entire passing points, in other words, the spatial information and time information of the respective vehicles 1 to 15 are searched.

In FIG. 23, each initial trajectory of vehicles 1 to 15 is displayed in a matrix of vehicle-number versus time, and the arrangements of a set of first cell to 416th cell is represented, which are the trajectory positions in the multistory warehouse for respective fifteen vehicles ($n_v$=15) that change from time to time. However, as described above, in the present multistory warehouse problem, it is assumed that the set of first cell to 422th cell is arranged inside the multistory warehouse, so it can be seen that the matrix representation illustrated in FIG. 23 includes cells that are not used for initial trajectory setting. As illustrated in FIG. 23 with cell numbers enclosed by rectangular box in the initial trajectory setting, vehicle 6 and vehicle 12 are in conflict in the 171th cell at the time (step) 10. Furthermore, in the initial trajectory setting, at the time (step) 14, vehicle 6 and vehicle 12 are in conflict in the 172th cell, as indicated with enclosing by rectangular box. The initial track setting also indicates that at the time (step) 11, vehicle 11 and vehicle 15 are in conflict in the 261th cell enclosed by rectangular box.

Next, in step S202 of the flowchart illustrated in FIG. 21, conflicts between the initial trajectories are listed as illustrated in FIG. 24. In FIG. 24, which is equivalent to FIG. 23, the conflicts between the initial trajectories on the matrix illustrated in FIG. 23 are sorted and presented. That is, in the leftmost column (left column) of FIG. 24, the numbers of vehicles v=1 to 15 illustrated in FIG. 23 are presented. In the second column from the left in FIG. 24, the numbers of vehicle v' that conflict with vehicle v presented in the leftmost column are presented. The third column from the left in FIG. 24 presents the time (step) illustrated in FIG. 23 as the time of conflict between vehicle v and vehicle v', and the rightmost column presents the conflict point (cell) illustrated in FIG. 23 as the position of conflict between vehicle v and vehicle v'. For example, for vehicle 6, it is presented that conflict with vehicle 12 occurs in the 171th cell at the time (step) 10 illustrated in FIG. 23, as indicated by first horizontally-long rectangular from the top in FIG. 24. As for vehicle 11, conflict with vehicle 15 occurs in the 261th cell at the time (step) 14 illustrated in FIG. 23 as indicated by the second horizontally-long rectangular from the top in FIG. 24. As for vehicle 12, conflict with vehicle 6 occurs in the 172th cell at the time (step) 11 illustrated in FIG. 23 as indicated by the third horizontally-long rectangular from the top in FIG. 24.

Next, in step S203 of the flowchart illustrated in FIG. 21, as illustrated in FIG. 25, the trajectory generator instruction-control circuit 17G of the control unit 17 instructs and controls the operations of the first solution search arithmetic logic circuit 1A or the second solution search arithmetic logic circuit 1B so as to generate k-kinds of alternatives of the trajectories—alternative trajectories—that can avoid each conflict for vehicles v. For the generation of the k-alternatives, the multicellular amoeba processing that processes the k-amoeba SAT solutions (amoeba SAT-G mode) in parallel is preferred. FIG. 25 is for k=5, so seventy-five cases, that is, $k \times n_v = 5 \times 15 = 75$, are generated as the entire alternative trajectories, including the initial trajectory. By performing parallel computations of the amoeba SAT-G mode by the multicellular amoeba, the arithmetic processing required to generate the entire seventy-five alternative trajectories can be efficiently performed in a short time. Namely, when K=0, 1, 2, 3, 4 corresponding to the case of k=5, then on the ordinate of FIG. 25, the alternative trajectory $x_{v,k}$ of each vehicle is listed as a variable arranged along the vertical column.

In concrete terms, from the top of the ordinate, variables $x_{1,0}$, $x_{1,1}$, $x_{1,2}$, $x_{1,3}$, $x_{1,4}$ for pairs of alternative trajectories for vehicle 1 (v=1) are presented. Next, variables $x_{2,0}$, $x_{2,1}$, $x_{2,2}$, $x_{2,3}$, $x_{2,4}$ for pairs of alternative trajectories for vehicle 2 (v=2), which is supposed to be arranged on the ordinate, are omitted from illustration, and as a representative, variables $x_{v,0}$, $x_{v,1}$, $x_{v,2}$, $x_{v,3}$, $x_{v,4}$ for pairs of alternative trajectories for vehicle v are arranged on the ordinate. Since it is impossible to illustrate the entire seventy-five variables on the ordinate, some pairs of alternative trajectories, such as $x_{6,0}$, $x_{6,1}$, . . . , $x_{11,0}$, $x_{11,1}$, . . . , $x_{12,0}$, $x_{12,1}$, . . . , $x_{15,0}$, $x_{15,1}$, . . . , and the like, are exemplified on the ordinate in abbreviated form, respectively.

The abscissa in FIG. 25, like the abscissa in FIG. 23, represents the times of sixty-eight steps to account for positions of the movement—trajectory—, which change in time series, with respect to each vehicle v, denoted by the alternate trajectory $x_{v,k}$. In FIG. 25, the left end is time (step)=0 and the right end is time (step)=68. The initial trajectory $x_{15,0}$ of the corresponding vehicle 15 in FIG. 23 is up to sixty-four steps, while the alternative trajectory $x_{15,1}$ of the corresponding vehicle 15 is up to sixty-eight steps. In other words, in the matrix representation of alternative trajectories $x_{v,k}$ versus time in FIG. 25, there are $k \times n_v = 75$ different arrangements of the first cell to 416th cell, which are the respective trajectory positions of vehicles in the multi-level warehouse, changing from time to time.

Next, in step S204 of the flowchart illustrated in FIG. 21, the conflict tabulator instruction-control circuit 17T instructs and controls the operations of the first solution search arithmetic logic circuit 1A or the second solution search arithmetic logic circuit 1B to detect the presence of conflict for all pairs of alternative trajectories including the initial trajectory. The presence of conflict detected by the conflict tabulator instruction-control circuit 17T is indicated in each cell of a conflict matrix illustrated in FIG. 26 as a numerical value of "0" or "1" to tabulate the presence of conflicts. FIG. 26 is the 75×75 conflict matrix corresponding to FIG. 25. That is, in FIG. 26, as in FIG. 25, the alternative trajectory $x_{v,k}$ of each vehicle is indicated as a variable arranged on the ordinate. Normally, the ordinate in FIG. 26 would indicate variables $x_{1,0}$, $x_{1,1}$, $x_{1,2}$, $x_{1,3}$, and $x_{1,4}$ for the pairs of alternative trajectories for vehicle 1 from the top, followed by variables $x_{2,0}$, $x_{2,1}$, $x_{2,2}$, $x_{2,3}$, and $x_{2,4}$ for the pairs of alternative trajectories for vehicle 2, but it is impossible to present all seventy-five variables on the ordinate.

Thus, on the ordinate of FIG. 26, $x_{1,0}$, . . . , $x_{1,k}$, . . . , $x_{1,K-1}$, . . . , $x_{v',k'}$, . . . , $x_{15,0}$, . . . , $x_{15,k}$, . . . , and $x_{15,K-1}$, respectively, are presented as examples in abbreviated form. On the other hand, in FIG. 26, the alternative trajectories $x_{v,k}$ for each vehicle are presented as variables arranged on the abscissa as well as the ordinate to form the conflict matrix. Normally, variables $x_{1,0}$, $x_{1,1}$, $x_{1,2}$, $x_{1,3}$, and $x_{1,4}$ would be presented for pairs of alternative trajectories for vehicle 1 from the left of the abscissa, followed by variables $x_{2,0}$, $x_{2,1}$, $x_{2,2}$, $x_{2,3}$, and $x_{2,4}$ for vehicle 2. However, it is impossible to present all seventy-five variables on the abscissa. Therefore, in the abscissa of FIG. 26, $x_{1,0}$, . . . , $x_{1,k}$, . . . , $x_{1,K-1}$, . . . , $x_{v,k}$, . . . , $x_{15,0}$, . . . , $x_{15,k}$, . . . , and $x_{15,K-1}$ are presented as examples in abbreviated form. The number "0" in respective cells of the conflict matrix in FIG. 26 indicates the case when no conflict occurs, while the number "1" in respective cells of the conflict matrix indicates the case when a conflict has occurred. As indicated by rectangular box in the center of the conflict matrix in FIG. 26, the alternative trajectory $x_{v,k}$ of vehicle v and the alternative trajectory $x_{v',k'}$ of vehicle v' are in conflict in FIG. 26.

Next, in step S205 of the flowchart illustrated in FIG. 21, the conflict resolver instruction-control circuit 17R instructs and controls the operations of the first solution search arithmetic logic circuit 1A or the second solution search arithmetic logic circuit 1B to search for a combination of alternative trajectories that can resolve the conflict, as illustrated in FIG. 27. The ordinate of FIG. 27 is the alternative trajectory $x_{v,k}$ for each vehicle that can resolve the conflict. Namely, the ordinate of FIG. 27 indicates in order from the top, $x_{1,0}$, $x_{2,0}$, $x_{3,0}$, $x_{4,0}$, $x_{5,0}$, $x_{6,1}$, $x_{7,0}$, $x_{8,0}$, $x_{9,0}$, $x_{10,0}$, $x_{11,0}$, $x_{12,0}$, $x_{13,0}$, $x_{14,0}$, and $x_{12,1}$ as the combinations of alternative trajectories that can resolve conflicts. It can be seen that at the time (step) 0 in FIG. 27, all vehicles v=1 to 15 are put in one of the first cell to 30th cell in the vehicle-allocation preparation-zone on the first floor of the multistory warehouse.

It can be seen that vehicle 1 moves to the 31th cell of the first vertical-movement zone at the time (step) 3, moves to the 48th cell of the fifth vertical-movement zone at the time 4, moves to the 65th cell of the ninth vertical-movement zone at the time 5, and moves to the 313th cell of the horizontal movement zone on the third floor at the time 6. On the other hand, it can be seen that vehicle 2 moves to the 31th cell of the first vertical-movement zone at the time 2, moves to the 48th cell of the fifth vertical-movement zone at the time 3, moves to the 65th cell of the ninth vertical-movement zone at the time 4, and moves to the 313th cell of the horizontal movement zone on the third floor at the time 5. At the time (step) 17, vehicle 1 is located in the 254th cell of the eighth vertical-movement zone on the right end of the second floor. Since the 254th cell is the cell for loading in the initial setup, vehicle 1 stays there for six steps from the times 17 to 22. Also, vehicle 2 is located in the 169th cell of the third vertical-movement zone on the right side of the central line of the first floor at the time 17. Since the 169th cell is also the cell for loading in the initial setup for vehicle 2, it can be seen that vehicle 2 stays there for six steps from the times 14 to 19.

At the time 17, vehicle 3 is located in 93th cell of the thirteenth vertical-movement zone on the left end of the fourth floor of the multistory warehouse, vehicle 4 is located in the 259th cell of the eighth vertical-movement zone on the right end of the second floor, and vehicle 5 is located in the fourth cell1 of the first vertical-movement zone on the left end of the first floor. Vehicle 6 is located in the 173th cell of the third vertical-movement zone on the right side of the central line of the first floor at the time 17. Since the 173th cell is also the cell for loading in the initial setup for vehicle 6, it can be seen that vehicle 6 stays there for six steps from the times 13 to 18. Also, vehicle 7 is located in the 67th cell of the ninth vertical-movement zone on the left end of the third floor at the time 17. Since the 67th cell is also the cell for loading in the initial setup for vehicle 7, it can be seen that vehicle 7 stays there for six steps from the times 13 to 18. At the time 17, vehicle 8 is located in the 182th cell of the third vertical-movement zone on the right side of the central line of the first floor.

Further, at time 17 in FIG. 27, vehicle 9 is located in the 183th cell of the third vertical-movement zone on the right side of the central line of the first floor of the multistory warehouse, and vehicle 10 is located in the 205th cell of the eleventh vertical-movement zone on the right side of the central line of the third floor. At time 17, vehicle 11 is located in the 261th cell of the eighth vertical-movement zone on the right end of the second floor. Since the 261th cell is also the cell for loading in the initial setup for vehicle 11, it can be seen that vehicle 11 stays there for six steps from the times 12 to 17. At time 17, vehicle 12 is located in the 178th cell of the third vertical-movement zone on the right side of the central line of the first floor, vehicle 13 is located in the 123th cell of the sixth vertical-movement zone on the left side of the central line of the second floor, vehicle 14 is located in the 330th cell of the parallel movement zone on the left side of the central line of the second floor, and vehicle 15 is located in the 260th cell of the parallel movement zone on the right end of the second floor, and thus, at the time 17, there is no conflict with each other.

At the time (step) 41 in FIG. 27, the cells are empty for vehicles 2, 6, 10, and 14, indicating that the work has already been completed by reaching the initially set destination cells. Then, by examining the cells listed in the column of time 41 in FIG. 27, it can be seen that time 41 is exactly when vehicle 5 reaches the initially set first cell of the destination cell. Similarly, it can be seen that time 41 is exactly when vehicle 11 arrives at the 19th cell of the destination cell. Also, examining the cells listed in the column at the time 41, it can be seen that vehicle 1 is located in the third cell and vehicle 4 is located in the 30th cell, and thus, each of vehicles 1 and 4 is nearing an end of the work toward the final destination cells. Vehicle 1 reaches the first cell of the destination cell, at the time 43, and vehicle 4 also reaches the 28th cell of the destination cell, at the time 43. Vehicle 8 in the column of time 41 is located in the 405th cell of the parallel movement zone on the right-side face of the first floor of the four-story multistory warehouse. Vehicle 8 reaches the 28th cell of the destination cell, at the time 53.

At the time 41, vehicle 9 is located in the 52th cell of the fifth vertical-movement zone on the left end of the second floor. Vehicle 9 reaches the first cell of the destination cell, at the time 49. Vehicle 12 is located in the 238th cell of the fourth vertical-movement zone on the right end of the first floor at the time 41. Vehicle 12 reaches the 28th cell of the destination cell, at the time 47. Vehicle 13 is located in the 194th cell of the vertical-movement zone on the right side of the central line of the second floor at the time 41. Vehicle 13 reaches the first cell of the destination cell, at the time 61. At the time 41, vehicle 15 is located in the 61th cell of the fifth vertical-movement zone on the left end of the second floor. Vehicle 15 reaches the 19th cell of the destination cell, at the time 67. Thus, there is no conflict in each cell listed in the column at the time 41 illustrated in FIG. 27. As a result of the combination of alternative trajectories in step S205 of FIG. 21, the trajectories illustrated in FIG. 27 are found, and when it is determined in step S206 that the combination of alternative trajectories that can eliminate conflicts according to the trajectories illustrated in FIG. 27 has been found, the trajectories illustrated in FIG. 27 is displayed or transmitted as the optimal solution in step S207.

In step S206, if the conflict resolver instruction-control circuit 17R determines from the processing of the first solution search arithmetic logic circuit 1A or the second solution search arithmetic logic circuit 1B that no combination of alternative trajectories that can resolve the conflict exists, the operation of the first solution search arithmetic logic circuit 1A or the second solution search arithmetic logic circuit 1B is instructed and controlled to repeat the loop from step S206 to step S208, and further, from step S208 and to step S205. For example, using the amoeba SAT-R function of the first solution search arithmetic logic circuit 1A, the search loops are repeated until the combination of alternative trajectories—optimal solution—that can resolve the conflict is found. When the repeat number of search loops reaches the upper limit, the multicellular amoeba generates a new combination of alternative trajectories that can resolve the conflict by repeating the loops from step S206 to step S208 to step S209 and to step S204.

As a result, in the four-story multistory warehouse, the operating schedule for all vehicles that avoids conflict and congestion between vehicles 1 to 15 can be found. As described above, even in the case of the multistory warehouse where the number of cells $i_{max}$=422 and the number of vehicles $v_{max}$=15, the hybrid optimal-solution computation-method according to the second embodiment enables the "optimal solution of the trajectory" to be solved efficiently in a short time. Furthermore, even in the case of a multistory warehouse problem with the number of cells $i_{max}$=800 or more, and the number of vehicles $v_{max}$=100 or more, with the variables of about $10^6$ or more, and the INTRA-rules of about $10^{10}$ or more, a solution close to the "optimal solution of the trajectory" can be solved efficiently in a short time.

While the present invention has been described above by reference to the first and second embodiments, it should be understood that the present invention is not intended to be limited to the descriptions of the specification and the drawings implementing part of this disclosure. Various alternative of the embodiments, examples, and technical applications will be apparent to those skilled in the art according to the spirit and scope of the disclosure of the embodiments. For example, in the first embodiment described above, each of the processes—each of the functions—may be implemented by centralized data processing by a single device (system), or may be implemented by distributed data processing by a plurality of devices. However, distributed data processing by a plurality of devices is preferable in that, for example, different delays can be easily added between devices, or the occurrence of different delays can be expected stochastically. Also, even when centralized data processing is performed by the single device, different delays can be added, or it is possible to perform control of the occurrence of different delays, which may be expected stochastically.

The fourth mode described in the second embodiment with reference to FIG. 22, is the mode in which the amoeba computer architecture is not used in both steps S205-206 and steps S203, 209. If the objective is directed to an operation with only by the fourth mode, the first solution search arithmetic logic circuit 1A can be excluded from the configuration of the hybrid solution-searching system illustrated in FIG. 19, and thereby, constructing a system having a single-function solution-searching system, with only the second solution search arithmetic logic circuit 1B. In addition, in the case where the second to fourth modes of operation in FIG. 22 described in the second embodiment are not used, it is also possible to exclude the second solution search arithmetic logic circuit 1B from the configuration of the hybrid type solution-searching system illustrated in FIG. 19, and to make the system a single-function solution-searching system with only the first solution search arithmetic logic circuit 1A. Thus, it should be noted that the present invention is not limited to the description of the first and second embodiments described above, and various modifications can be made, which are also included within the scope of the invention. Therefore, the scope of the present invention is defined only by the technical features specifying the present invention, which are prescribed by claims, the words and terms in the claims shall be reasonably construed from the subject matters recited in the present specification.

What is claimed is:

1. A solution-searching system comprising:

an output adjustment unit having N pieces of signal adjustment circuits, where "N" is a positive integer greater than or equal to two, the signal adjustment circuits convert provisional output-adjustment signals into final output-adjustment signals, and transmit the final output-adjustment signals, respectively;

2N pieces of data generation units arranged in pairs corresponding to the signal adjustment circuits, respectively, each of the pairs configured to receive corresponding final output-adjustment signal and to generate binary data;

2N pieces of data conversion units which read and convert the binary data generated by the data generation units into information, respectively;

a fluctuation setting unit configured to supply independent bias probabilities to each of the signal adjustment circuits, independent fluctuation probabilities to each of the data generation units, and independent threshold values to each of the data conversion units, to non-uniformly set occurrence-frequencies of the binary data generated by the data generation units for making a value of an occurrence-frequency of a specific variable different from other variables than the specific variable; and a feedback control unit configured to determine whether an optimal solution has been found based on the information converted by the data conversion units and search-problem information preliminarily entered, and to repeatedly control operations of transmitting the final output-adjustment signals to the output adjustment units, respectively, if the optimal solution has not been found, wherein the signal adjustment circuits convert the provisional output-adjustment signals to the final output-adjustment signals, respectively, using the bias probabilities, the data generation units generate the binary data using the final output-adjustment signals and the fluctuation probabilities, and the data conversion units generate the information using the binary data and the threshold values, to find the optimal solution of a Boolean satisfiability problem expressed by multiple constraints in implication forms and logical conjunctions of the constraints, from the information.

2. The solution-searching system of claim 1, wherein the data generation units and the corresponding data conversion units are connected one-to-one to construct 2N tandem-connected sets, respectively, each of the tandem-connected sets has a pseudopod unit including a series circuit of a passive element and a nonlinear element and a parallel grounded-circuit connecting the series circuit to a ground potential, so that a set of the pseudopod units implements an amoeba core, wherein the parallel grounded-circuit has a charge storage element connected in series to the series circuit and a discharge control circuit connected in parallel to the charge storage element for exhausting charges stored in the charge storage element.

3. The solution-searching system of claim 2, wherein the discharge control circuit includes a first switching element and a second switching element, connected in parallel to the charge storage element, respectively.

4. The solution-searching system of claim 3, wherein one ends of the series circuits implementing the pseudopod units, respectively, are connected to each other at a central hub, and the counterpart other ends of the series circuit are radially extended to define 2N pieces of output terminals, which are classified into a plurality of pairs, constructing a star-shaped network with the pseudopod units.

5. The solution-searching system of claim 4, wherein inverted signals of the output-adjustment signals are supplied respectively to each of control electrodes of the first switching elements.

6. The solution-searching system of claim 5, wherein each of double-input NOR gates is provided between adjacent output terminals arranged in pairs, and each of output signals from the N pieces of double-input NOR gates are supplied to each of control electrodes of the corresponding second switching elements.

7. The solution-searching system of claim 2, further comprising:

a plurality of arithmetic logic circuits arranged in parallel, which implement a multicellular amoeba configuration, each of the arithmetic logic circuits comprises the amoeba core; and a fluctuation setting unit which supplies fluctuation probabilities to each of the data generation units included in the amoeba core.

8. The solution-searching system of claim 2, further comprising a plurality of arithmetic logic circuits arranged in parallel, which implement a multicellular amoeba configuration as a trajectory generation solution search arithmetic logic circuit, each of the arithmetic logic circuits comprises the amoeba core and a fluctuation setting unit which supplies fluctuation probabilities to each of the data generation units included in the amoeba core, wherein, parallel computations with the multicellular amoeba configuration generate multiple kinds of matrices as multiple kinds of alternative trajectories, multiple variables are arranged on an ordinate and states of the multiple variables that change in time series are arranged on an abscissa in each of the matrices.

9. The solution-searching system according to claim 8, further comprising a conflict tabulator instruction-control circuit, which tabulates a presence of conflict determined from analysis conditions for each of the multiple kinds of the alternative trajectories.

10. The solution-searching system according to claim 9, further comprising a conflict resolver instruction-control circuit, which searches a new alternative trajectory, configured to resolve the conflict tabulated by the conflict tabulator instruction-control circuit.

11. A solution-searching method for solving an optimal solution of a Boolean satisfiability problem expressed by constraints in implication forms and logical conjunctions of the constraints, the method comprising:

independently supplying information of fluctuation probabilities entered from outside to a plurality of data generation units, respectively;

independently supplying information of bias probabilities entered from outside to a plurality of signal adjustment circuits arranged corresponding to the data generating units, respectively;

independently supplying information of threshold values entered from outside to data conversion units, respectively, number of the data conversion units is equal to the data generation units;

feeding a plurality of provisional output-adjustment signals to the signal adjustment circuits, respectively;

converting the provisional output-adjustment signals to final output-adjustment signals using the bias probabilities by the signal adjustment circuits, respectively, and feeding the final output-adjustment signals to the data generation units, respectively, causing the respective data generation units to generate a set of non-uniform data, respectively, based on the fluctuation probabilities and the final output-adjustment signals, so that an occurrence-frequency of a specific variable transmitted from the data generation units is different from occurrence-frequencies of other variables;

causing the data conversion units to convert the set of non-uniform data into information, after the set of non-uniform data is read out; and determining whether the optimal solution has been found based on the information converted by the data conversion units and search-problem information preliminarily entered, and if the optimal solution has not been found, repeatedly controlling operations of transmitting the final output-adjustment signals to the data generation units, respectively.

12. The solution-searching method of claim 11, wherein the specific variable is defined as a program variable $y_i$, and a single instance with constraints in an implication form is prepared such that a value of the program variable $y_i$ is fixed to "0" or "1", for enabling or disabling the constraints of the propositional formula, the constraint in the implication form is given by $$\text{if } y_i=b \text{ and } x_j=b', \text{ then } x_k=b'',$$

here, $x_i$ and $x_k$ are search variables, and b, b', b" are "0" or "1", when the search-problem information is represented by a propositional formula provided with a plurality of variables.

13. A non-transitory computer readable storage medium for storing a control program of executing a series of instructions to find an optimal solution of a Boolean satisfiability problem expressed by constraints in an implication form and a logical conjunction of the constraints, the computer program comprising:

instructions to cause a fluctuation setting unit to independently supply fluctuation probabilities externally entered to data generation units, respectively;

instructions to cause the fluctuation setting unit to independently supply bias probabilities externally entered to signal adjustment circuits arranged corresponding to the data generating units, respectively;

instructions to cause the fluctuation setting unit to independently supply threshold values externally entered to data conversion units, respectively;

instructions to cause an output adjustment unit to feed provisional output-adjustment signals to the signal adjustment circuits, respectively;

instructions to cause the signal adjustment circuits to convert the provisional output-adjustment signals into final output-adjustment signals using the bias probabilities, to feed the final output-adjustment signals to the data generation units, respectively, a number of the data conversion units is equal to the data generation units;

instructions to cause the data generation units to generate a set of non-uniform data based on the fluctuation probabilities and the final output-adjustment signals, so that an occurrence-frequency of a specific variable transmitted from the data generation units is different from occurrence-frequencies of other variables;

instructions to cause the data conversion units to read out the set of non-uniform data, and to convert into information; and instructions to cause a feedback control unit to determine whether the optimal solution has been found based on the information converted by the data conversion units and search-problem information preliminarily entered, and if the optimal solution has not been found, to repeatedly control operations of transmitting the final output-adjustment signals to the data generation units, respectively.

* * * * *